(12) United States Patent
Hatakeyama et al.

(10) Patent No.: US 8,450,042 B2
(45) Date of Patent: May 28, 2013

(54) POSITIVE RESIST COMPOSITION AND PATTERNING PROCESS

(75) Inventors: Jun Hatakeyama, Joetsu (JP); Koji Hasegawa, Joetsu (JP); Seiichiro Tachibana, Joetsu (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 276 days.

(21) Appl. No.: 12/720,098

(22) Filed: Mar. 9, 2010

(65) Prior Publication Data

US 2010/0227274 A1 Sep. 9, 2010

(30) Foreign Application Priority Data

Mar. 9, 2009 (JP) ................................ 2009-055018

(51) Int. Cl.
*G03F 7/004* (2006.01)
*G03F 7/039* (2006.01)
*G03F 7/26* (2006.01)

(52) U.S. Cl.
USPC ........................................ 430/270.1; 430/326

(58) Field of Classification Search
USPC ................ 430/270.1, 326, 910; 526/319, 326
See application file for complete search history.

(56) References Cited

U.S. PATENT DOCUMENTS

| | | | |
|---|---|---|---|
| 5,130,392 A * | 7/1992 | Schwalm et al. | 526/288 |
| 5,945,250 A | 8/1999 | Aoai et al. | |
| 6,448,420 B1 | 9/2002 | Kinsho et al. | |
| 6,746,817 B2 | 6/2004 | Takeda et al. | |
| 7,482,108 B2 | 1/2009 | Matsumaru et al. | |
| 7,537,880 B2 | 5/2009 | Harada et al. | |
| 7,569,326 B2 | 8/2009 | Ohsawa et al. | |
| 7,598,016 B2 | 10/2009 | Kobayashi et al. | |
| 2002/0115874 A1* | 8/2002 | Kinsho et al. | 552/549 |
| 2006/0147836 A1* | 7/2006 | Hatakeyama et al. | 430/270.1 |
| 2007/0122740 A1* | 5/2007 | Hatakeyama et al. | 430/270.1 |
| 2007/0218407 A1 | 9/2007 | Mizutani et al. | |
| 2008/0020289 A1* | 1/2008 | Hatakeyama et al. | 430/4 |
| 2008/0090172 A1 | 4/2008 | Hatakeyama et al. | |
| 2008/0102407 A1* | 5/2008 | Ohsawa et al. | 430/286.1 |

FOREIGN PATENT DOCUMENTS

| | | |
|---|---|---|
| EP | 0473547 A1 | 3/1992 |
| JP | 4-230645 A | 8/1992 |
| JP | 2000-327633 A | 11/2000 |
| JP | 3613491 B2 | 1/2005 |
| JP | 2005-084365 A | 3/2005 |
| JP | 2006-045311 A | 2/2006 |
| JP | 2006-169302 A | 6/2006 |
| JP | 2006-178317 A | 7/2006 |
| JP | 3865048 B2 | 1/2007 |
| JP | 2007-171893 A | 7/2007 |
| JP | 2007-279699 A | 10/2007 |
| JP | 2008-111103 A | 5/2008 |
| JP | 2008-122932 A | 5/2008 |
| JP | 2008-133448 A | 6/2008 |
| JP | 2008-239918 A | 10/2008 |
| JP | 2008-250227 | * 10/2008 |

OTHER PUBLICATIONS

Machine translation of JP 2008-250227, published on Oct. 16, 2008.*
Oishi, T. and Fujimoto, M.-"Synthesis of Polymers by Using Fluorene.VI.Free-Radical and Anionic Polymerizations of 9-Fluorenyl and 9-Phenyl-9-Fluorenyl Methacrylates", J. Macromol. Sci.-Chem., A23(6), pp. 687-696, 1986.*
W. Hinsberg et al., "Extendibility of Chemically Amplified Resists: Another Brick Wall?," Proceedings of SPIE, 2003, vol. 5039, pp. 1-13.
Y. Kishikawa et al, "Assessment of trade-off Between Resist Resolution and Sensitivity for Optimization of Hyper-NA Immersion Lithography," Proceedings fo SPIE, 2007, vol. 6520, pp. 65203L-1-65203L-9.
N. Matsuzawa et al, "Theoretical Calculation of Photoabsorption of Various Polymers in an Extreme Ultraviolet Region," Japan Journal of Applied Physics, Dec. 1999, vol. 38, pp. 7109-7113.

* cited by examiner

*Primary Examiner* — Anca Eoff
(74) *Attorney, Agent, or Firm* — Westerman, Hattori, Daniels & Adrian, LLP

(57) ABSTRACT

A positive resist composition comprising as a base resin a polymer having carboxyl groups whose hydrogen is substituted by an acid labile group of fluorene structure exhibits a high contrast of alkaline dissolution rate before and after exposure, a high resolution, a good pattern profile and minimal LER after exposure, a significant effect of suppressing acid diffusion rate, and improved etching resistance.

20 Claims, No Drawings

POSITIVE RESIST COMPOSITION AND PATTERNING PROCESS

CROSS-REFERENCE TO RELATED APPLICATION

This non-provisional application claims priority under 35 U.S.C. §119(a) on Patent Application No. 2009-055018 filed in Japan on Mar. 9, 2009, the entire contents of which are hereby incorporated by reference.

TECHNICAL FIELD

This invention relates to a positive resist composition, and more particularly to a chemically amplified positive resist composition comprising a specific polymer; and a patterning process using the same.

BACKGROUND ART

To meet the demand for higher integration density and operating speed of LSIs, the effort to reduce the pattern rule is in rapid progress. The wide-spreading flash memory market and the demand for increased storage capacities drive forward the miniaturization technology. As the advanced miniaturization technology, manufacturing of microelectronic devices at the 65-nm node by the ArF lithography has been implemented in a mass scale. Manufacturing of 45-nm node devices by the next generation ArF immersion lithography is approaching to the verge of high-volume application. The candidates for the next generation 32-nm node include ultra-high NA lens immersion lithography using a liquid having a higher refractive index than water in combination with a high refractive index lens and a high refractive index resist film, extreme ultraviolet (EUV) lithography of 13.5 nm wavelength, and double patterning version of the ArF lithography, on which active research efforts have been made.

With respect to high-energy radiation of very short wavelength such as electron beam (EB) or x-ray, hydrocarbons and similar light elements used in resist materials have little absorption. Then polyhydroxystyrene base resist materials are under consideration. Resist materials for EB lithography are practically used in the mask image writing application. Recently, the mask manufacturing technology becomes of greater interest. Reduction projection exposure systems or steppers have been used since the time when the exposure light was g-line. While their demagnification factor was ⅕, a factor of ¼ is now used as a result of chip size enlargement and projection lens diameter increase. It becomes of concern that a dimensional error of a mask has an impact on the dimensional variation of a pattern on wafer. It is pointed out that as the pattern feature is reduced, the value of a dimensional variation on the wafer becomes greater than the value of a dimensional error of the mask. This is evaluated by a mask error enhancement factor (MEEF) which is a dimensional variation on wafer divided by a dimensional error of mask. Patterns on the order of 45 nm often show an MEEF in excess of 4. In a situation including a demagnification factor of ¼ and a MEEF of 4, the mask manufacture needs an accuracy substantially equivalent to that for equi-magnification masks.

The exposure system for mask manufacturing made a transition from the laser beam exposure system to the EB exposure system to increase the accuracy of line width. Since a further size reduction becomes possible by increasing the accelerating voltage of the electron gun in the EB exposure system, the accelerating voltage increased from 10 keV to 30 keV and reached 50 keV in the current mainstream system, with a voltage of 100 keV being under investigation.

As the accelerating voltage increases, a lowering of sensitivity of resist film becomes of concern. As the accelerating voltage increases, the influence of forward scattering in a resist film becomes so reduced that the contrast of electron image writing energy is improved to ameliorate resolution and dimensional control whereas electrons can pass straightforward through the resist film so that the resist film becomes less sensitive. Since the mask exposure tool is designed for exposure by direct continuous writing, a lowering of sensitivity of resist film leads to an undesirably reduced throughput. Due to a need for higher sensitivity, chemically amplified resist compositions are contemplated.

Thinning of resist film is in progress to facilitate reduction of pattern feature in the EB lithography for mask manufacturing and to prevent the pattern from collapsing due to a higher aspect ratio during development. In the case of photolithography, a thinning of resist film greatly contributes to resolution improvement. This is because introduction of chemical mechanical polishing (CMP) or the like has driven forward device planarization. In the case of mask manufacture, substrates are flat, and the thickness of processable substrates (e.g., Cr, MoSi or $SiO_2$) is predetermined by a percent light shield or phase shift control. The dry etch resistance of resist film must be improved before the film can be reduced in thickness.

It is generally believed that there is a correlation between the carbon density and the dry etching resistance of resist film. For EB writing which is not affected by absorption, resist materials based on novolac resins having better etching resistance have been developed. Indene copolymers described in JP 3865048 and acenaphthylene copolymers described in JP-A 2006-169302 are expected to have improved etching resistance due to a high carbon density and a robust main chain structure based on cycloolefin structure.

Also, with respect to the soft x-ray (EUV) lithography at wavelength 5-20 nm which is expected as the lithography for micropatterning to 70 nm et seq. as well as the $F_2$ lithography, the reduced absorption of carbon atoms was reported. It was found that increasing the carbon density is effective not only for improving dry etching resistance, but also for increasing the transmittance in the soft x-ray wavelength region. See N. Matsuzawa et al., Jp. J. Appl. Phys., Vol. 38, pp. 7109-7113 (1999).

As the feature size reduces, image blurs due to acid diffusion become a problem (SPIE Vol. 5039 p 1 (2003)). To insure resolution for fine patterns with a size of 45 nm et seq., not only an improvement in dissolution contrast is important as previously reported, but control of acid diffusion is also important as reported in SPIE Vol. 6520 65203L-1 (2007). Since chemically amplified resist compositions are designed such that sensitivity and contrast are enhanced by acid diffusion, an attempt to minimize acid diffusion by reducing the temperature and/or time of post-exposure baking (PEB) fails, resulting in drastic reductions of sensitivity and contrast.

Proposed are acid labile groups in the form of indane or tetrahydronaphthalene (meth)acrylate. JP-A 2007-279699 discloses a resist material comprising a copolymer of hydroxystyrene wherein an ester bond moiety is secondary or tertiary. JP-A 2007-171893, which relates to an underlayer forming material, discloses indane, acenaphthene and fluorene methacrylates.

Addition of an acid generator capable of generating a bulky acid is effective for suppressing acid diffusion. It is then proposed to copolymerize a polymer with an acid generator in the form of an onium salt having polymerizable olefin. JP-A H04-230645, JP-A 2005-084365, and JP-A 2006-045311 disclose sulfonium salts having polymerizable olefin capable of generating a specific sulfonic acid and similar iodonium salts. JP 3613491, JP-A 2006-178317, and JP-A 2008-133448 disclose sulfonium salts having sulfonic acid directly attached to the main chain.

| Citation List | |
|---|---|
| Patent Document 1: | JP 3865048 |
| Patent Document 2: | JP-A 2006-169302 |
| Patent Document 3: | JP-A 2007-279699 |
| Patent Document 4: | JP-A 2007-171893 |
| Patent Document 5: | JP-A H04-230645 |
| Patent Document 6: | JP-A 2005-084365 |
| Patent Document 7: | JP-A 2006-045311 |
| Patent Document 8: | JP 3613491 |
| Patent Document 9: | JP-A 2006-178317 |
| Patent Document 10: | JP-A 2008-133448 |
| Non-Patent Document 1: | N. Matsuzawa et al., Jp. J. Appl. Phys., Vol. 38, pp. 7109-7113 (1999). |
| Non-Patent Document 2: | SPIE Vol. 5039 p1 (2003) |
| Non-Patent Document 3: | SPIE Vol. 6520 65203L-1 (2007) |

DISCLOSURE OF INVENTION

An object of the present invention is to provide a positive resist composition, typically chemically amplified positive resist composition, comprising a specific polymer, which exhibits a high resolution surpassing prior art positive resist compositions, and forms a resist film having a minimal edge roughness (LER or LWR), a good pattern profile after exposure, and improved etching resistance. Another object is to provide a pattern forming process using the same.

Making investigations to seek for a positive resist composition which exhibits a high resolution, a minimal edge roughness (LER or LWR), a good pattern profile after exposure, and improved etching resistance, the inventors have found that better results are obtained when a polymer comprising recurring units having a fluorene-substituted carboxyl group, specifically selected from (meth)acrylic acid and derivatives thereof, styrenecarboxylic acid, and vinylnaphthalenecarboxylic acid, is used as a base resin to formulate a positive resist composition, typically chemically amplified positive resist composition.

The above polymer is used as a base resin to formulate a positive resist composition, typically chemically amplified positive resist composition in order to suppress acid diffusion for improving dissolution contrast and etching resistance. The positive resist composition, typically chemically amplified positive resist composition exhibits a remarkably high contrast of alkaline dissolution rate before and after exposure, a significant effect of suppressing acid diffusion, a high resolution, a good pattern profile and minimal edge roughness after exposure, and improved etching resistance, and is suited as a fine pattern-forming material for the fabrication of VLSIs or photomasks.

The positive resist composition of the invention forms a resist film which exhibits a high dissolution contrast, a significant effect of suppressing acid diffusion, a high resolution, a good exposure latitude, process adaptability, a good pattern profile after exposure, and improved etching resistance. By virtue of these advantages, the composition is fully useful in commercial application and suited as a pattern-forming material for the fabrication of VLSIs and photomasks.

In one aspect, the invention provides a positive resist composition comprising as a base resin a polymer having carboxyl groups whose hydrogen is substituted by an acid labile group having the general formula (1):

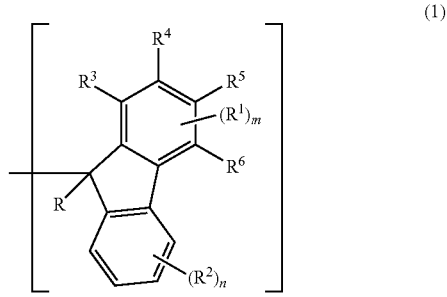

(1)

wherein $R^1$ and $R^2$ each are hydrogen, a $C_1$-$C_4$ alkyl, alkoxy, alkanoyl or alkoxycarbonyl group, hydroxyl, $C_6$-$C_{10}$ aryl group, halogen, or cyano group, R is hydrogen, a straight, branched or cyclic $C_1$-$C_{12}$ alkyl group which may have an oxygen or sulfur atom, $C_2$-$C_{12}$ alkenyl group, $C_2$-$C_{12}$ alkynyl group, or $C_6$-$C_{10}$ aryl group, $R^3$ to $R^6$ are hydrogen or a pair of $R^3$ and $R^4$, $R^4$ and $R^5$, or $R^5$ and $R^6$ may bond together to form a benzene ring, and m and n each are an integer of 1 to 4.

In a preferred embodiment, the resist composition may comprise as the base resin a polymer comprising recurring units (a) of the general formula (2), selected from (meth)acrylic acid and derivatives thereof, styrenecarboxylic acid, and vinylnaphthalenecarboxylic acid, each having substituted thereon an acid labile group of formula (1), the polymer having a weight average molecular weight of 1,000 to 500,000.

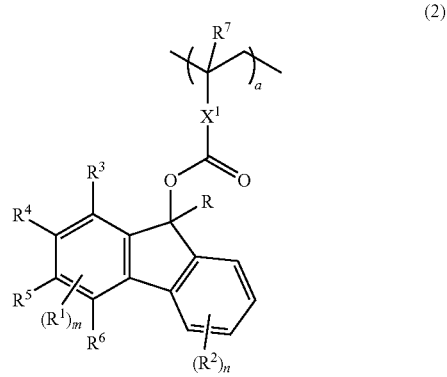

(2)

Herein R, $R^1$ to $R^6$, m and n are as defined above, $R^7$ is hydrogen or methyl, $X^1$ is a single bond, —C(=O)—O—$R^8$—, phenylene or naphthylene, and $R^8$ is a straight, branched or cyclic $C_1$-$C_{10}$ alkylene group which may have an ester, ether or lactone group.

In a more preferred embodiment, the polymer is a copolymer comprising recurring units (a) of the general formula (2), selected from (meth)acrylic acid and derivatives thereof, styrenecarboxylic acid, and vinylnaphthalenecarboxylic acid, each having substituted thereon an acid labile group of formula (1), and recurring units (b) having an adhesive group selected from the class consisting of hydroxyl, lactone, ether, ester, carbonyl, and cyano groups, molar fractions "a" and "b" of the respective units being in the range: $0<a<1.0$, $0<b<1.0$, and $0.05 \leq a+b \leq 1.0$, the copolymer having a weight average molecular weight of 1,000 to 500,000.

In a preferred embodiment, the recurring units (b) are recurring units having a phenolic hydroxyl group. The recurring units having a phenolic hydroxyl group are preferably selected from units (b1) to (b8) represented by the general formula (3).

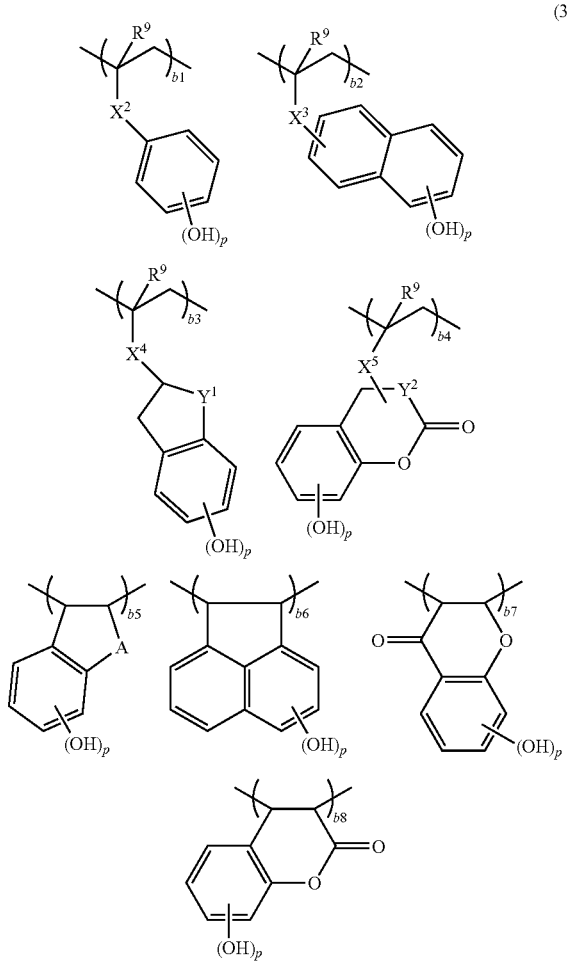

(3)

Herein $R^9$ is each independently hydrogen or methyl, $X^2$ and $X^3$ each are a single bond or —C(=O)—O—$R^{10}$—, $X^4$ and $X^5$ each are —C(=O)—O—$R^{10}$—, $R^{10}$ is a single bond or a straight, branched or cyclic $C_1$-$C_{10}$ alkylene group, $Y^1$ and $Y^2$ each are methylene or ethylene, A is methylene, oxygen or sulfur, and p is 1 or 2.

In a preferred embodiment, the copolymer may have further copolymerized therein recurring units selected from units (c1) to (c5) of indene, acenaphthylene, chromone, coumarin, and norbornadiene, or derivatives thereof, represented by the general formula (4).

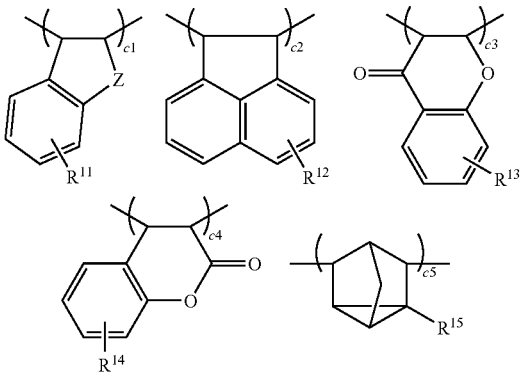

(4)

Herein $R^{11}$ to $R^{15}$ are each independently hydrogen, a $C_1$-$C_{30}$ alkyl, haloalkyl, alkoxy, alkanoyl or alkoxycarbonyl group, $C_6$-$C_{10}$ aryl group, halogen, or 1,1,1,3,3,3-hexafluoro-2-propanol group, and Z is methylene, oxygen or sulfur.

In a preferred embodiment, the copolymer may have further copolymerized therein units selected from sulfonium salts (d1) to (d3) represented by the general formula (5).

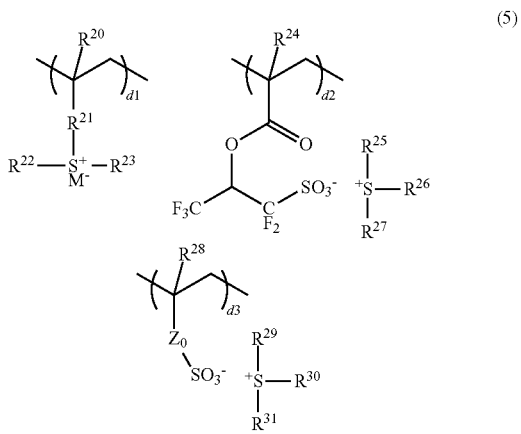

(5)

Herein $R^{20}$, $R^{24}$ and $R^{28}$ each are hydrogen or methyl, $R^{21}$ is a single bond, phenylene, —O—$R^{33}$—, or —C(=O)—Y—$R^{33}$—, Y is oxygen or NH, $R^{33}$ is a straight, branched or cyclic $C_1$-$C_6$ alkylene group, phenylene group or alkenylene group, which may contain a carbonyl, ester, ether or hydroxyl group, $R^{22}$, $R^{23}$, $R^{25}$, $R^{26}$, $R^{27}$, $R^{29}$, $R^{30}$, and $R^{31}$ are each independently a straight, branched or cyclic $C_1$-$C_{12}$ alkyl group which may contain a carbonyl, ester or ether group, or $C_6$-$C_{12}$ aryl group, $C_7$-$C_{20}$ aralkyl group, or thiophenyl group, $Z_0$ is a single bond, methylene, ethylene, phenylene, fluorinated phenylene, —O—$R^{32}$—, or —C(=O)—$Z_1$—$R^{32}$—, $Z_1$ is oxygen or NH, $R^{32}$ is a straight, branched or cyclic $C_1$-$C_6$ alkylene group, phenylene group or alkenylene group, which may contain a carbonyl, ester, ether or hydroxyl group, $M^-$ is a non-nucleophilic counter ion, and molar fractions d1 to d3 are in the range: $0 \leq d1 \leq 0.3$, $0 \leq d2 \leq 0.3$, $0 \leq d3 \leq 0.3$, and $0 < d1+d2+d3 \leq 0.3$.

Typically the resist composition may further comprise an organic solvent and an acid generator so that the composition becomes a chemically amplified positive resist composition. The resist composition may further comprise one or more of a dissolution regulator, a basic compound and a surfactant.

In another aspect, the invention provides a pattern forming process comprising the steps of applying the positive resist composition defined above onto a substrate to form a coating, heat treating and exposing the coating to high-energy radiation, and developing the exposed coating with a developer. The developer may be an aqueous solution containing 1 to 10% by weight of tetraethylammonium hydroxide, tetrapropylammonium hydroxide or tetrabutylammonium hydroxide.

The positive resist composition, typically chemically amplified positive resist composition, is used not only in the lithography for forming semiconductor circuits, but also in the formation of mask circuit patterns, micromachines, and thin-film magnetic head circuits.

ADVANTAGEOUS EFFECTS OF INVENTION

The positive resist composition exhibits a remarkably high contrast of alkaline dissolution rate before and after exposure, a high resolution, a good pattern profile and minimal edge roughness (LER or LWR) after exposure, a significant effect of suppressing acid diffusion rate, and improved etching resistance. The composition is thus suited as a fine pattern-forming material for the fabrication of VLSIs or photomasks and a pattern-forming material for EUV lithography.

DESCRIPTION OF EMBODIMENTS

The singular forms "a," "an" and "the" include plural referents unless the context clearly dictates otherwise. "Optional" or "optionally" means that the subsequently described event or circumstances may or may not occur, and that description includes instances where the event or circumstance occurs and instances where it does not. As used herein, the terminology "(meth)acrylic acid" or "(meth)acrylate" refers collectively to acrylic and methacrylic acid or acrylate and methacrylate. The terminology "$C_x$-$C_y$", as applied to a particular unit, such as, for example, a chemical compound or a chemical substituent group, means having a carbon atom content of from "x" carbon atoms to "y" carbon atoms per such unit.

The invention provides a positive resist composition comprising as a base resin a polymer or high-molecular-weight compound having carboxyl groups whose hydrogen is substituted at least by an acid labile group having the general formula (1).

(1)

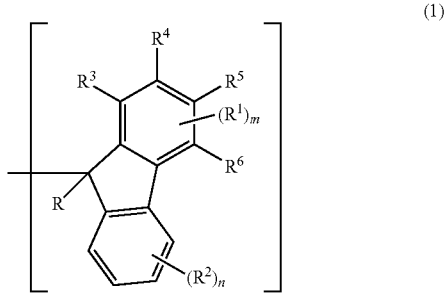

Herein $R^1$ and $R^2$ each are hydrogen, a $C_1$-$C_4$ alkyl, alkoxy, alkanoyl or alkoxycarbonyl group, hydroxyl, $C_6$-$C_{10}$ aryl group, halogen, or cyano group. R is hydrogen, a straight, branched or cyclic $C_1$-$C_{12}$ alkyl group which may have an oxygen or sulfur atom, $C_2$-$C_{12}$ alkenyl group, $C_2$-$C_{12}$ alkynyl group, or $C_6$-$C_{10}$ aryl group. $R^3$ to $R^6$ are hydrogen or a pair of $R^3$ and $R^4$, $R^4$ and $R^5$, or $R^5$ and $R^6$ may bond together to form a benzene ring. The subscripts m and n each are an integer of 1 to 4.

Examples of $R^1$ and $R^2$ include hydrogen, methyl, ethyl, propyl, butyl, methoxy, ethoxy, acetoxy, and methoxycarbonyl, with hydrogen, methyl, methoxy, acetoxy, and methoxycarbonyl being preferred.

In a preferred embodiment, the acid labile group of formula (1) substitutes for hydrogen atom of the carboxyl group on (meth)acrylic acid and derivatives thereof, styrenecarboxylic acid, and vinylnaphthalenecarboxylic acid. It is noted that (meth)acrylic acid and derivatives thereof are collectively referred to as (meth)acrylates, hereinafter. Specifically, a polymer comprising recurring units (a) of the general formula (2) and having a weight average molecular weight (Mw) of 1,000 to 500,000 is used as the base resin.

(2)

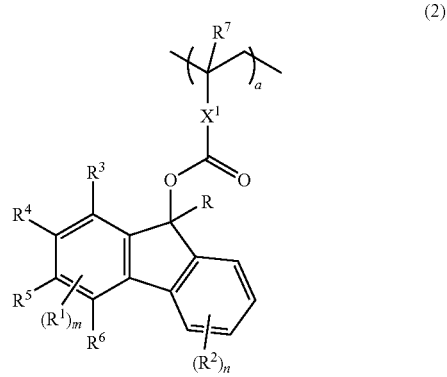

Herein R, $R^1$ to $R^6$, m, and n are as defined above, $R^7$ is hydrogen or methyl, $X^1$ is a single bond, —C(=O)—O—$R^8$—, phenylene or naphthylene, and $R^8$ is a straight, branched or cyclic $C_1$-$C_{10}$ alkylene group which may have an ester group (—COO—), ether group (—O—) or lactone ring. Typical of $C_1$-$C_{10}$ alkylene group having lactone ring is a group of the formula below.

Specifically, the recurring units (a) of formula (2) include units (a1) to (a4) represented by the general formula (6).

(6)

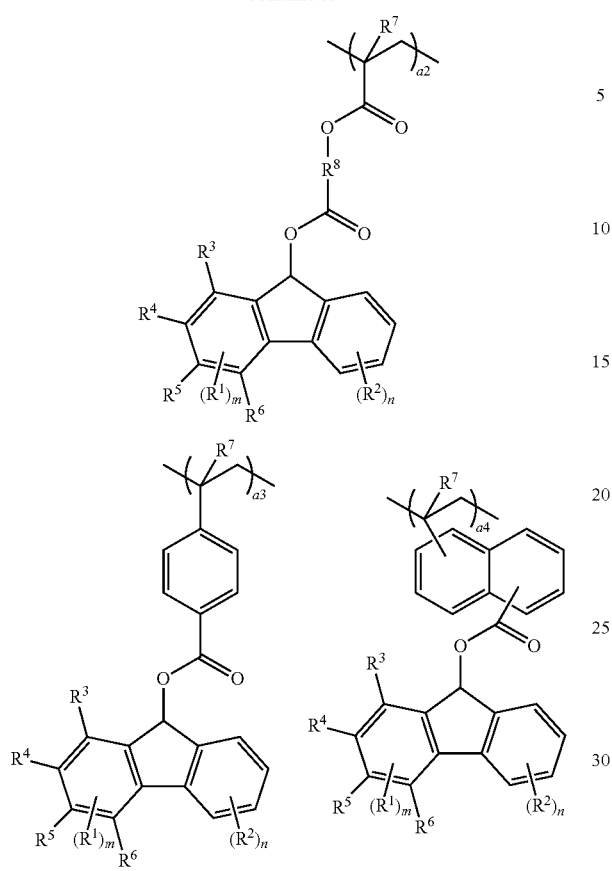
Herein, $R^1$ to $R^8$, m, and n are as defined above, and $0<a1+a2+a3+a4<1.0$. In particular, these acid labile groups are applicable to the KrF, EB and EUV lithography.
Examples of suitable monomers from which recurring units (a1) to (a4) are derived are shown below.
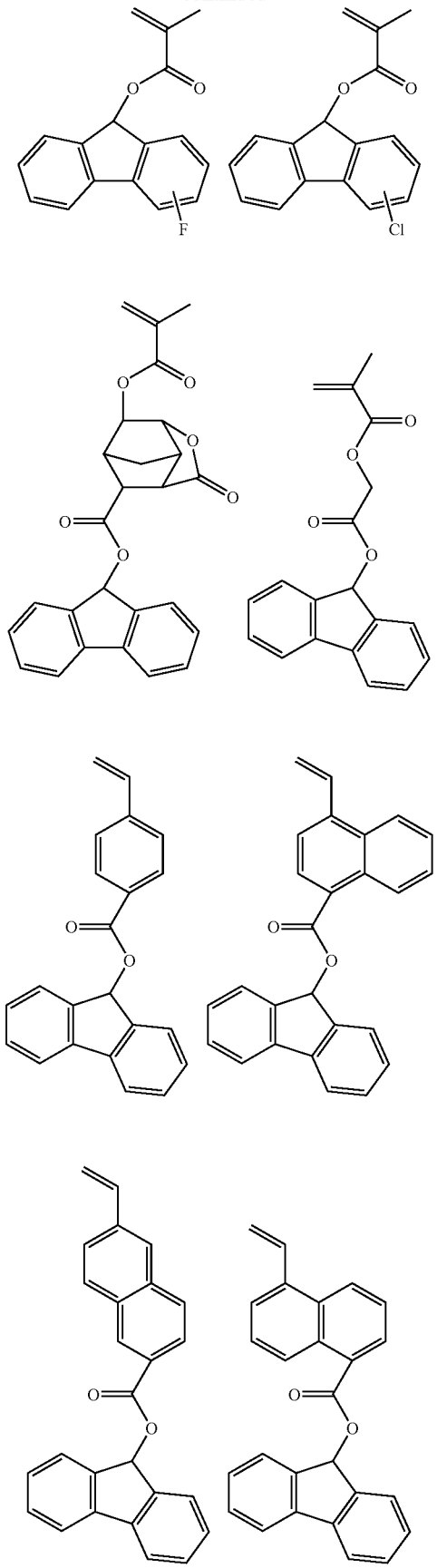

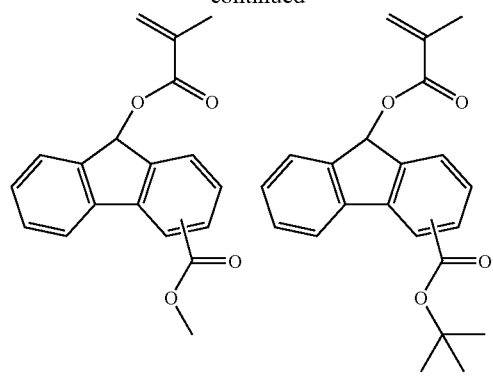
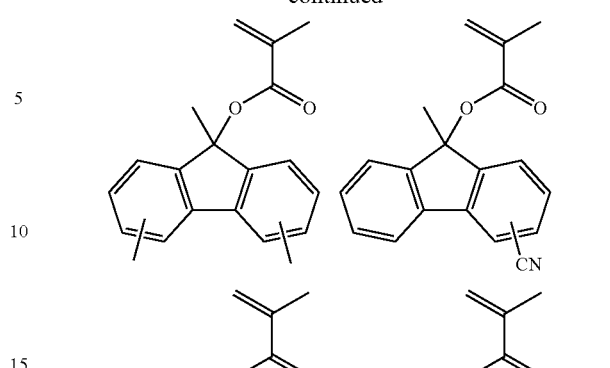
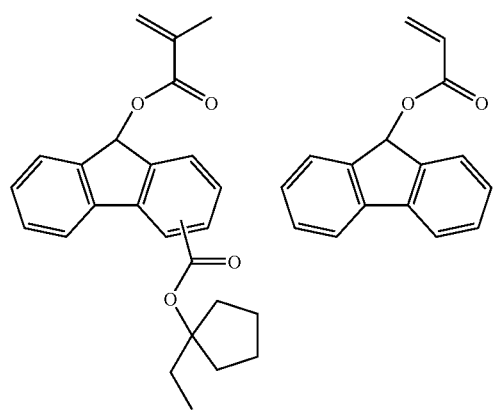
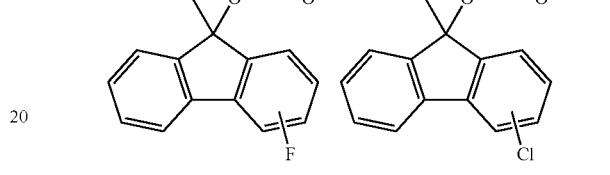
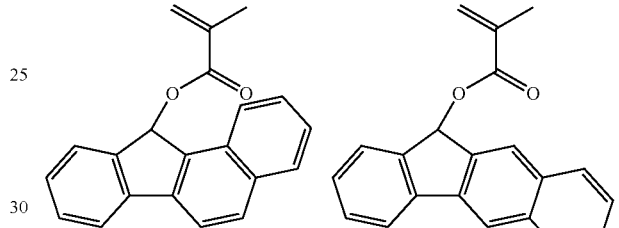
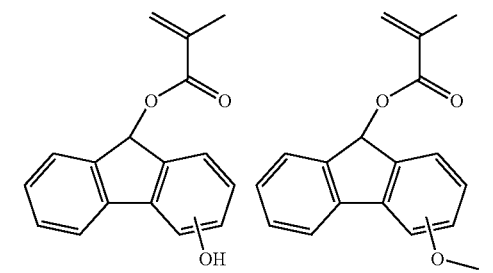
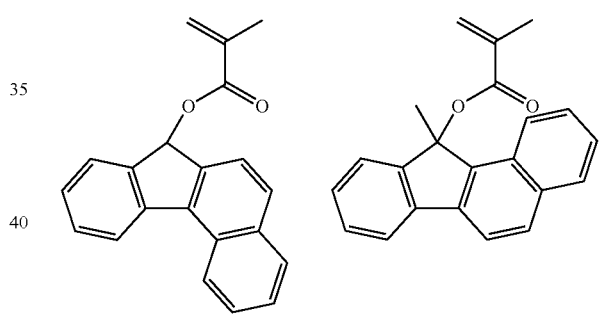
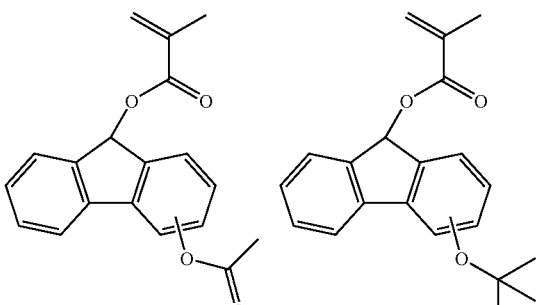
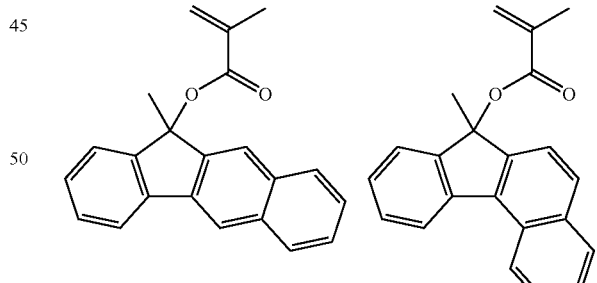
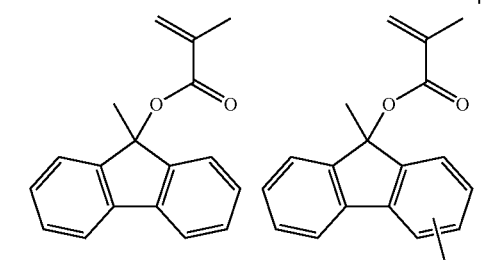
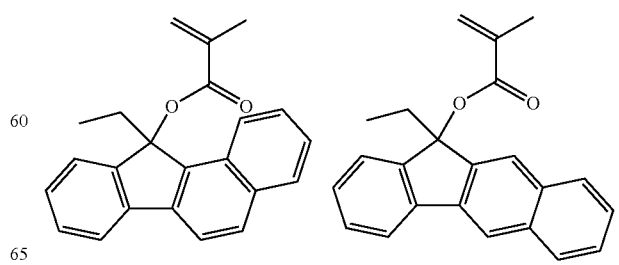

-continued
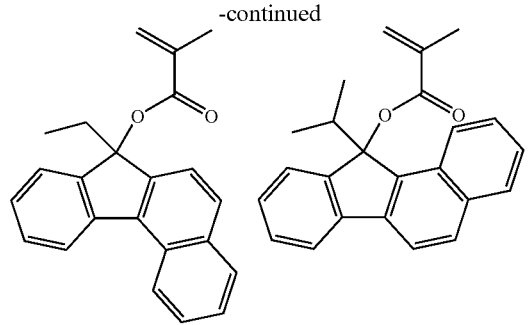
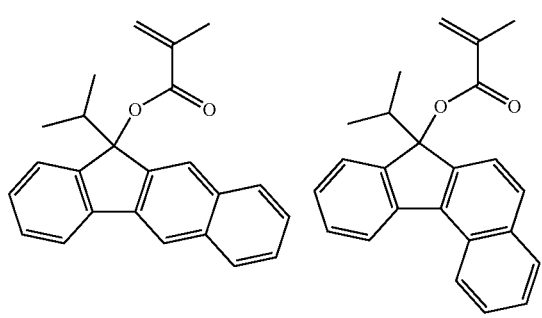
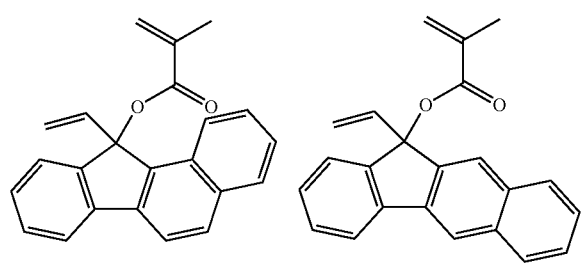
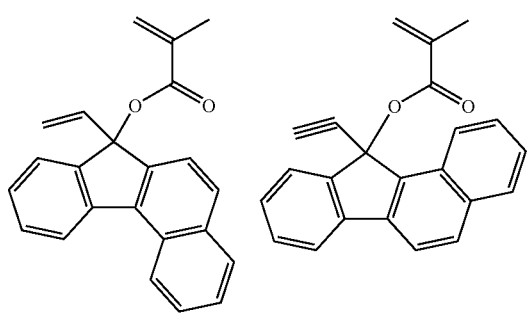
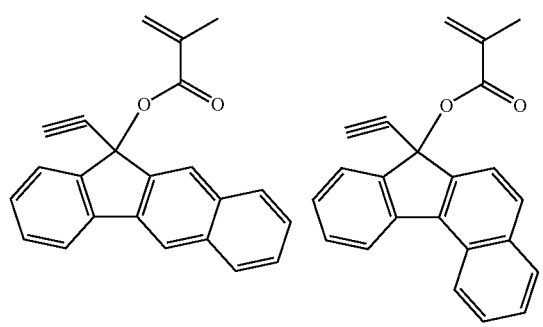
-continued
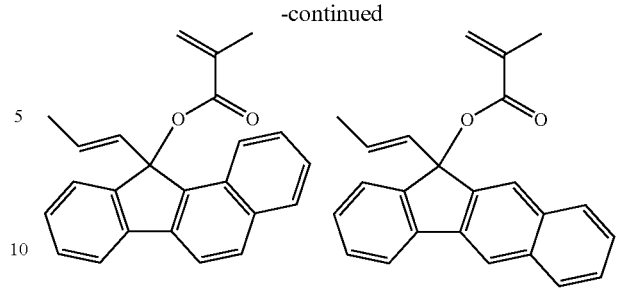
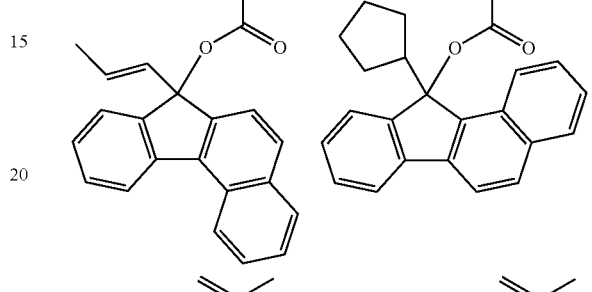
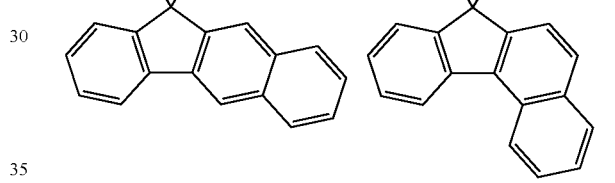
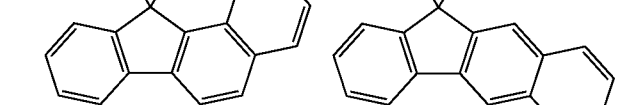
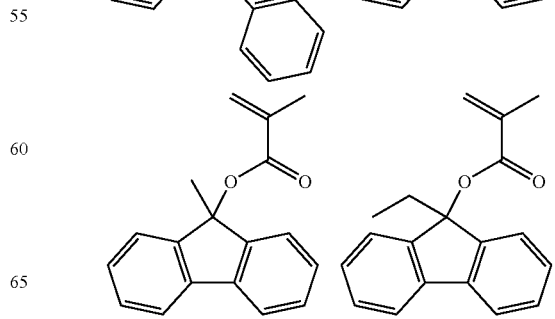

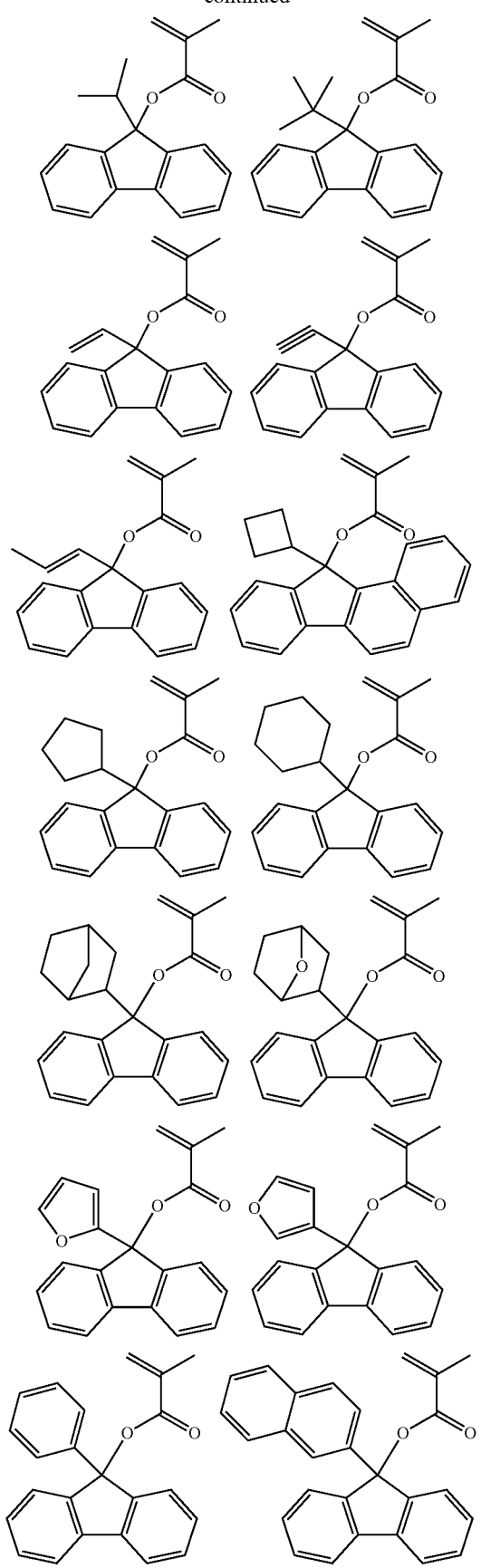
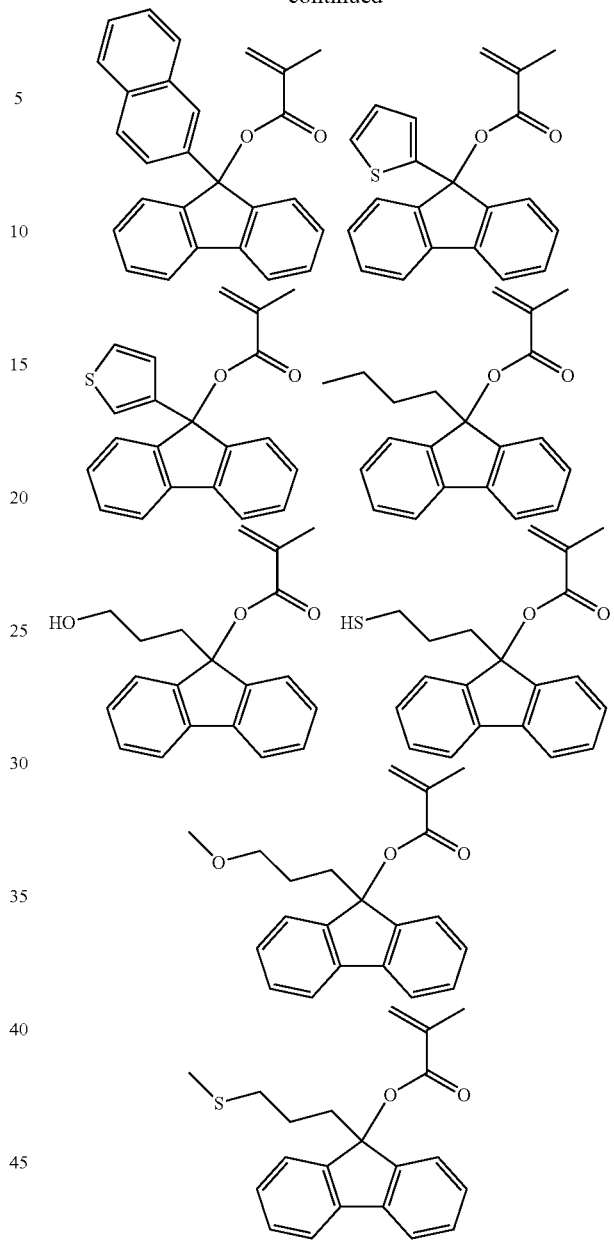

The polymerizable, acid-labile ester compounds from which recurring units (a1) are derived may be prepared from reaction of 9-hydroxyfluorene with methacrylic acid chloride. The ester compounds from which other recurring units (a2) to (a4) are derived may be similarly prepared.

In a preferred embodiment, the polymer having acid labile groups of formula (1) is a copolymer comprising recurring units (a) of the general formula (2), selected from (meth)acrylates, styrenecarboxylic acid, and vinylnaphthalenecarboxylic acid, and recurring units (b) having an adhesive group selected from among hydroxyl, lactone, ether, ester, carbonyl, and cyano groups. More preferably, the recurring units (b) are recurring units having a phenolic hydroxyl group because the group has a sensitizing effect in the EB and EUV lithography. The recurring units having a phenolic hydroxyl group are preferably selected from units (b1) to (b8) represented by the general formula (3).

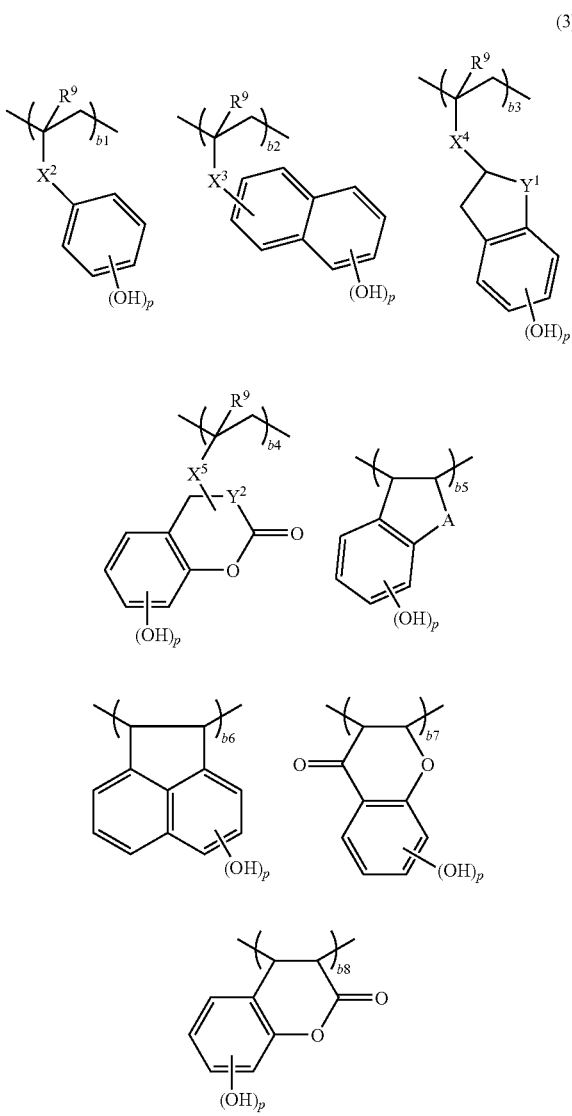

Herein $R^9$ is each independently hydrogen or methyl, $X^2$ and $X^3$ each are a single bond or —C(=O)—O—$R^{10}$—, $X^4$ and $X^5$ each are —C(=O)—O—$R^{10}$—, $R^{10}$ is a single bond or a straight, branched or cyclic $C_1$-$C_{10}$ alkylene group, $Y^1$ and $Y^2$ each are methylene or ethylene, A is methylene, oxygen or sulfur, and p is 1 or 2.

Examples of suitable monomers from which the recurring units (b1) to (b8) having a phenolic hydroxyl group are derived are given below.

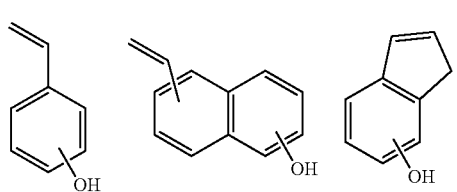

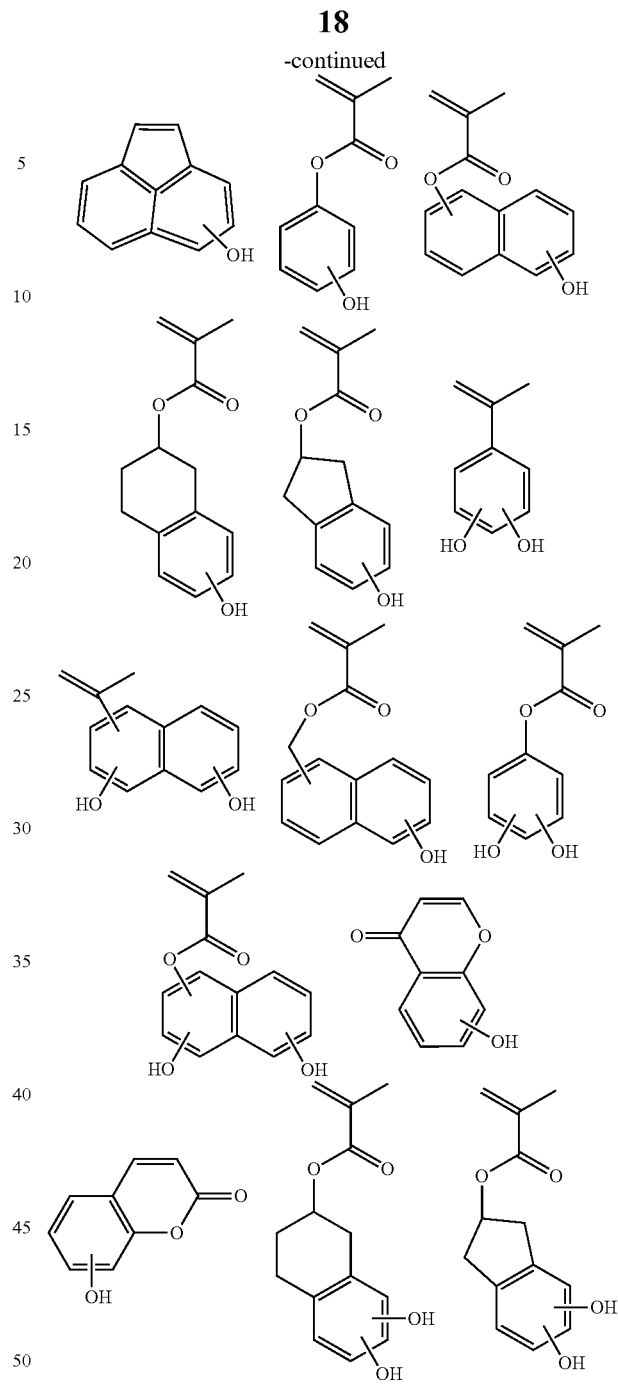

Examples of suitable monomers from which the recurring units (b) having an adhesive group selected from among non-phenolic hydroxyl, lactone, ether, ester, carbonyl, and cyano groups are derived are given below.

19
-continued
20
-continued
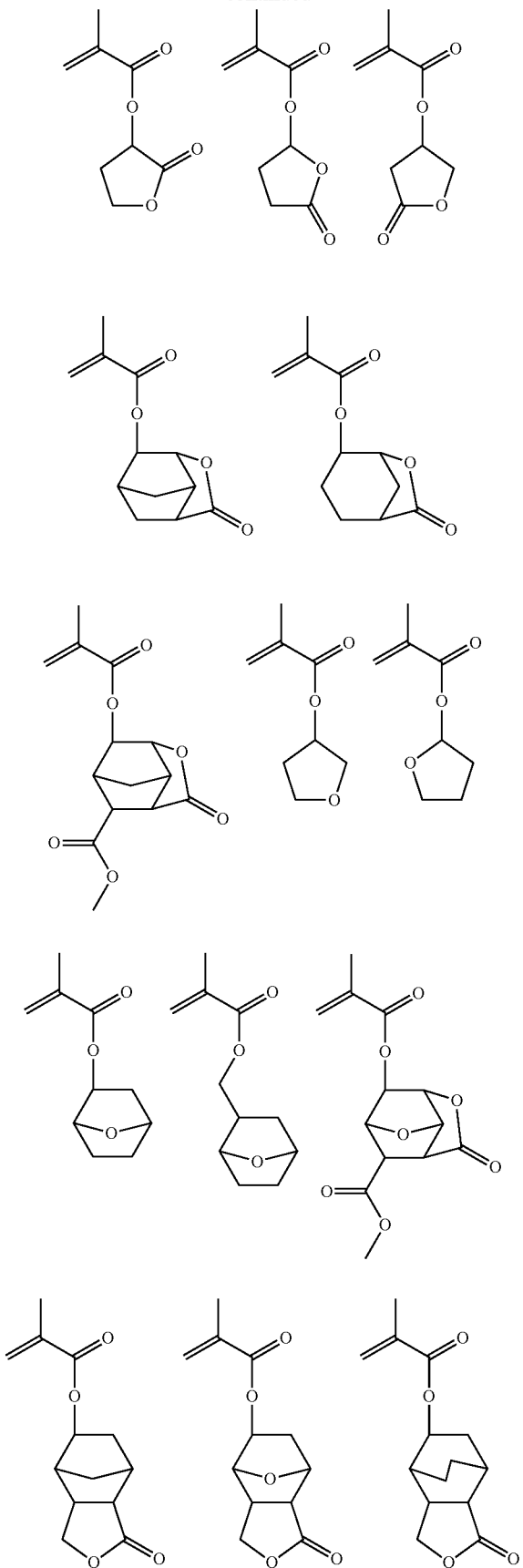
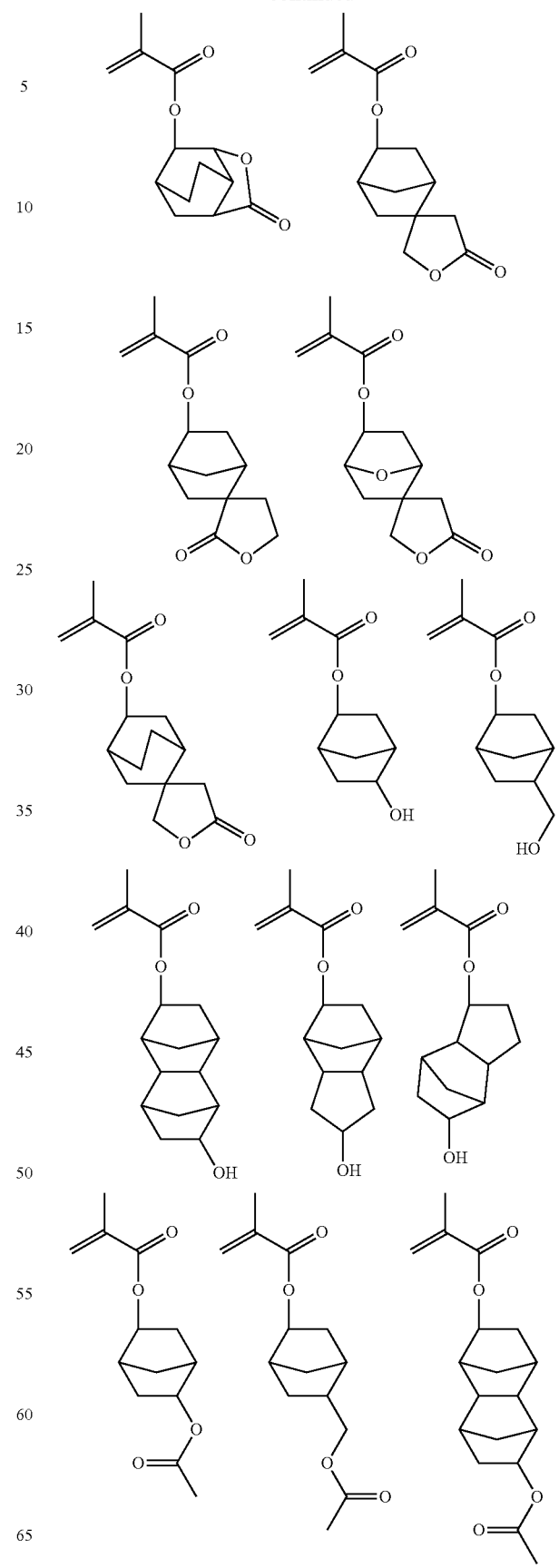

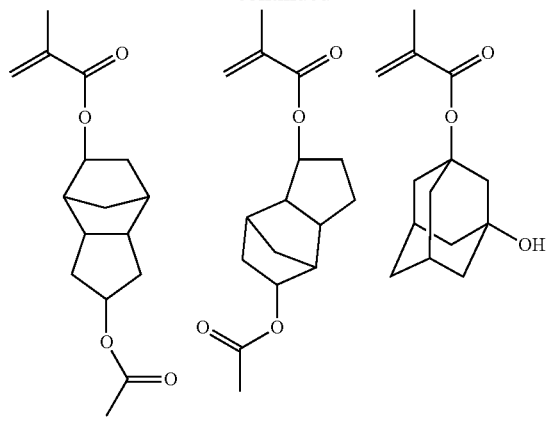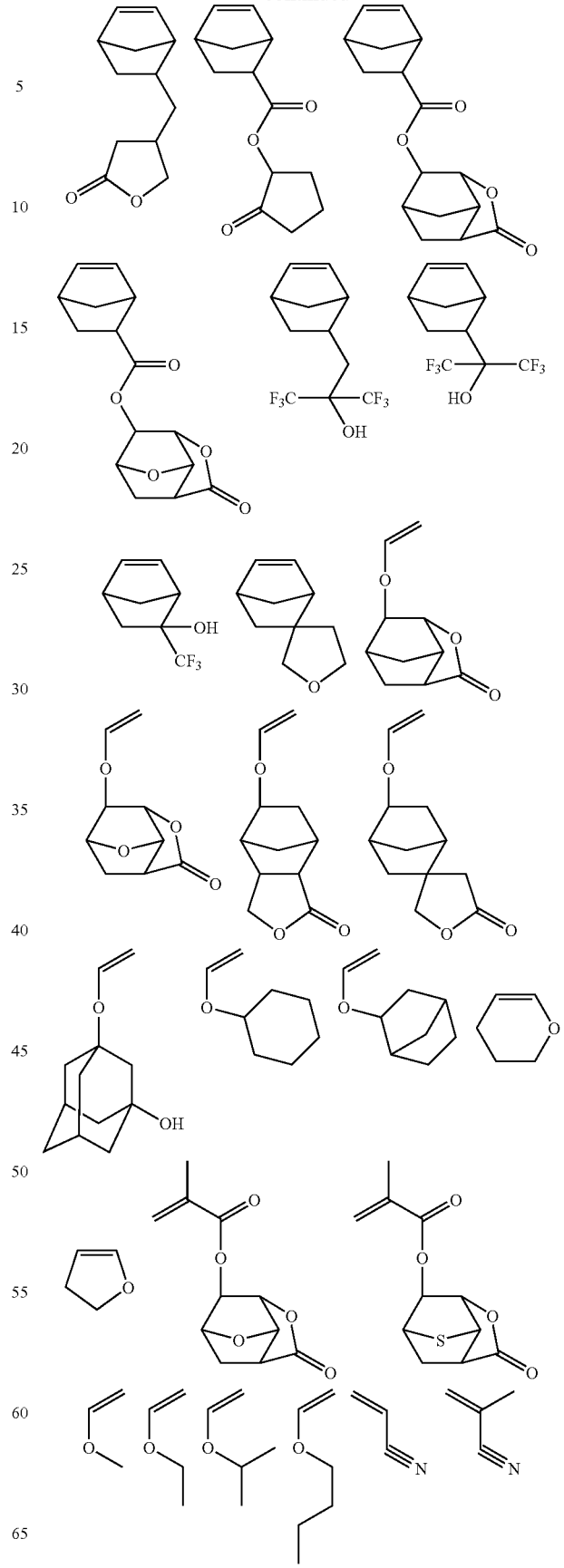

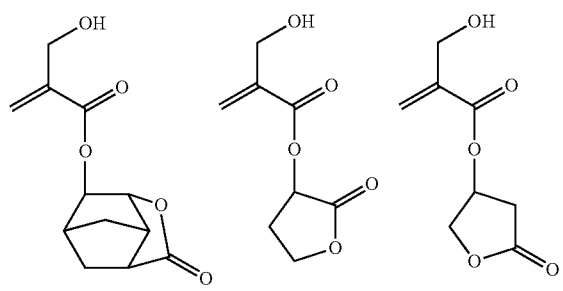
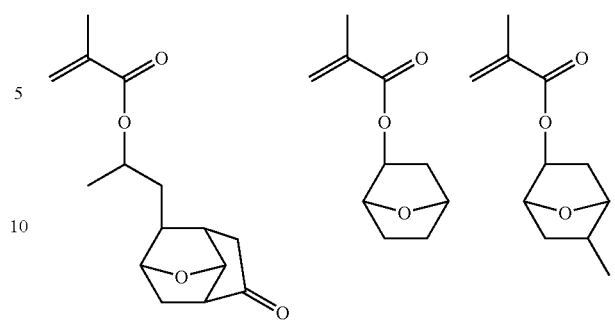
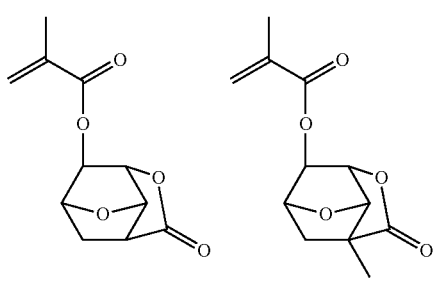
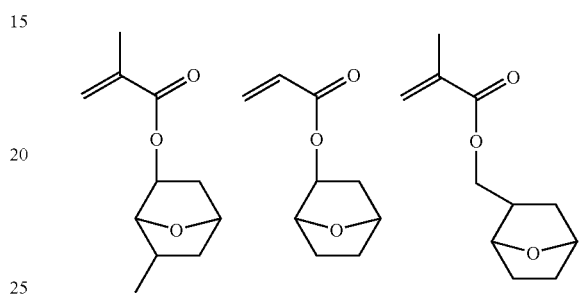
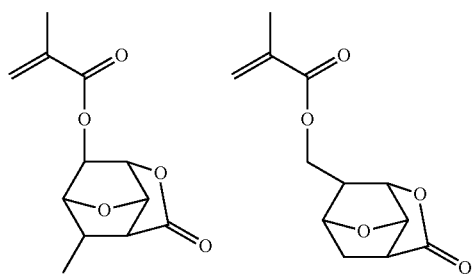
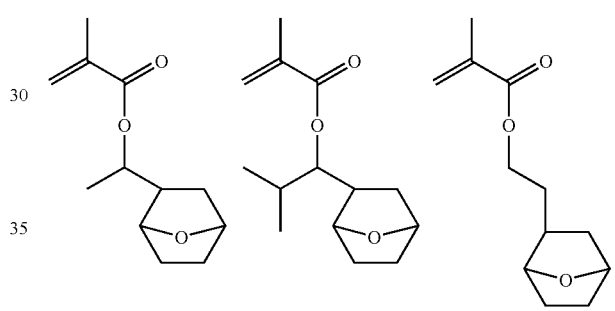
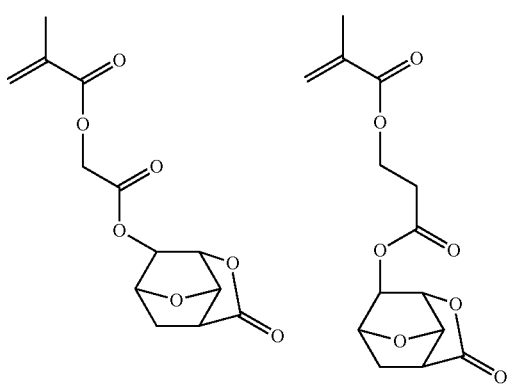
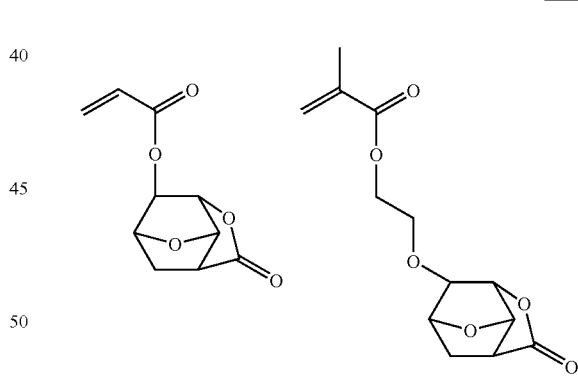
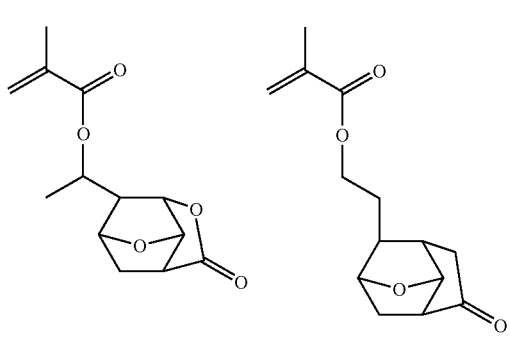
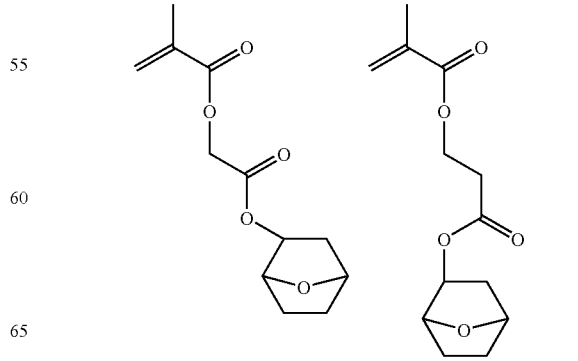

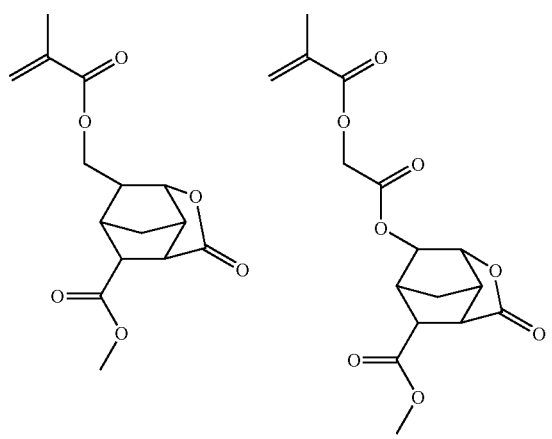
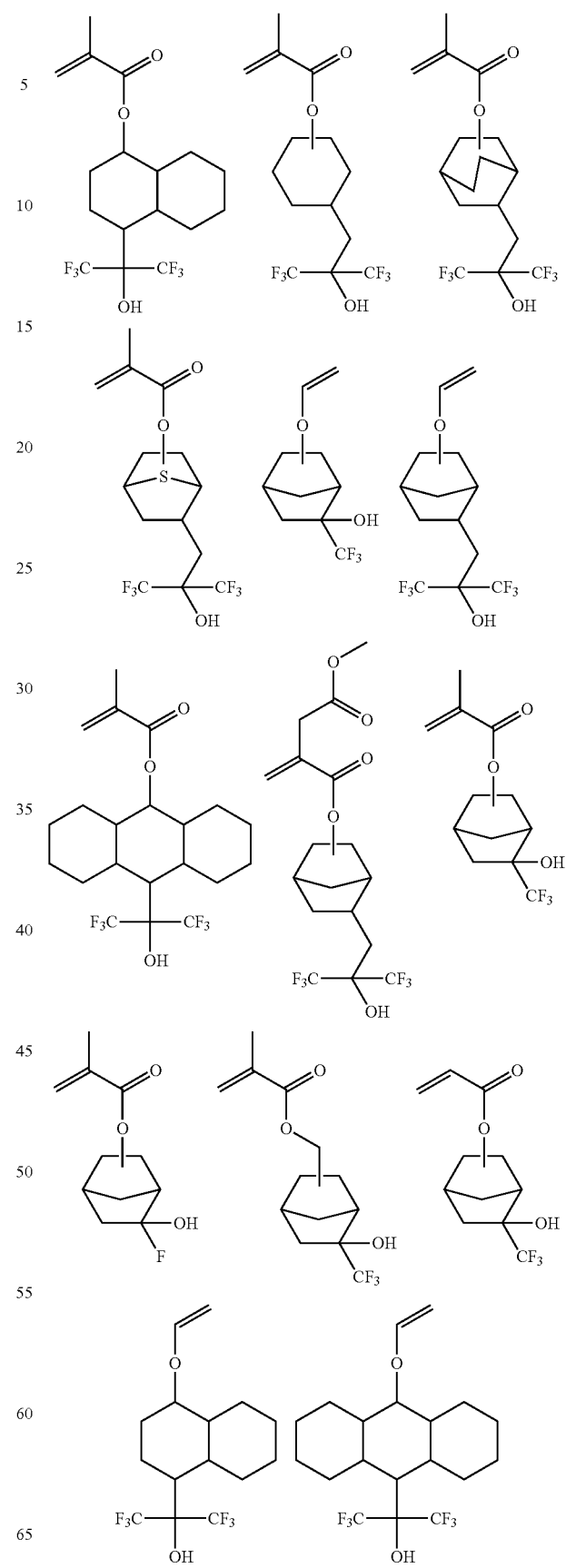

-continued
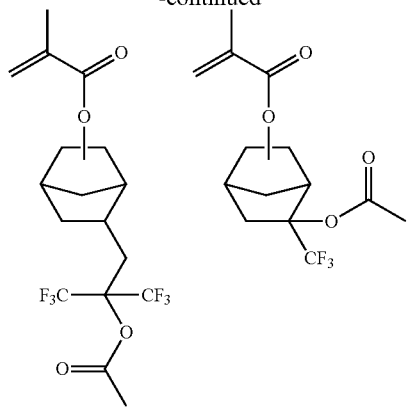
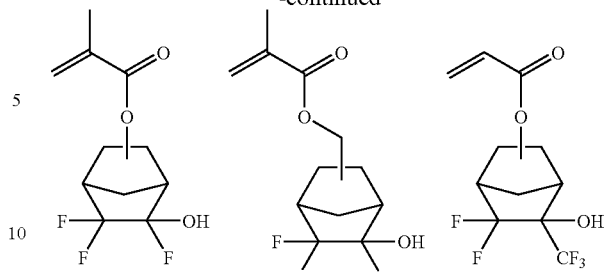
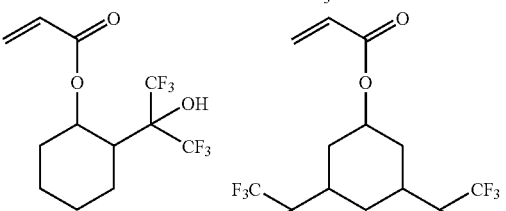
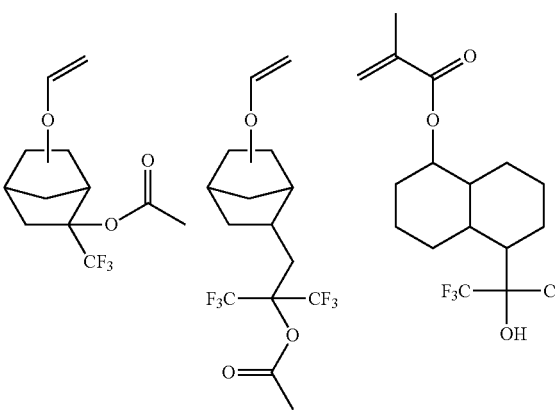
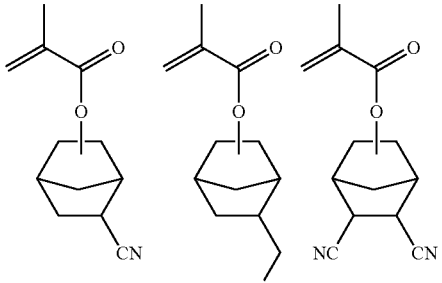
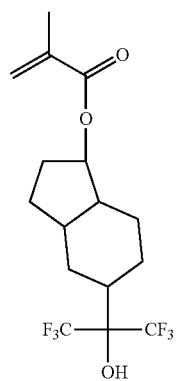
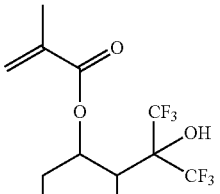
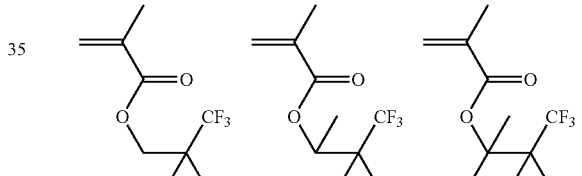
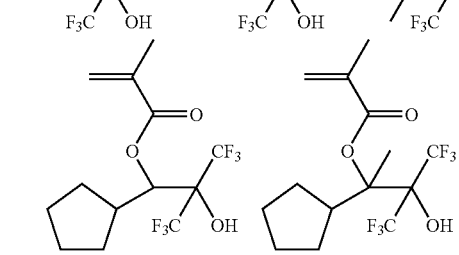
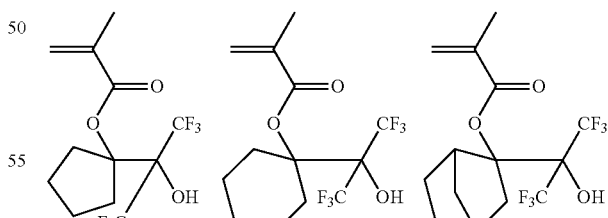
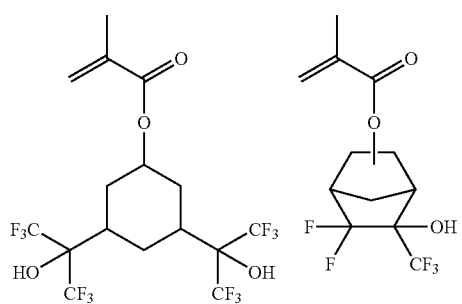
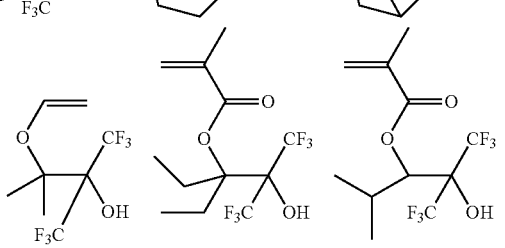

29
-continued
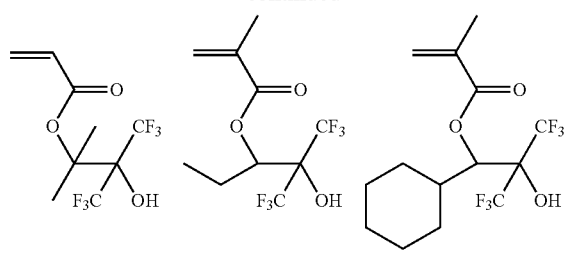
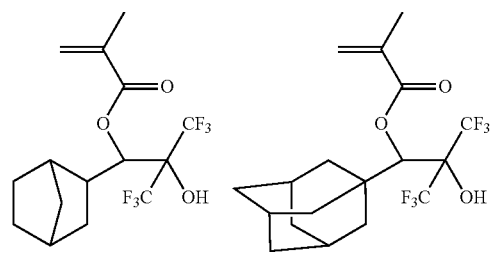
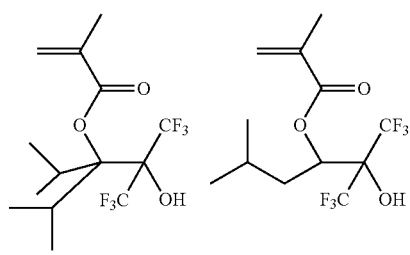
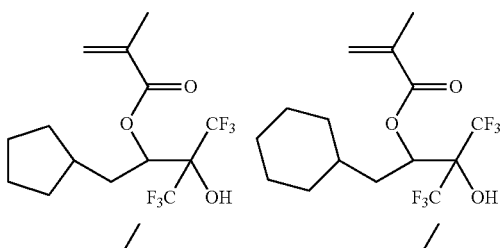
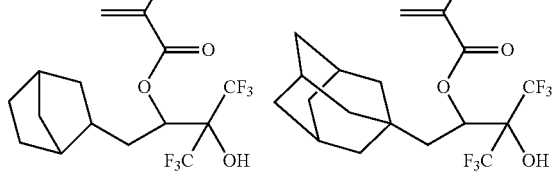
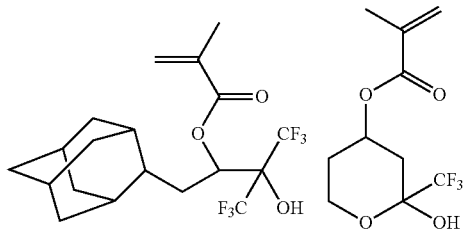
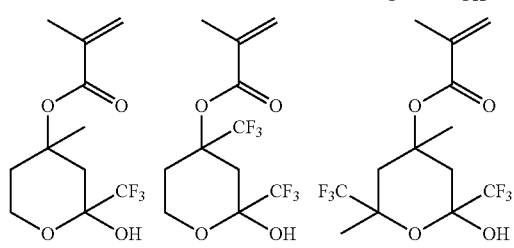
30
-continued
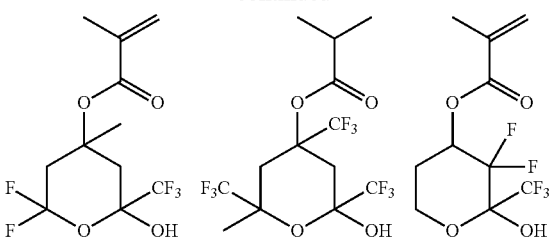
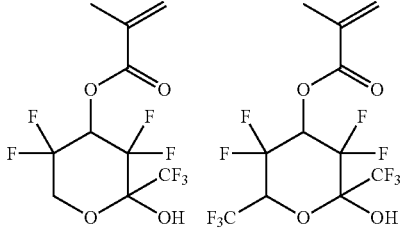
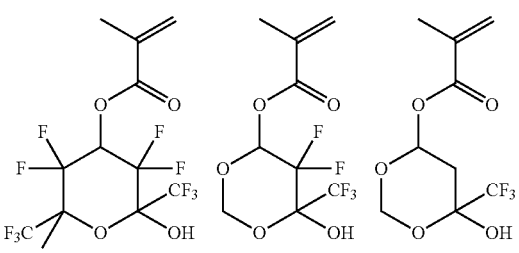
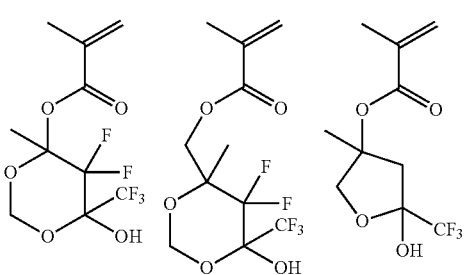
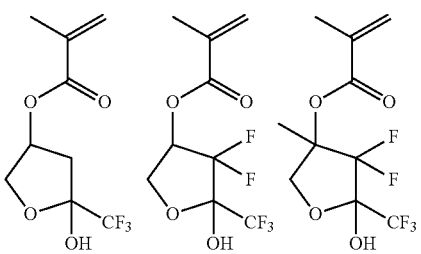
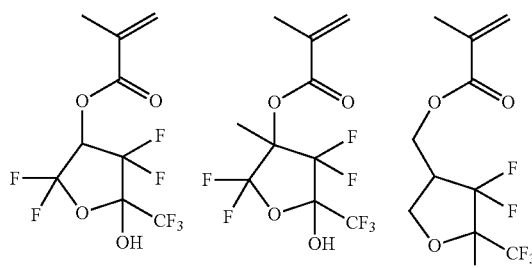

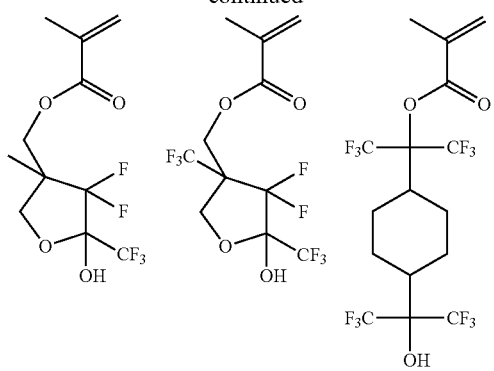
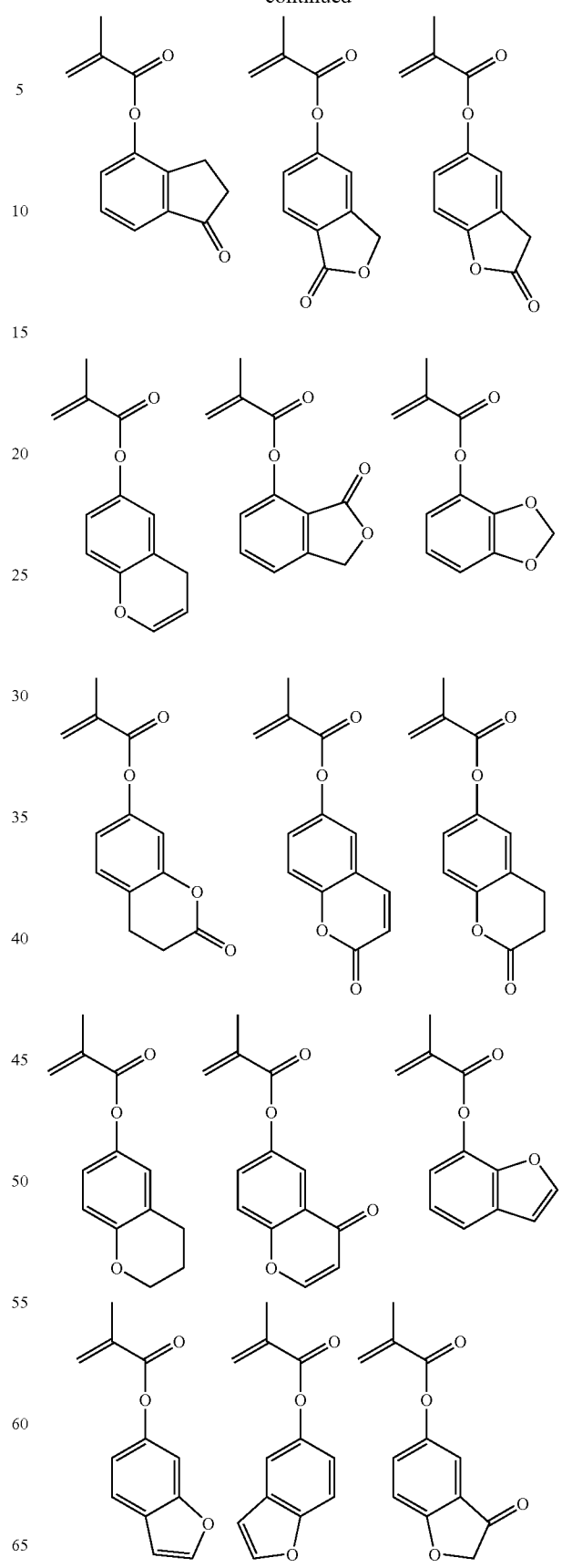

-continued

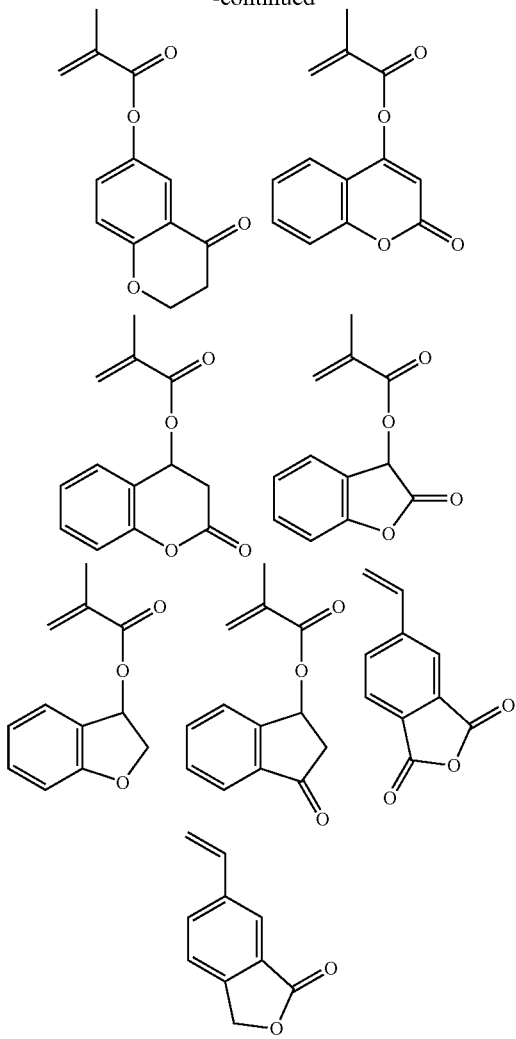

In the case of a monomer having a hydroxyl group, the hydroxyl group may be replaced by an acetal group susceptible to deprotection with acid, typically ethoxyethoxy, prior to polymerization, and the polymerization be followed by deprotection with weak acid and water. Alternatively, the hydroxy group may be replaced by an acetyl, formyl, pivaloyl or similar group prior to polymerization, and the polymerization be followed by alkaline hydrolysis.

In a more preferred embodiment, the copolymer has further copolymerized therein recurring units selected from units (c1) to (c5) of indene, acenaphthylene, chromone, coumarin, and norbornadiene, or derivatives thereof, represented by the general formula (4).

(4)

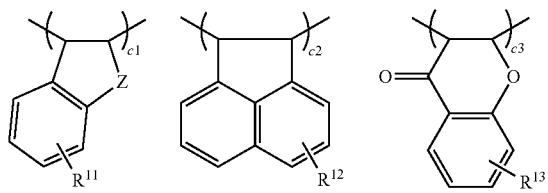

-continued

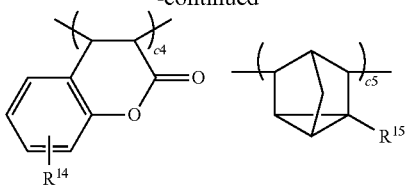

Herein $R^{11}$ to $R^{15}$ are each independently hydrogen, a $C_1$-$C_{30}$ alkyl, haloalkyl, alkoxy, alkanoyl or alkoxycarbonyl group, $C_6$-$C_{10}$ aryl group, halogen, or 1,1,1,3,3,3-hexafluoro-2-propanol group, and Z is methylene, oxygen or sulfur. As used herein, the term "haloalkyl" refers to alkyl in which some or all hydrogen atoms are substituted by halogen.

Examples of suitable monomers from which units (c1) to (c5) of indene, acenaphthylene, chromone, coumarin, and norbornadiene derivatives are derived are given below.

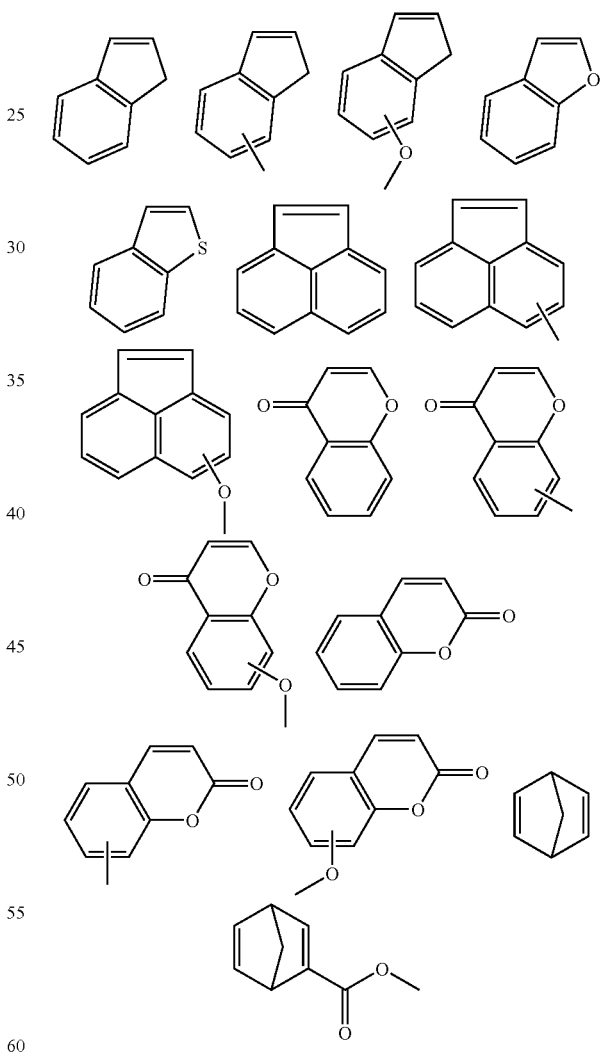

In a further embodiment, an acid generator (d) in the form of an onium salt having polymerizable olefin may be copolymerized with the foregoing monomers. JP-A H04-230645, JP-A 2005-084365, and JP-A 2006-045311 disclose sulfonium salts having polymerizable olefin capable of generating a specific sulfonic acid and similar iodonium salts. JP-A 2006-178317 discloses a sulfonium salt having sulfonic acid directly attached to the main chain.

In this embodiment, the copolymer may have further copolymerized therein recurring units having a sulfonium salt (d1) to (d3) represented by the general formula (5).

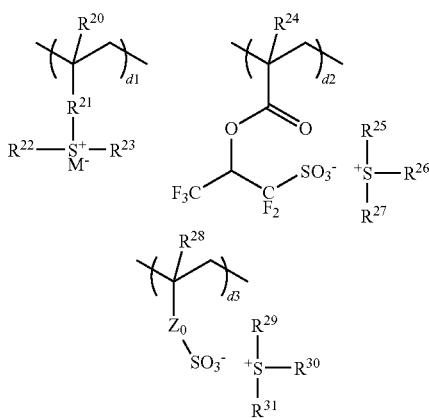

(5)

Herein $R^{20}$, $R^{24}$ and $R^{28}$ each are hydrogen or methyl. $R^{21}$ is a single bond, phenylene, —O—$R^{33}$—, or —C(=O)—Y—$R^{33}$— wherein Y is oxygen or NH and $R^{33}$ is a straight, branched or cyclic $C_1$-$C_6$ alkylene group, phenylene group or alkenylene group, which may contain a carbonyl (—CO—), ester (—COO—), ether (—O—) or hydroxyl group. $R^{22}$, $R^{23}$, $R^{25}$, $R^{26}$, $R^{27}$, $R^{29}$, $R^{30}$, and $R^{31}$ are each independently a straight, branched or cyclic $C_1$-$C_{12}$ alkyl group which may contain a carbonyl, ester or ether group, or a $C_6$-$C_{12}$ aryl group, $C_7$-$C_{20}$ aralkyl group, or thiophenyl group. $Z_0$ is a single bond, methylene, ethylene, phenylene, fluorinated phenylene, —O—$R^{32}$—, or —C(=O)—$Z_1$—$R^{32}$— wherein $Z_1$ is oxygen or NH and $R^{32}$ is a straight, branched or cyclic $C_1$-$C_6$ alkylene group, phenylene group or alkenylene group, which may contain a carbonyl, ester, ether or hydroxyl group. $M^-$ is a non-nucleophilic counter ion. Molar fractions d1 to d3 are in the range: $0 \leq d1 \leq 0.3$, $0 \leq d2 \leq 0.3$, $0 \leq d3 \leq 0.3$, and $0 \leq d1+d2+d3 \leq 0.3$.

Examples of the non-nucleophilic counter ion represented by $M^-$ include halide ions such as chloride and bromide ions; fluoroalkylsulfonate ions such as triflate, 1,1,1-trifluoroethanesulfonate, and nonafluorobutanesulfonate; arylsulfonate ions such as tosylate, benzenesulfonate, 4-fluorobenzenesulfonate, and 1,2,3,4,5-pentafluorobenzenesulfonate; alkylsulfonate ions such as mesylate and butanesulfonate; imidates such as bis(trifluoromethylsulfonyl)imide, bis(perfluoroethylsulfonyl)imide and bis(perfluorobutylsulfonyl)imide; methidates such as tris(trifluoromethylsulfonyl)methide and tris(perfluoroethylsulfonyl)methide.

The attachment of an acid generator to the polymer main chain is effective in restraining acid diffusion, thereby preventing a reduction of resolution due to blur by acid diffusion. Also edge roughness (LER or LWR) is improved since the acid generator is uniformly distributed.

While the polymer according to the invention comprises acid labile group-bearing recurring units (a) as essential units, it may have additionally copolymerized therein recurring units (e) of (meth)acrylate having substituted thereon an acid labile group $R^{17}$ and/or recurring units (f) of hydroxystyrene having substituted thereon an acid labile group $R^{19}$ as represented by the following general formula (7).

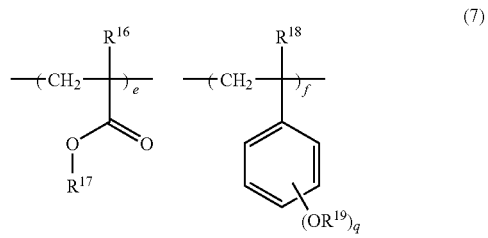

(7)

Herein $R^{16}$ and $R^{18}$ each are hydrogen or methyl, $R^{17}$ and $R^{19}$ each are an acid labile group other than formula (1), and q is 1 or 2.

Besides the recurring units (a) to (f), additional recurring units (g) may be copolymerized in the polymer, which include recurring units derived from styrene, vinylnaphthalene, vinylanthracene, vinylpyrene, methyleneindane, and the like.

The acid labile group represented by $R^{17}$ and $R^{18}$ in formula (7) may be selected from a variety of such groups. The acid labile groups may be the same or different and preferably include groups of the following formulae (A-1) to (A-3).

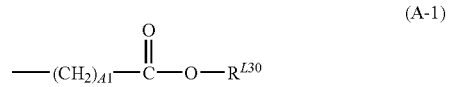

(A-1)

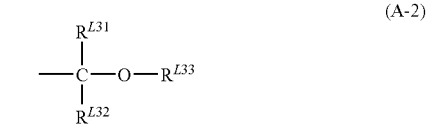

(A-2)

(A-3)

In formula (A-1), $R^{L30}$ is a tertiary alkyl group of 4 to 20 carbon atoms, preferably 4 to 15 carbon atoms, a trialkylsilyl group in which each alkyl moiety has 1 to 6 carbon atoms, an oxoalkyl group of 4 to 20 carbon atoms, or a group of formula (A-3). Exemplary tertiary alkyl groups are tert-butyl, tert-amyl, 1,1-diethylpropyl, 1-ethylcyclopentyl, 1-butylcyclopentyl, 1-ethylcyclohexyl, 1-butylcyclohexyl, 1-ethyl-2-cyclopentenyl, 1-ethyl-2-cyclohexenyl, and 2-methyl-2-adamantyl. Exemplary trialkylsilyl groups are trimethylsilyl, triethylsilyl, and dimethyl-tert-butylsilyl. Exemplary oxoalkyl groups are 3-oxocyclohexyl, 4-methyl-2-oxooxan-4-yl, and 5-methyl-2-oxooxolan-5-yl. Letter A1 is an integer of 0 to 6.

In formula (A-2), $R^{L31}$ and $R^{L32}$ are hydrogen or straight, branched or cyclic alkyl groups of 1 to 18 carbon atoms, preferably 1 to 10 carbon atoms. Exemplary alkyl groups include methyl, ethyl, propyl, isopropyl, n-butyl, sec-butyl, tert-butyl, cyclopentyl, cyclohexyl, 2-ethylhexyl, and n-octyl. $R^{L33}$ is a monovalent hydrocarbon group of 1 to 18 carbon atoms, preferably 1 to 10 carbon atoms, which may contain a heteroatom such as oxygen, examples of which include straight, branched or cyclic alkyl groups and substituted forms of such alkyl groups in which some hydrogen atoms are replaced by hydroxyl, alkoxy, oxo, amino, alkylamino or the like. Illustrative examples of the substituted alkyl groups are shown below.

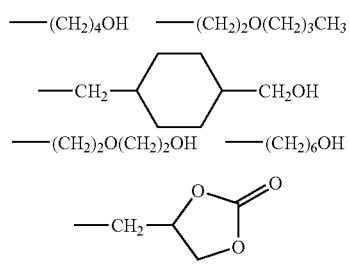

A pair of $R^{L31}$ and $R^{L32}$, $R^{L31}$ and $R^{L33}$, or, $R^{L32}$ and $R^{L33}$ may bond together to form a ring with the carbon and oxygen atoms to which they are attached. Each of $R^{L31}$, $R^{L32}$ and $R^{L33}$ is a straight or branched alkylene group of 1 to 18 carbon atoms, preferably 1 to 10 carbon atoms when they form a ring, while the ring preferably has 3 to 10 carbon atoms, more preferably 4 to 10 carbon atoms.

Examples of the acid labile groups of formula (A-1) include tert-butoxycarbonyl, tert-butoxycarbonylmethyl, tert-amyloxycarbonyl, tert-amyloxycarbonylmethyl, 1,1-diethylpropyloxycarbonyl, 1,1-diethylpropyloxycarbonylmethyl, 1-ethylcyclopentyloxycarbonyl, 1-ethylcyclopentyloxycarbonylmethyl, 1-ethyl-2-cyclopentenyloxycarbonyl, 1-ethyl-2-cyclopentenyloxycarbonylmethyl, 1-ethoxyethoxycarbonylmethyl, 2-tetrahydropyranyloxycarbonylmethyl, and 2-tetrahydrofuranyloxycarbonylmethyl groups.

Also included are substituent groups having the formulae (A-1)-1 to (A-1)-10.

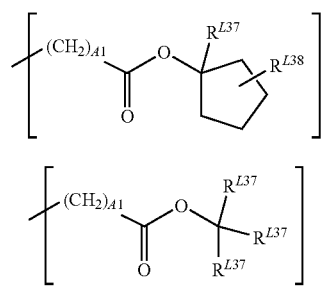

(A-1)-1

(A-1)-2

(A-1)-3

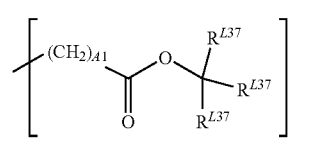

(A-1)-4

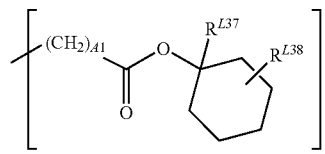

(A-1)-5

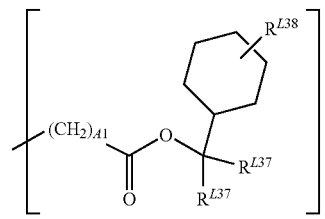

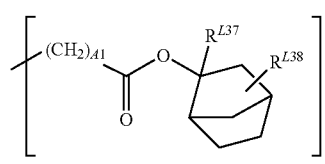

-continued

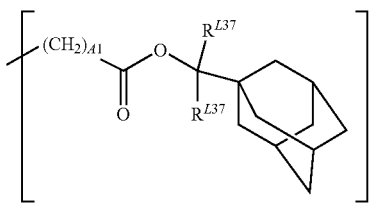

(A-1)-6

(A-1)-7

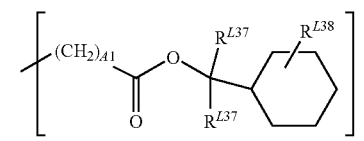

(A-1)-8

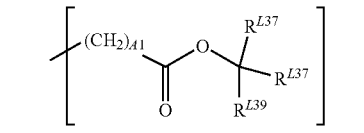

(A-1)-9

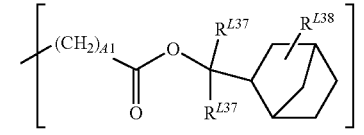

(A-1)-10

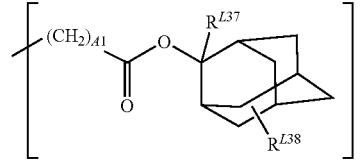

Herein $R^{L37}$ is each independently a straight, branched or cyclic $C_1$-$C_{10}$ alkyl group or $C_6$-$C_{20}$ aryl group, $R^{L38}$ is hydrogen or a straight, branched or cyclic $C_1$-$C_{10}$ alkyl group, $R^{L39}$ is each independently a straight, branched or cyclic $C_2$-$C_{10}$ alkyl group or $C_6$-$C_{20}$ aryl group, and A1 is as defined above.

Of the acid labile groups of formula (A-2), the straight and branched ones are exemplified by the following groups having formulae (A-2)-1 to (A-2)-35.

 (A-2)-1

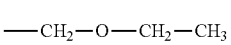 (A-2)-2

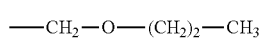 (A-2)-3

 (A-2)-4

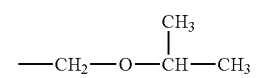 (A-2)-5

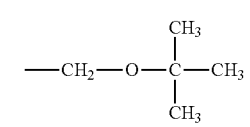 (A-2)-6

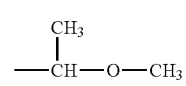 (A-2)-7

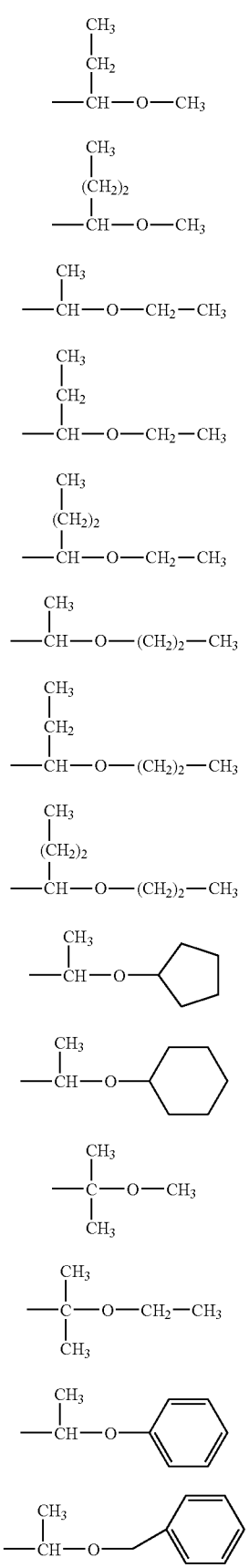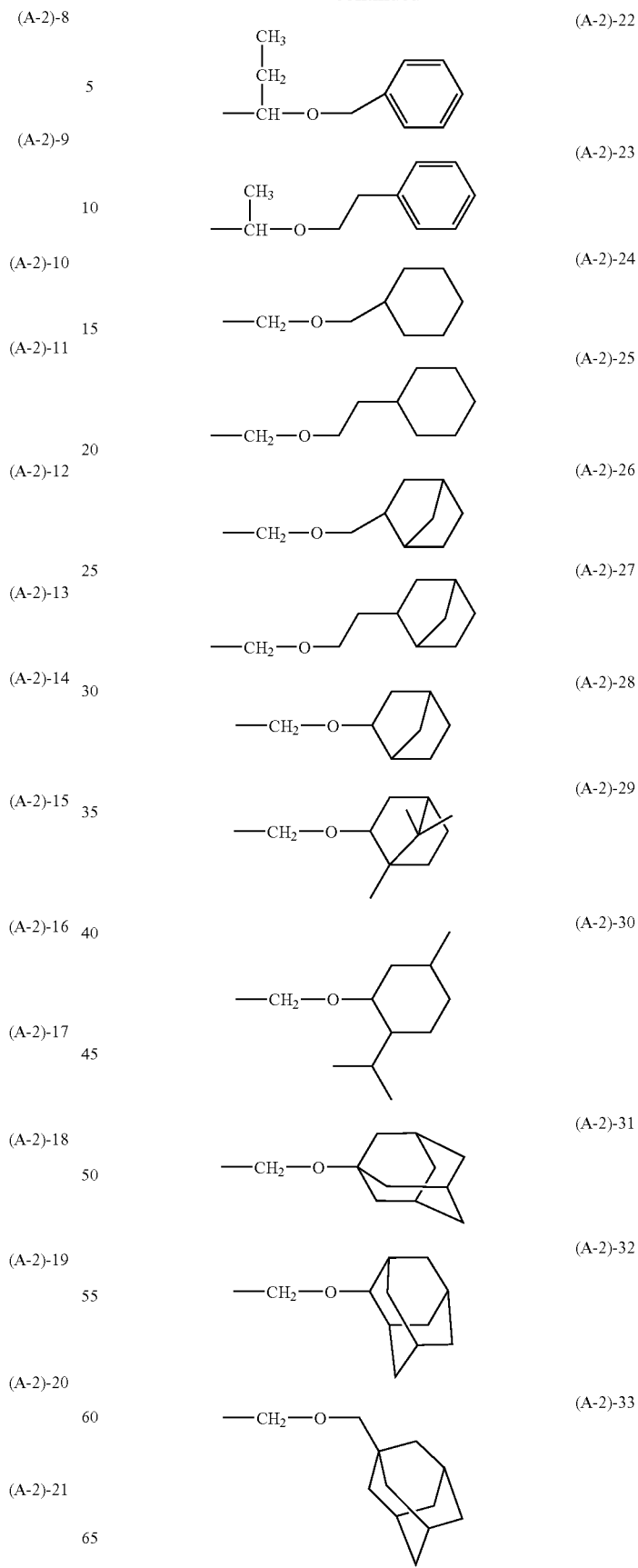

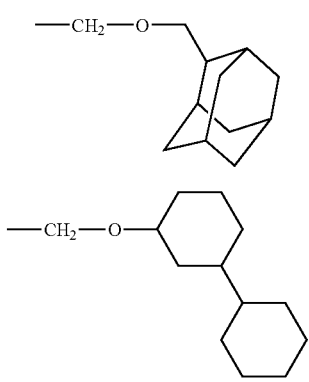
(A-2)-34

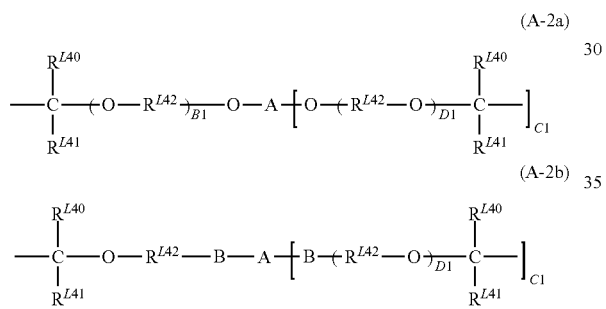
(A-2)-35

Of the acid labile groups of formula (A-2), the cyclic ones are, for example, tetrahydrofuran-2-yl, 2-methyltetrahydrofuran-2-yl, tetrahydropyran-2-yl, and 2-methyltetrahydropyran-2-yl.

Other examples of acid labile groups include those of the following formula (A-2a) or (A-2b) while the polymer may be crosslinked within the molecule or between molecules with these acid labile groups.

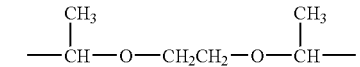
(A-2)-36

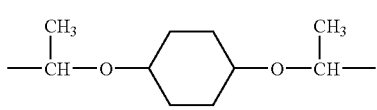
(A-2)-37

(A-2)-38

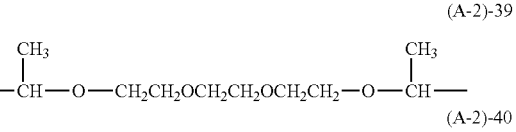
(A-2)-39

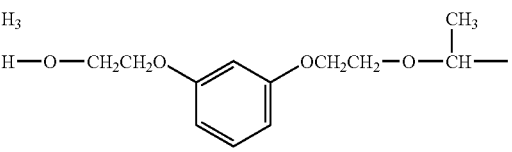
(A-2)-40

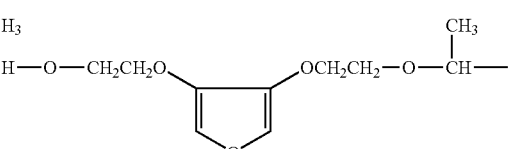
(A-2)-41

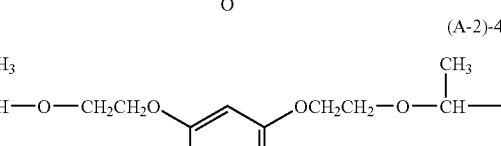
(A-2)-42

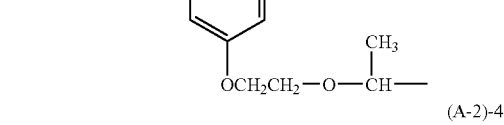
(A-2)-43

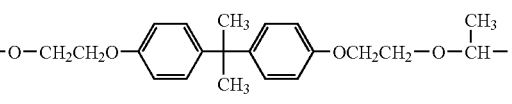

Herein $R^{L40}$ and $R^{L41}$ each are hydrogen or a straight, branched or cyclic $C_1$-$C_8$ alkyl group, or $R^{L40}$ and $R^{L41}$, taken together, may form a ring with the carbon atom to which they are attached, and $R^{L40}$ and $R^{L41}$ are straight or branched $C_1$-$C_8$ alkylene groups when they form a ring. $R^{L42}$ is a straight, branched or cyclic $C_1$-$C_{10}$ alkylene group. Each of B1 and D1 is 0 or an integer of 1 to 10, preferably 0 or an integer of 1 to 5, and C1 is an integer of 1 to 7. "A" is a (C1+1)-valent aliphatic or alicyclic saturated hydrocarbon group, aromatic hydrocarbon group or heterocyclic group having 1 to 50 carbon atoms, which may be separated by a heteroatom or in which some of the hydrogen atoms attached to carbon atoms may be substituted by hydroxyl, carboxyl, carbonyl groups or fluorine atoms. "B" is —CO—O—, —NHCO—O— or —NHCONH—.

Preferably, "A" is selected from divalent to tetravalent, straight, branched or cyclic $C_1$-$C_{20}$ alkylene, alkyltriyl and alkyltetrayl groups, and $C_6$-$C_{30}$ arylene groups, which may contain a heteroatom or in which some of the hydrogen atoms attached to carbon atoms may be substituted by hydroxyl, carboxyl, acyl groups or halogen atoms. The subscript C1 is preferably an integer of 1 to 3.

The crosslinking acetal groups of formulae (A-2a) and (A-2b) are exemplified by the following formulae (A-2)-36 through (A-2)-43.

In formula (A-3), $R^{L34}$, $R^{L35}$ and $R^{L36}$ each are a monovalent hydrocarbon group, typically a straight, branched or cyclic $C_1$-$C_{20}$ alkyl group, which may contain a heteroatom such as oxygen, sulfur, nitrogen or fluorine. A pair of $R^{L34}$ and $R^{L35}$, $R^{L34}$ and $R^{L36}$, or $R^{L35}$ and $R^{L36}$ may bond together to form a $C_3$-$C_{20}$ ring with the carbon atom to which they are attached.

Exemplary tertiary alkyl groups of formula (A-3) include tert-butyl, triethylcarbyl, 1-ethylnorbornyl, 1-methylcyclohexyl, 1-ethylcyclopentyl, 2-(2-methyl)adamantyl, 2-(2-ethyl)adamantyl, and tert-amyl.

Other exemplary tertiary alkyl groups include those of the following formulae (A-3)-1 to (A-3)-18.

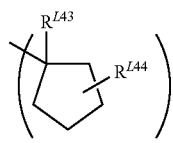
(A-3)-1

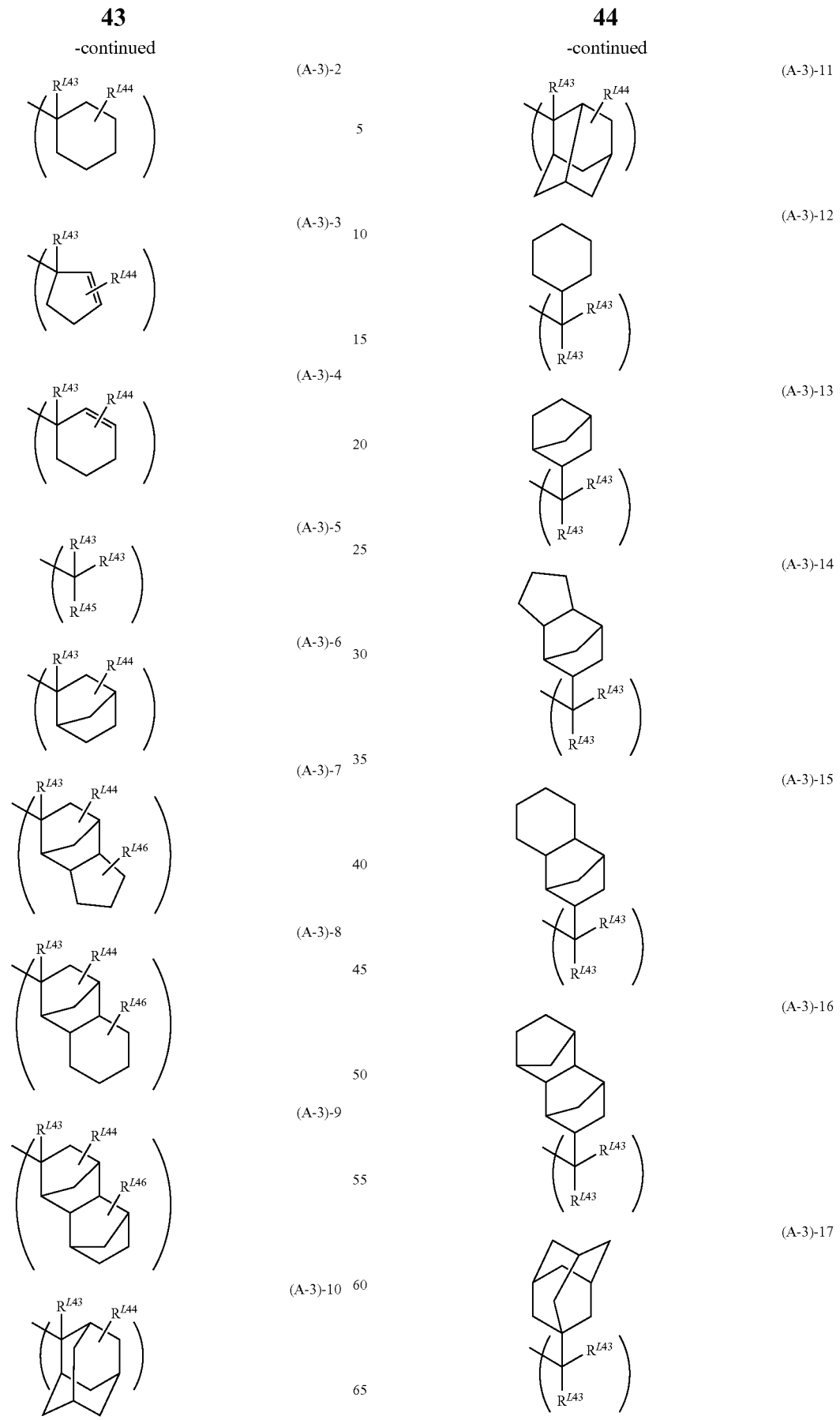

-continued

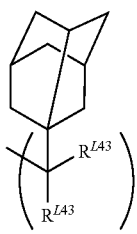
(A-3)-18

Herein $R^{L43}$ is each independently a straight, branched or cyclic $C_1$-$C_8$ alkyl group or $C_6$-$C_{20}$ aryl group, typically phenyl or naphthyl, $R^{L44}$ and $R^{L46}$ each are hydrogen or a straight, branched or cyclic $C_1$-$C_{20}$ alkyl group, and $R^{L45}$ is a $C_6$-$C_{20}$ aryl group, typically phenyl.

The polymer may be crosslinked within the molecule or between molecules with groups having $R^{L47}$ which is a di- or multi-valent alkylene or arylene group, as shown by the following formulae (A-3)-19 and (A-3)-20.

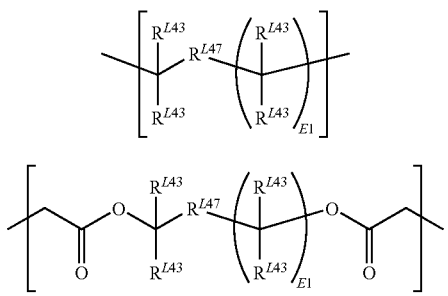
(A-3)-19

(A-3)-20

Herein $R^{L43}$ is as defined above, $R^{L47}$ is a straight, branched or cyclic $C_1$-$C_{20}$ alkylene group or arylene group, typically phenylene, which may contain a heteroatom such as oxygen, sulfur or nitrogen, and E1 is an integer of 1 to 3.

Of recurring units having acid labile groups of formula (A-3), recurring units of (meth)acrylate having an exo-form structure represented by the formula (A-3)-21 are preferred.

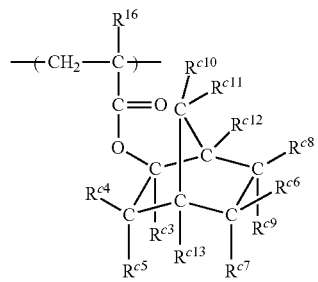
(A-3)-21

Herein, $R^{16}$ is as defined above; $R^{c3}$ is a straight, branched or cyclic $C_1$-$C_8$ alkyl group or an optionally substituted $C_6$-$C_{20}$ aryl group; $R^{c4}$ to $R^{c9}$, $R^{c12}$ and $R^{c13}$ are each independently hydrogen or a monovalent $C_1$-$C_{15}$ hydrocarbon group which may contain a heteroatom; and $R^{c10}$ and $R^{c11}$ are hydrogen. Alternatively, a pair of $R^{c4}$ and $R^{c5}$, $R^{c6}$ and $R^{c8}$, $R^{c6}$ and $R^{c9}$, $R^{c7}$ and $R^{c9}$, $R^{c7}$ and $R^{c13}$, $R^{c8}$ and $R^{c12}$, $R^{c10}$ and $R^{c11}$, or $R^{c11}$ and $R^{c12}$, taken together, may form a ring, and in that event, each ring-forming R is a divalent $C_1$-$C_{15}$ hydrocarbon group which may contain a heteroatom. Also, a pair of $R^{c4}$ and $R^{c13}$, $R^{c10}$ and $R^{c13}$, or $R^{c6}$ and $R^{c8}$ which are attached to vicinal carbon atoms may bond together directly to form a double bond. The formula also represents an enantiomer.

The ester form monomers from which recurring units having an exo-form structure represented by formula (A-3)-21 are derived are described in U.S. Pat. No. 6,448,420 (JP-A 2000-327633). Illustrative non-limiting examples of suitable monomers are given below.

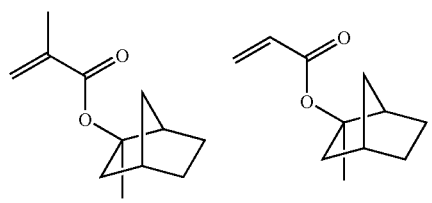

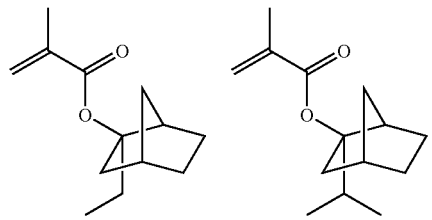

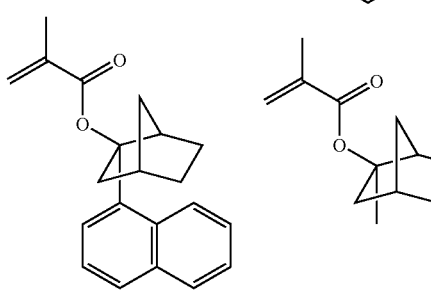

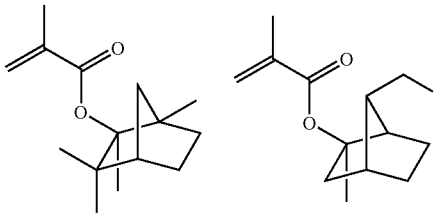

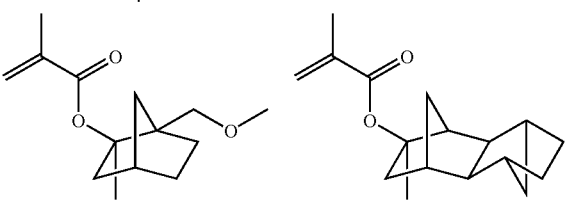

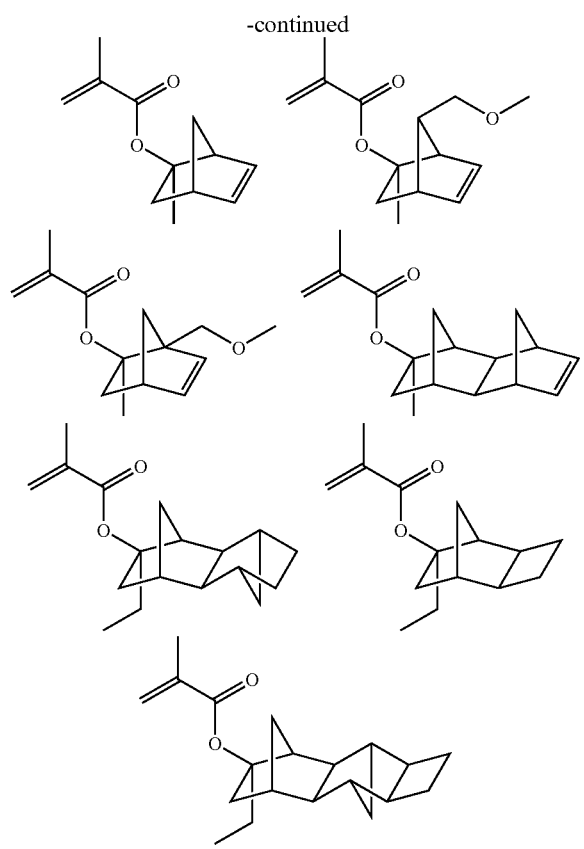

Also included in the acid labile groups of formula (A-3) are acid labile groups of (meth)acrylate having furandiyl, tetrahydrofurandiyl or oxanorbornanediyl as represented by the following formula (A-3)-22.

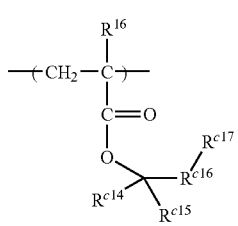
(A-3)-22

Herein, $R^{16}$ is as defined above; $R^{c14}$ and $R^{c15}$ are each independently a monovalent, straight, branched or cyclic $C_1$-$C_{10}$ hydrocarbon group, or $R^{c14}$ and $R^{c15}$, taken together, may form an aliphatic hydrocarbon ring with the carbon atom to which they are attached. $R^{c16}$ is a divalent group selected from furandiyl, tetrahydrofurandiyl and oxanorbornanediyl. $R^{c17}$ is hydrogen or a monovalent, straight, branched or cyclic $C_1$-$C_{10}$ hydrocarbon group which may contain a heteroatom.

Examples of the monomers from which the recurring units substituted with acid labile groups having furandiyl, tetrahydrofurandiyl and oxanorbornanediyl are derived are shown below. Note that Me is methyl and Ac is acetyl.

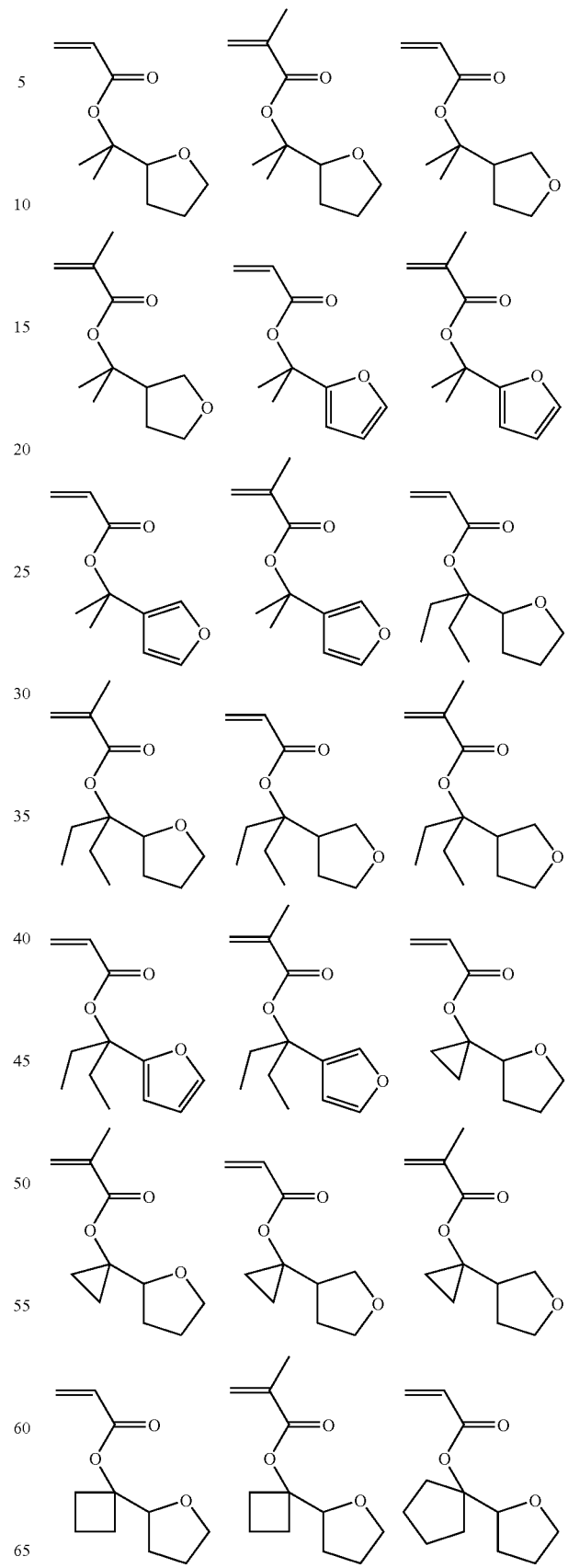

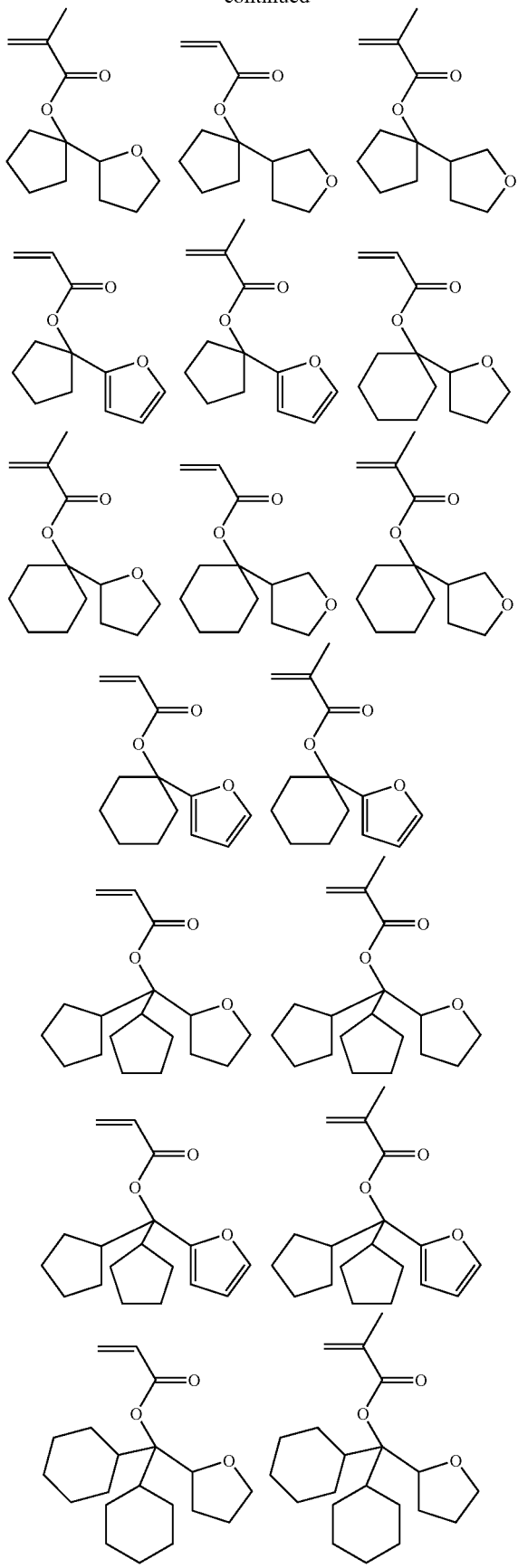
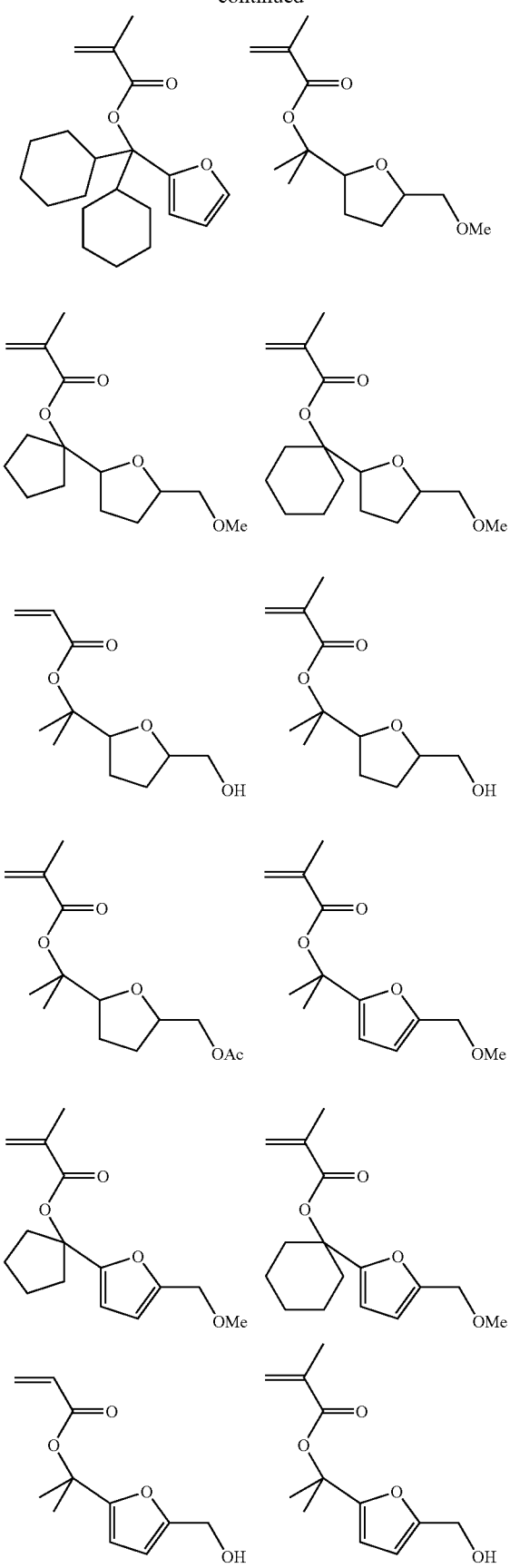

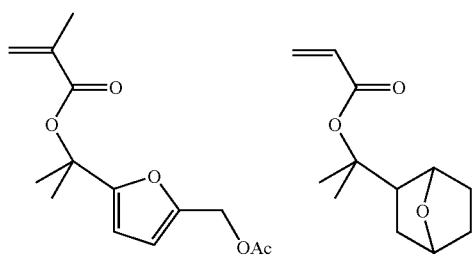
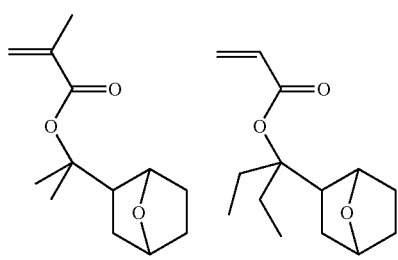
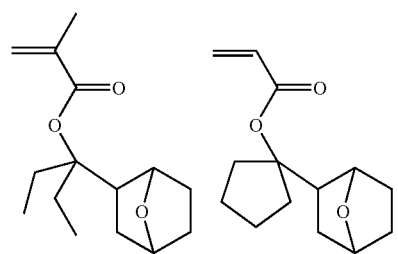
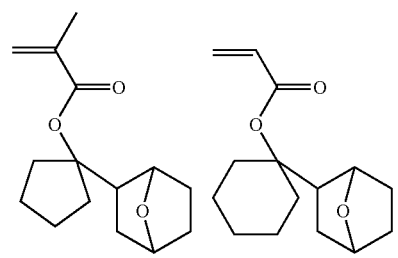
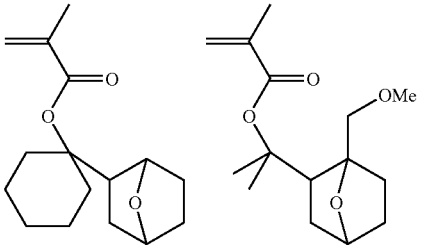
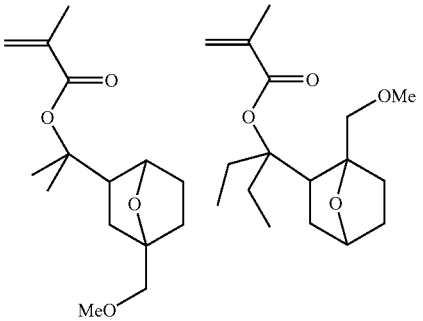
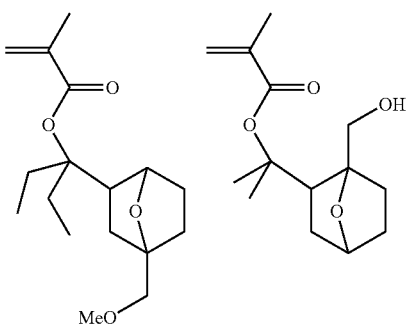
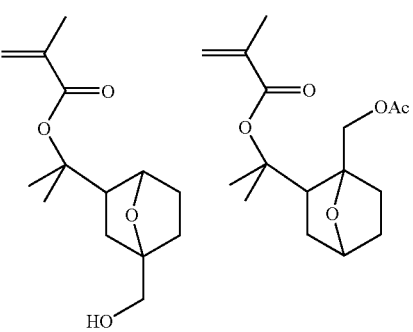
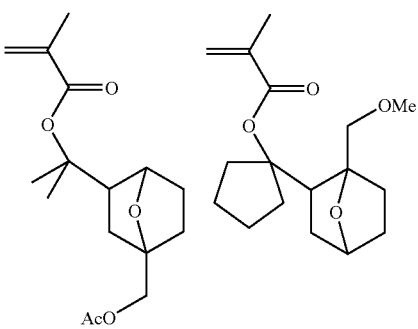
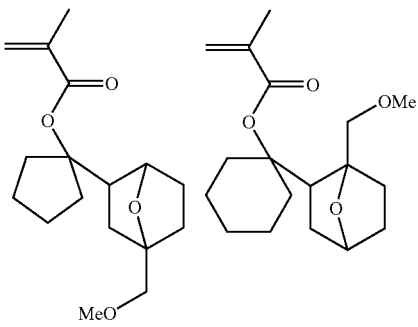
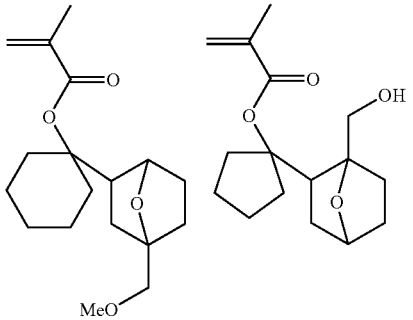

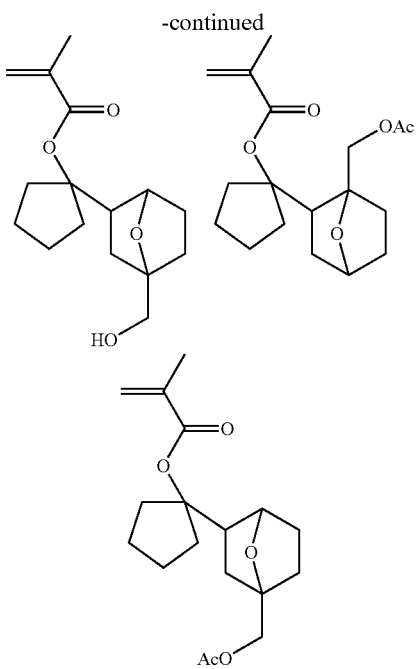

The polymer used herein may be synthesized by any desired methods, for example, by dissolving one or more monomers selected from the monomers to form the recurring units (a) to (g) in an organic solvent, adding a radical polymerization initiator thereto, and effecting heat polymerization. Examples of the organic solvent which can be used for polymerization include toluene, benzene, tetrahydrofuran, diethyl ether and dioxane. Examples of the polymerization initiator used herein include 2,2'-azobisisobutyronitrile (AIBN), 2,2'-azobis(2,4-dimethylvaleronitrile), dimethyl 2,2-azobis(2-methylpropionate), benzoyl peroxide, and lauroyl peroxide. Preferably the system is heated at 50 to 80° C. for polymerization to take place. The reaction time is 2 to 100 hours, preferably 5 to 20 hours.

When hydroxystyrene or hydroxyvinylnaphthalene is copolymerized, an alternative method is possible. Specifically, acetoxystyrene or acetoxyvinylnaphthalene is used instead of hydroxystyrene or hydroxyvinylnaphthalene, and after polymerization, the acetoxy group is deprotected by alkaline hydrolysis as mentioned above, for thereby converting the polymer product to polyhydroxystyrene or hydroxypolyvinylnaphthalene. For alkaline hydrolysis, a base such as aqueous ammonia or triethylamine may be used. The reaction temperature is −20° C. to 100° C., preferably 0° C. to 60° C., and the reaction time is 0.2 to 100 hours, preferably 0.5 to 20 hours.

In the copolymer, recurring units (a) to (g) may be incorporated in the following molar fraction:
$0<a<1.0$, preferably $0.05 \leq a \leq 0.8$, and more preferably $0.08 \leq a \leq 0.7$;
$0<b<1.0$, preferably $0.1 \leq b \leq 0.9$, and more preferably $0.15 \leq b \leq 0.8$;
$0 \leq c<1.0$, preferably $0 \leq c \leq 0.9$, and more preferably $0 \leq c \leq 0.8$;
$0 \leq d \leq 0.5$, preferably $0 \leq d \leq 0.4$, and more preferably $0 \leq d \leq 0.3$;
$0 \leq e \leq 0.5$, preferably $0 \leq e \leq 0.4$, and more preferably $0 \leq e \leq 0.3$;
$0 \leq f \leq 0.5$, preferably $0 \leq f \leq 0.4$, and more preferably $0 \leq f \leq 0.3$;
$0 \leq g \leq 0.5$, preferably $0 \leq g \leq 0.4$, and more preferably $0 \leq g \leq 0.3$;
preferably $0.2 \leq a+b+c \leq 1.0$, more preferably $0.3 \leq a+b+c \leq 1.0$; and $a+b+c+d+e+f+g=1$.

The meaning of $a+b+c=1$, for example, is that in a polymer comprising recurring units (a), (b), and (c), the sum of recurring units (a), (b), and (c) is 100 mol % based on the total amount of entire recurring units. The meaning of $a+b+c<1$ is that the sum of recurring units (a), (b), and (c) is less than 100 mol % based on the total amount of entire recurring units, indicating the inclusion of other recurring units.

The polymer serving as the base resin in the resist composition should preferably have a weight average molecular weight (Mw) in the range of 1,000 to 500,000, and more preferably 2,000 to 30,000, as measured by gel permeation chromatography (GPC) using polystyrene standards. With too low a Mw, the resist composition may become less heat resistant. A polymer with too high a Mw may lose alkaline solubility and give rise to a footing phenomenon after pattern formation.

If a polymer has a wide molecular weight distribution or dispersity (Mw/Mn), which indicates the presence of lower and higher molecular weight polymer fractions, there is a possibility that foreign matter is left on the pattern or the pattern profile is degraded. The influences of molecular weight and dispersity become stronger as the pattern rule becomes finer. Therefore, the multi-component copolymer should preferably have a narrow dispersity (Mw/Mn) of 1.0 to 2.0, especially 1.0 to 1.5, in order to provide a resist composition suitable for micropatterning to a small feature size.

It is understood that a blend of two or more polymers which differ in compositional ratio, molecular weight or dispersity is acceptable.

The polymer is advantageously used as a base resin in a positive resist composition, typically chemically amplified positive resist composition. Specifically, the polymer is used as a base resin and combined with any desired components including an organic solvent, acid generator, dissolution regulator, basic compound, and surfactant to formulate a positive resist composition. This positive resist composition has a very high sensitivity in that the dissolution rate in developer of the polymer in exposed areas is accelerated by catalytic reaction. In addition, the resist film has a high dissolution contrast, resolution, exposure latitude, and process adaptability, and provides a good pattern profile after exposure, yet better etching resistance, and minimal proximity bias because of restrained acid diffusion. By virtue of these advantages, the composition is fully useful in commercial application and suited as a pattern-forming material for the fabrication of VLSIs or photomasks. Particularly when an acid generator is incorporated to formulate a chemically amplified positive resist composition capable of utilizing acid catalyzed reaction, the composition has a higher sensitivity and is further improved in the properties described above.

The positive resist composition may further comprise an organic solvent, basic compound, dissolution regulator, surfactant, and acetylene alcohol, alone or in combination.

Inclusion of a dissolution regulator may lead to an increased difference in dissolution rate between exposed and unexposed areas and a further improvement in resolution. Addition of a basic compound may be effective in suppressing the diffusion rate of acid in the resist film, achieving a further improvement in resolution. Addition of a surfactant may improve or control the coating characteristics of the resist composition.

The positive resist composition may include an acid generator in order for the composition to function as a chemically amplified positive resist composition. Typical of the acid generator used herein is a photoacid generator (PAG) capable of generating an acid in response to actinic light or radiation. It is any compound capable of generating an acid upon exposure to high-energy radiation. Suitable photoacid generators include sulfonium salts, iodonium salts, sulfonyldiazomethane, N-sulfonyloxyimide, and oxime-O-sulfonate acid generators. The acid generators may be used alone or in admixture of two or more. Exemplary acid generators are described in U.S. Pat. No. 7,537,880 (JP-A 2008-111103, paragraphs [0122] to [0142]).

Examples of the organic solvent used herein are described in JP-A 2008-111103, paragraphs [0144] to [0145] (U.S. Pat. No. 7,537,880), exemplary basic compounds in paragraphs [0146] to [0164], and exemplary surfactants in paragraphs [0165] to [0166]. Exemplary dissolution regulators are described in JP-A 2008-122932 (US 2008090172), paragraphs [0155] to [0178], and exemplary acetylene alcohols in paragraphs [0179] to [0182]. Also useful are quenchers of polymer type as described in JP-A 2008-239918. The polymeric quencher segregates at the resist surface after coating and thus enhances the rectangularity of resist pattern. When a protective film is applied as is often the case in the immersion lithography, the polymeric quencher is also effective for preventing slimming of resist pattern or rounding of pattern top.

An appropriate amount of the acid generator used is 0.01 to 100 parts, and preferably 0.1 to 80 parts. An appropriate amount of the organic solvent used is 50 to 10,000 parts, especially 100 to 5,000 parts. The dissolution regulator may be blended in an amount of 0 to 50 parts, preferably 0 to 40 parts, the basic compound in an amount of 0 to 100 parts, preferably 0.001 to 50 parts, and the surfactant in an amount of 0 to 10 parts, preferably 0.0001 to 5 parts. All amounts are expressed in parts by weight relative to 100 parts by weight of the base resin.

Process

The positive resist composition, typically chemically amplified positive resist composition comprising a polymer having acid labile groups of formula (1), an acid generator, and a basic compound in an organic solvent is used in the fabrication of various integrated circuits. Pattern formation using the resist composition may be performed by well-known lithography processes. The process generally involves coating, heat treatment (or prebaking), exposure, heat treatment (post-exposure baking, PEB), and development. If necessary, any additional steps may be added.

The positive resist composition is first applied onto a substrate on which an integrated circuit is to be formed (e.g., Si, $SiO_2$, SiN, SiON, TiN, WSi, BPSG, SOG, or organic antireflective coating) or a substrate on which a mask circuit is to be formed (e.g., Cr, CrO, CrON, MoSi, or $SiO_2$) by a suitable coating technique such as spin coating, roll coating, flow coating, dip coating, spray coating or doctor coating. The coating is prebaked on a hot plate at a temperature of 60 to 150° C. for 10 seconds to 30 minutes, preferably 80 to 120° C. for 30 seconds to 20 minutes. The resulting resist film is generally 0.1 to 2.0 μm thick.

The resist film is then exposed to a desired pattern of high-energy radiation such as UV, deep-UV, electron beam, x-ray, excimer laser light, γ-ray, synchrotron radiation or vacuum UV (soft x-ray), directly or through a mask. The exposure dose is preferably about 1 to 200 $mJ/cm^2$, more preferably about 10 to 100 $mJ/cm^2$, or 0.1 to 100 $\mu C/cm^2$, more preferably 0.5 to 50 $\mu C/cm^2$. The resist film is further baked on a hot plate at 60 to 150° C. for 10 seconds to 30 minutes, preferably 80 to 120° C. for 30 seconds to 20 minutes (post-exposure baking=PEB).

Thereafter the resist film is developed with a developer in the form of an aqueous base solution for 3 seconds to 3 minutes, preferably 5 seconds to 2 minutes by conventional techniques such as dip, puddle or spray techniques. Suitable developers are 0.1 to 10 wt %, preferably 2 to 10 wt %, more preferably 2 to 5 wt % aqueous solutions of tetramethylammonium hydroxide (TMAH), tetraethylammonium hydroxide (TEAH), tetrapropylammonium hydroxide (TPAH) and tetrabutylammonium hydroxide (TBAH). The resist film in the exposed area is dissolved in the developer whereas the resist film in the unexposed area is not dissolved. In this way, the desired positive pattern is formed on the substrate. It is appreciated that the resist composition of the invention is best suited for micro-patterning using such high-energy radiation as EB, vacuum UV (soft x-ray), x-ray, γ-ray and synchrotron radiation among others.

Although TMAH aqueous solution is generally used as the developer, TEAH, TPAH and TBAH having a longer alkyl chain are effective in inhibiting the resist film from being swollen during development and thus preventing pattern collapse. The TMAH developer is most often used as 2.38 wt % aqueous solution, which corresponds to 0.26N. The TEAH, TPAH, and TBAH aqueous solutions should preferably have an equivalent normality. The concentration of TEAH, TPAH, and TBAH that corresponds to 0.26N is 3.84 wt %, 5.31 wt %, and 6.78 wt %, respectively.

EXAMPLE

Synthesis Examples, Comparative Synthesis Examples, Examples and Comparative Examples are given below for further illustrating the invention, but they should not be construed as limiting the invention thereto. Mw is a weight average molecular weight as measured by gel permeation chromatography (GPC) versus polystyrene standards, and Mw/Mn designates molecular weight distribution or dispersity. All parts (pbw and ppm) are by weight.

Monomer Synthesis

Polymerizable acid-labile compounds within the scope of the invention were synthesized as follows.

Monomer Synthesis Example 1

Synthesis of 9-fluorenyl methacrylate (Monomer 1)

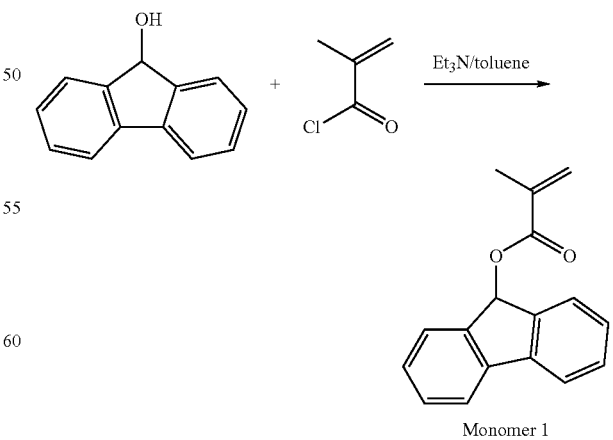

Monomer 1

With stirring and ice cooling, 111 g of triethylamine was added to a mixture of 120 g of methacrylic acid chloride, 182 g of 9-hydroxyfluorene, and 1500 g of toluene. The mixture was stirred at room temperature for 16 hours. By standard aqueous work-up and solvent distillation, a crude product was obtained. It was purified by column chromatography, yielding the target compound, 9-fluorenyl methacrylate.

By the same procedure, Monomers 2 to 10 were synthesized.

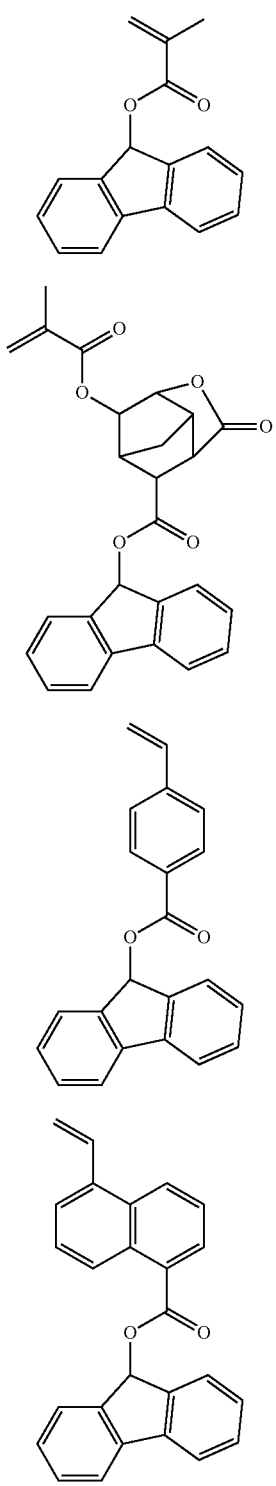

Monomer 1

Monomer 2

Monomer 3

Monomer 4

-continued

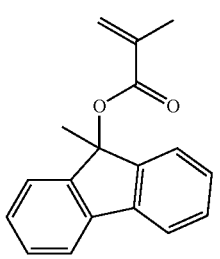

Monomer 5

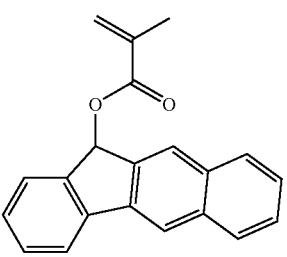

Monomer 6

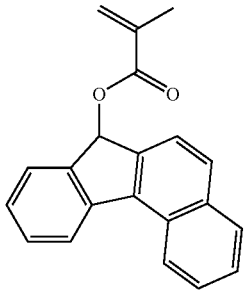

Monomer 7

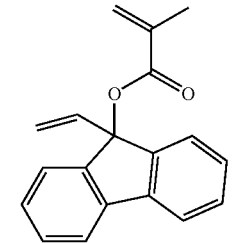

Monomer 8

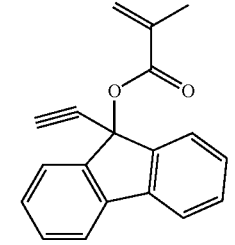

Monomer 9

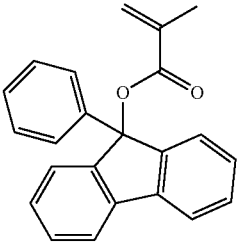

Monomer 10

Monomer 1: 9-fluorenyl methacrylate
Monomer 2: 7-(9-fluorenyloxycarbonyl)-2-oxohexahydro-3,5-methano-2H-cyclopenta[b]furan-6-yl methacrylate Monomer 3: 9-fluorenyl 4-vinylbenzoate
Monomer 4: 9-fluorenyl 5-vinylnaphthalenecarboxylate
Monomer 5: 9-methyl-9-fluorenyl methacrylate
Monomer 6: 2,3-benzofluoren-9-yl methacrylate
Monomer 7: 3,4-benzofluoren-9-yl methacrylate
Monomer 8: 9-vinyl-9-fluorenyl methacrylate
Monomer 9: 9-ethynyl-9-fluorenyl methacrylate
Monomer 10: 9-phenyl-9-fluorenyl methacrylate Synthesis Examples below used PAG monomers 1 to 3 shown below.

PAG monomer 1

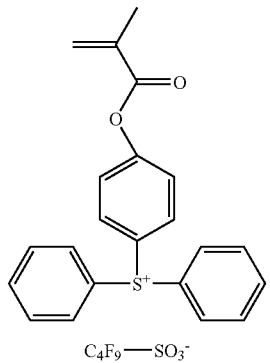

PAG monomer 2

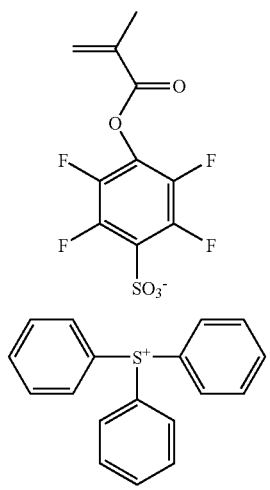

PAG monomer 3

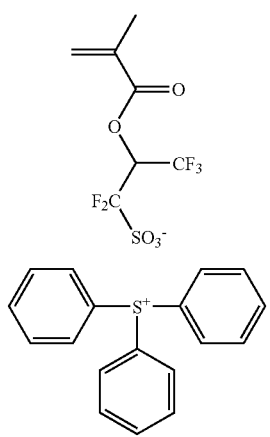

PAG monomer 1: 4-methacrylic acid-oxyphenyldiphenylsulfonium perfluorobutanesulfonate
PAG monomer 2: triphenylsulfonium 2,3,5,6-tetrafluoro-4-methacryloyloxybenzenesulfonate
PAG monomer 3: triphenylsulfonium 1,1,3,3,3-pentafluoro-2-methacryloyloxypropane-1-sulfonate Polymer Synthesis Polymer Synthesis Example 1

A 2-L flask was charged with 6.0 g of Monomer 1, 12.3 g of 4-acetoxystyrene, and 40 g of tetrahydrofuran as solvent. The reactor was cooled to −70° C. in a nitrogen atmosphere whereupon vacuum evacuation and nitrogen blow were repeated three times. The reactor warmed up to room temperature whereupon 1.2 g of azobisisobutyronitrile (AIBN) was added as a polymerization initiator. The reactor was heated at 60° C. and reaction run for 15 hours. The reaction solution was precipitated from 1 L of isopropyl alcohol. The white solid was collected by filtration and dissolved again in 100 mL of methanol and 200 mL of tetrahydrofuran, to which 10 g of triethylamine and 10 g of water were added. Deprotection reaction of acetyl group was conducted at 70° C. for 5 hours, followed by neutralization with acetic acid. The reaction solution was concentrated and dissolved in 100 mL of acetone. By similar precipitation, filtration, and drying at 60° C., a white polymer was obtained.

The polymer was analyzed by $^{13}$C-NMR, $^{1}$H-NMR, and GPC, with the analytical data shown below.
Copolymer Composition (Molar Ratio)
Monomer 1:4-hydroxystyrene=0.24:0.76
Mw=8,600
Mw/Mn=2.09
This is designated Polymer 1.

Polymer 1

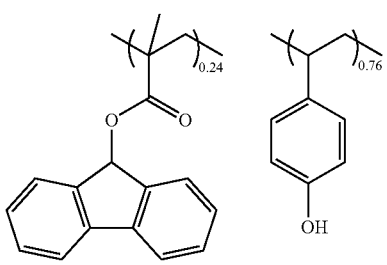

Polymer Synthesis Example 2

A 2-L flask was charged with 7.0 g of Monomer 1, 12.8 g of 3-hydroxyphenyl methacrylate, and 40 g of tetrahydrofuran as solvent. The reactor was cooled to −70° C. in a nitrogen atmosphere whereupon vacuum evacuation and nitrogen blow were repeated three times. The reactor warmed up to room temperature whereupon 1.2 g of AIBN was added as a polymerization initiator. The reactor was heated at 60° C. and reaction run for 15 hours. The reaction solution was precipitated from 1 L of isopropyl alcohol. The white solid was collected by filtration and vacuum dried at 60° C., obtaining a white polymer.

The polymer was analyzed by $^{13}$C-NMR, $^{1}$H-NMR, and GPC, with the analytical data shown below.
Copolymer Composition (Molar Ratio)
Monomer 1:3-hydroxyphenyl methacrylate=0.28:0.72
Mw=8,800
Mw/Mn=2.03
This is designated Polymer 2.

Polymer 2

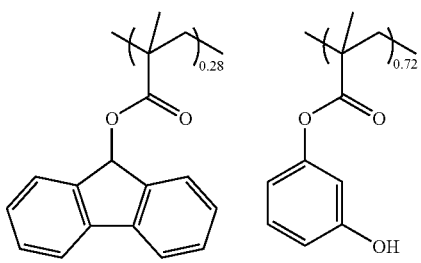

Polymer Synthesis Example 3

A 2-L flask was charged with 7.0 g of Monomer 1, 15.7 g of 5-hydroxyindan-2-yl methacrylate, and 40 g of tetrahydrofuran as solvent. The reactor was cooled to −70° C. in a nitrogen atmosphere whereupon vacuum evacuation and nitrogen blow were repeated three times. The reactor warmed up to room temperature whereupon 1.2 g of AIBN was added as a polymerization initiator. The reactor was heated at 60° C. and reaction run for 15 hours. The reaction solution was precipitated from 1 L of isopropyl alcohol. The white solid was collected by filtration and vacuum dried at 60° C., obtaining a white polymer.

The polymer was analyzed by $^{13}$C-NMR, $^1$H-NMR, and GPC, with the analytical data shown below.

Copolymer Composition (Molar Ratio)

Monomer 1:5-hydroxyindan-2-yl methacrylate=0.28:0.72

Mw=8,600

Mw/Mn=1.92

This is designated Polymer 3.

Polymer 3

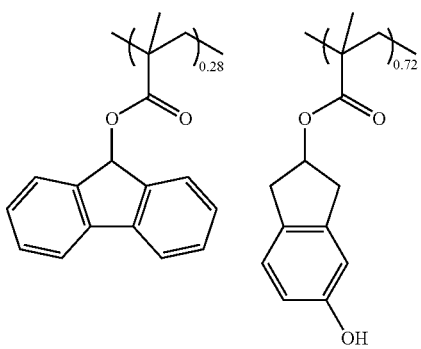

Polymer Synthesis Example 4

A 2-L flask was charged with 7.5 g of Monomer 1, 8.7 g of 5-hydroxyindan-2-yl methacrylate, 6.7 g of 3-oxo-2,7-dioxatricyclo[4.2.1.0$^{4,8}$]nonan-9-yl methacrylate, and 40 g of tetrahydrofuran as solvent. The reactor was cooled to −70° C. in a nitrogen atmosphere whereupon vacuum evacuation and nitrogen blow were repeated three times. The reactor warmed up to room temperature whereupon 1.2 g of AIBN was added as a polymerization initiator. The reactor was heated at 60° C. and reaction run for 15 hours. The reaction solution was precipitated from 1 L of isopropyl alcohol. The white solid was collected by filtration and vacuum dried at 60° C., obtaining a white polymer.

The polymer was analyzed by $^{13}$C-NMR, $^1$H-NMR, and GPC, with the analytical data shown below.

Copolymer Composition (Molar Ratio)

Monomer 1:5-hydroxyindan-2-yl methacrylate:3-oxo-2,7-dioxatricyclo[4.2.1.0$^{4,8}$]nonan-9-yl methacrylate=0.30:0.40:0.30

Mw=8,900

Mw/Mn=1.93

This is designated Polymer 4.

Polymer 4

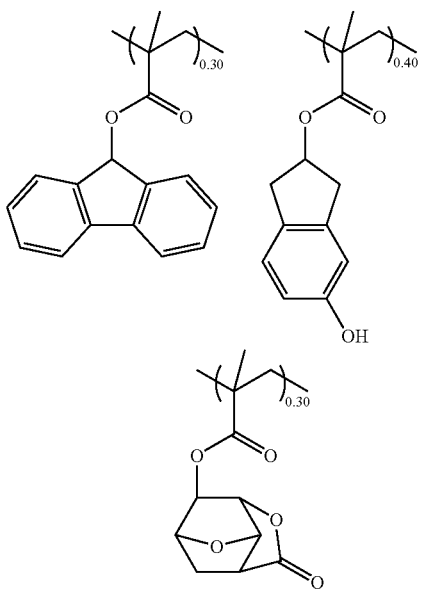

Polymer Synthesis Example 5

A 2-L flask was charged with 5.8 g of Monomer 1, 1.7 g of indene, 10.8 g of 4-acetoxystyrene, and 40 g of tetrahydrofuran as solvent. The reactor was cooled to −70° C. in a nitrogen atmosphere, whereupon vacuum evacuation and nitrogen blow were repeated three times. The reactor warmed up to room temperature whereupon 1.2 g of AIBN was added as a polymerization initiator. The reactor was heated at 60° C. and reaction run for 15 hours. The reaction solution was precipitated from 1 L of isopropyl alcohol. The white solid was collected by filtration and dissolved again in 100 mL of methanol and 200 mL of tetrahydrofuran, to which 10 g of triethylamine and 10 g of water were added. Deprotection reaction of acetyl group was conducted at 70° C. for 5 hours, followed by neutralization with acetic acid. The reaction solution was concentrated and dissolved in 100 mL of acetone. By similar precipitation, filtration, and drying at 60° C., a white polymer was obtained.

The polymer was analyzed by $^{13}$C-NMR, $^1$H-NMR, and GPC, with the analytical data shown below.

Copolymer Composition (Molar Ratio)

Monomer 1:indene:4-hydroxystyrene=0.26:0.10:0.64

Mw=8,600

Mw/Mn=1.74

This is designated Polymer 5.

Polymer 5

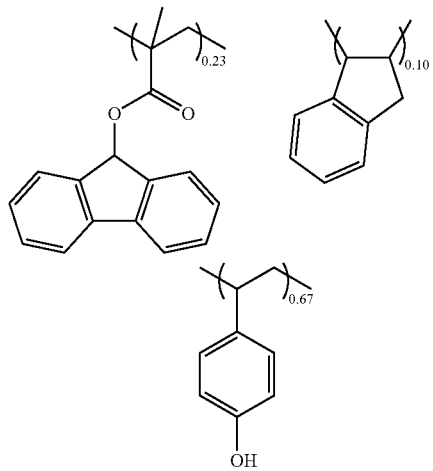

Polymer Synthesis Example 6

A 2-L flask was charged with 7.0 g of Monomer 1, 5.3 g of 4-hydroxyphenyl methacrylate, 6.8 g of 4-acetoxystyrene, and 40 g of tetrahydrofuran as solvent. The reactor was cooled to −70° C. in a nitrogen atmosphere, whereupon vacuum evacuation and nitrogen blow were repeated three times. The reactor warmed up to room temperature whereupon 1.2 g of AIBN was added as a polymerization initiator. The reactor was heated at 60° C. and reaction run for 15 hours. The reaction solution was precipitated from 1 L of isopropyl alcohol. The white solid was collected by filtration and dissolved again in 100 mL of methanol and 200 mL of tetrahydrofuran, to which 10 g of triethylamine and 10 g of water were added. Deprotection reaction of acetyl group was conducted at 70° C. for 5 hours, followed by neutralization with acetic acid. The reaction solution was concentrated and dissolved in 100 mL of acetone. By similar precipitation, filtration, and drying at 60° C., a white polymer was obtained.

The polymer was analyzed by $^{13}$C-NMR, $^{1}$H-NMR, and GPC, with the analytical data shown below.

Copolymer Composition (Molar Ratio)

Monomer 1:4-hydroxyphenyl methacrylate:4-hydroxystyrene=0.28:0.30:0.42

Mw=8,300

Mw/Mn=1.91

This is designated Polymer 6.

Polymer 6

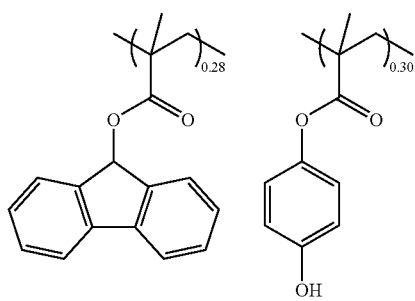

-continued

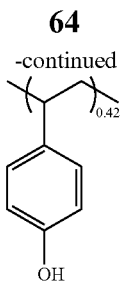

Polymer Synthesis Example 7

A 2-L flask was charged with 6.5 g of Monomer 1, 6.8 g of 1-hydroxynaphthalen-5-yl methacrylate, 7.5 g of tetrahydro-2-oxofuran-3-yl methacrylate, and 40 g of tetrahydrofuran as solvent. The reactor was cooled to −70° C. in a nitrogen atmosphere, whereupon vacuum evacuation and nitrogen blow were repeated three times. The reactor warmed up to room temperature whereupon 1.2 g of AIBN was added as a polymerization initiator. The reactor was heated at 60° C. and reaction run for 15 hours. The reaction solution was precipitated from 1 L of isopropyl alcohol. The white solid was collected by filtration and vacuum dried at 60° C., obtaining a white polymer.

The polymer was analyzed by $^{13}$C-NMR, $^{1}$H-NMR, and GPC, with the analytical data shown below.

Copolymer Composition (Molar Ratio)

Monomer 1:1-hydroxynaphthalen-5-yl methacrylate:tetrahydro-2-oxofuran-3-yl methacrylate=0.26:0.30:0.44

Mw=7,600

Mw/Mn=1.89

This is designated Polymer 7.

Polymer 7

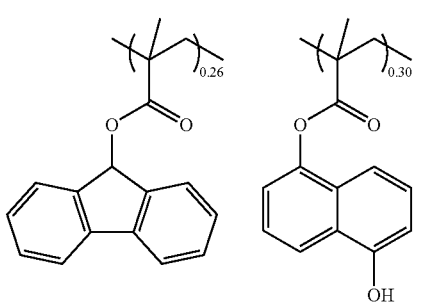

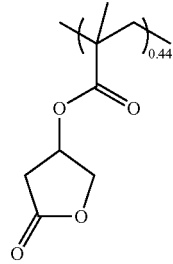

Polymer Synthesis Example 8

A 2-L flask was charged with 5.8 g of Monomer 1, 10.7 g of 4-acetoxystyrene, 1.7 g of acenaphthylene, and 20 g of tetrahydrofuran as solvent. The reactor was cooled to −70° C. in a nitrogen atmosphere, whereupon vacuum evacuation and nitrogen blow were repeated three times. The reactor warmed up to room temperature whereupon 1.2 g of AIBN was added as a polymerization initiator. The reactor was heated at 60° C. and reaction run for 15 hours. The reaction solution was precipitated from 1 L of isopropyl alcohol. The white solid was collected by filtration and dissolved again in 100 mL of methanol and 200 mL of tetrahydrofuran, to which 10 g of triethylamine and 10 g of water were added. Deprotection reaction of acetyl group was conducted at 70° C. for 5 hours, followed by neutralization with acetic acid. The reaction solution was concentrated and dissolved in 100 mL of acetone. By similar precipitation, filtration, and drying at 60° C., a white polymer was obtained.

The polymer was analyzed by $^{13}$C-NMR, $^1$H-NMR, and GPC, with the analytical data shown below.

Copolymer Composition (Molar Ratio)

Monomer 1:4-hydroxystyrene:acenaphthylene=0.23:0.67:0.10

Mw=5,800

Mw/Mn=1.77

This is designated Polymer 8.

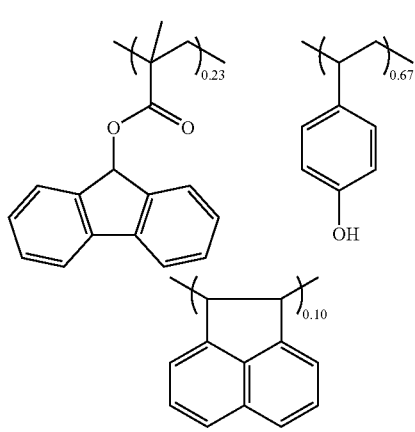

Polymer 8

Polymer Synthesis Example 9

A 2-L flask was charged with 6.0 g of Monomer 1, 2.0 g of 7-acetoxyindene, 10.6 g of 4-acetoxystyrene, and 40 g of tetrahydrofuran as solvent. The reactor was cooled to −70° C. in a nitrogen atmosphere, whereupon vacuum evacuation and nitrogen blow were repeated three times. The reactor warmed up to room temperature whereupon 1.2 g of AIBN was added as a polymerization initiator. The reactor was heated at 60° C. and reaction run for 15 hours. The reaction solution was precipitated from 1 L of isopropyl alcohol. The white solid was collected by filtration and dissolved again in 100 mL of methanol and 200 mL of tetrahydrofuran, to which 10 g of triethylamine and 10 g of water were added. Deprotection reaction of acetyl group was conducted at 70° C. for 5 hours, followed by neutralization with acetic acid. The reaction solution was concentrated and dissolved in 100 mL of acetone. By similar precipitation, filtration, and drying at 60° C., a white polymer was obtained.

The polymer was analyzed by $^{13}$C-NMR, $^1$H-NMR, and GPC, with the analytical data shown below.

Copolymer Composition (Molar Ratio)

Monomer 1:7-hydroxyindene:4-hydroxystyrene=0.24:0.10:0.66

Mw=6,900

Mw/Mn=1.82

This is designated Polymer 9.

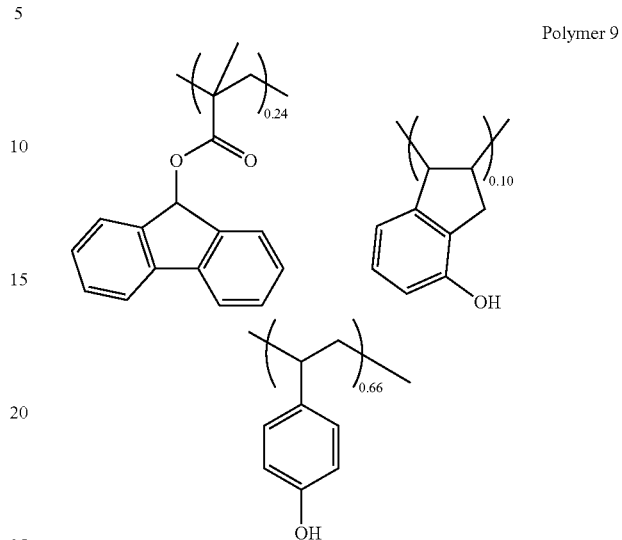

Polymer 9

Polymer Synthesis Example 10

A 2-L flask was charged with 5.8 g of Monomer 1, 8.3 g of 4-acetoxystyrene, 2.7 g of 6-hydroxycoumarin, 1.5 g of coumarin, and 20 g of tetrahydrofuran as solvent. The reactor was cooled to −70° C. in a nitrogen atmosphere, whereupon vacuum evacuation and nitrogen blow were repeated three times. The reactor warmed up to room temperature whereupon 1.2 g of AIBN was added as a polymerization initiator. The reactor was heated at 60° C. and reaction run for 15 hours. The reaction solution was precipitated from 1 L of isopropyl alcohol. The white solid was collected by filtration and dissolved again in 100 mL of methanol and 200 mL of tetrahydrofuran, to which 10 g of triethylamine and 10 g of water were added. Deprotection reaction of acetyl group was conducted at 70° C. for 5 hours, followed by neutralization with acetic acid. The reaction solution was concentrated and dissolved in 100 mL of acetone. By similar precipitation, filtration, and drying at 60° C., a white polymer was obtained.

The polymer was analyzed by $^{13}$C-NMR, $^1$H-NMR, and GPC, with the analytical data shown below.

Copolymer Composition (Molar Ratio)

Monomer 1:4-hydroxystyrene:6-hydroxycoumarin:coumarin=0.23:0.52:0.15:0.10

Mw=6,600

Mw/Mn=1.86

This is designated Polymer 10.

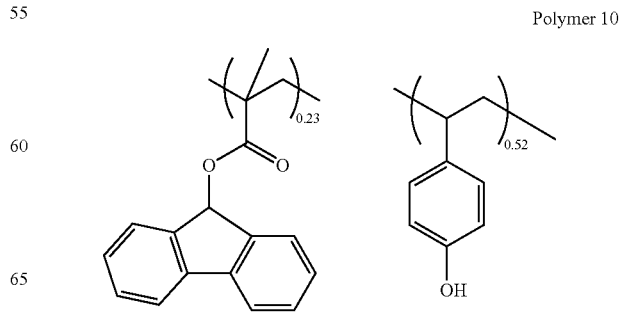

Polymer 10

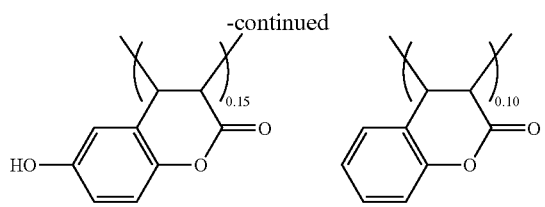

Polymer Synthesis Example 11

A 2-L flask was charged with 5.8 g of Monomer 1, 15.5 g of 5-hydroxy-1,2,3,4-tetrahydronaphthalen-2-yl methacrylate, 1.6 g of chromone, and 20 g of tetrahydrofuran as solvent. The reactor was cooled to −70° C. in a nitrogen atmosphere, whereupon vacuum evacuation and nitrogen blow were repeated three times. The reactor warmed up to room temperature whereupon 1.2 g of AIBN was added as a polymerization initiator. The reactor was heated at 60° C. and reaction run for 15 hours. The reaction solution was precipitated from 1 L of isopropyl alcohol. The white solid was collected by filtration and vacuum dried at 60° C., obtaining a white polymer.

The polymer was analyzed by $^{13}$C-NMR, $^1$H-NMR, and GPC, with the analytical data shown below.

Copolymer Composition (Molar Ratio)

Monomer 1:5-hydroxy-1,2,3,4-tetrahydronaphthalen-2-yl methacrylate:chromone=0.23:0.67:0.10

Mw=6,500

Mw/Mn=1.82

This is designated Polymer 11.

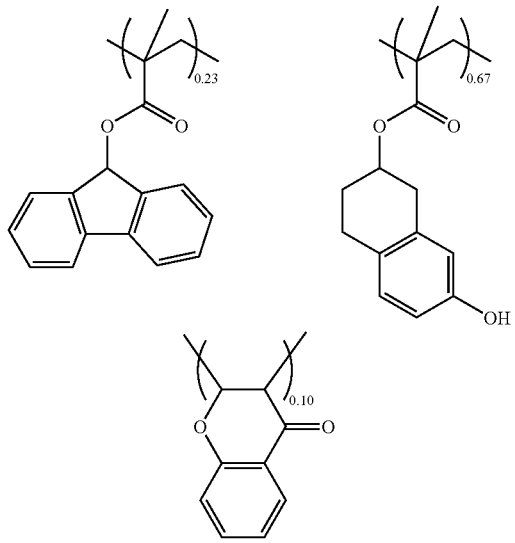

Polymer 11

Polymer Synthesis Example 12

A 2-L flask was charged with 7.2 g of Monomer 3, 10.7 g of 4-acetoxystyrene, 1.6 g of chromone, and 20 g of tetrahydrofuran as solvent. The reactor was cooled to −70° C. in a nitrogen atmosphere, whereupon vacuum evacuation and nitrogen blow were repeated three times. The reactor warmed up to room temperature whereupon 1.2 g of AIBN was added as a polymerization initiator. The reactor was heated at 60° C. and reaction run for 15 hours. The reaction solution was precipitated from 1 L of isopropyl alcohol. The white solid was collected by filtration and dissolved again in 100 mL of methanol and 200 mL of tetrahydrofuran, to which 10 g of triethylamine and 10 g of water were added. Deprotection reaction of acetyl group was conducted at 70° C. for 5 hours, followed by neutralization with acetic acid. The reaction solution was concentrated and dissolved in 100 mL of acetone. By similar precipitation, filtration, and drying at 60° C., a white polymer was obtained.

The polymer was analyzed by $^{13}$C-NMR, $^1$H-NMR, and GPC, with the analytical data shown below.

Copolymer Composition (Molar Ratio)

Monomer 3:4-hydroxystyrene:chromone=0.23:0.67:0.10

Mw=6,900

Mw/Mn=1.79

This is designated Polymer 12.

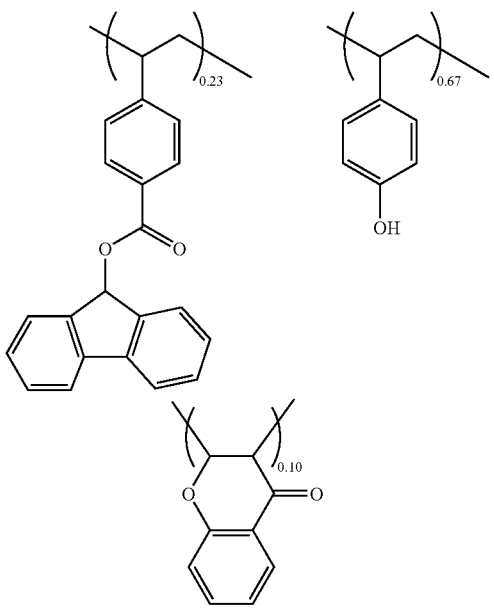

Polymer 12

Polymer Synthesis Example 13

A 2-L flask was charged with 8.3 g of Monomer 4, 10.4 g of 4-acetoxystyrene, 1.8 g of coumarin, and 20 g of tetrahydrofuran as solvent. The reactor was cooled to −70° C. in a nitrogen atmosphere, whereupon vacuum evacuation and nitrogen blow were repeated three times. The reactor warmed up to room temperature whereupon 1.2 g of AIBN was added as a polymerization initiator. The reactor was heated at 60° C. and reaction run for 15 hours. The reaction solution was precipitated from 1 L of isopropyl alcohol. The white solid was collected by filtration and dissolved again in 100 mL of methanol and 200 mL of tetrahydrofuran, to which 10 g of triethylamine and 10 g of water were added. Deprotection reaction of acetyl group was conducted at 70° C. for 5 hours, followed by neutralization with acetic acid. The reaction solution was concentrated and dissolved in 100 mL of acetone. By similar precipitation, filtration, and drying at 60° C., a white polymer was obtained.

The polymer was analyzed by $^{13}$C-NMR, $^{1}$H-NMR, and GPC, with the analytical data shown below.

Copolymer Composition (Molar Ratio)

Monomer 4:4-hydroxystyrene:coumarin=0.23:0.65:0.12

Mw=6,600

Mw/Mn=1.75

This is designated Polymer 13.

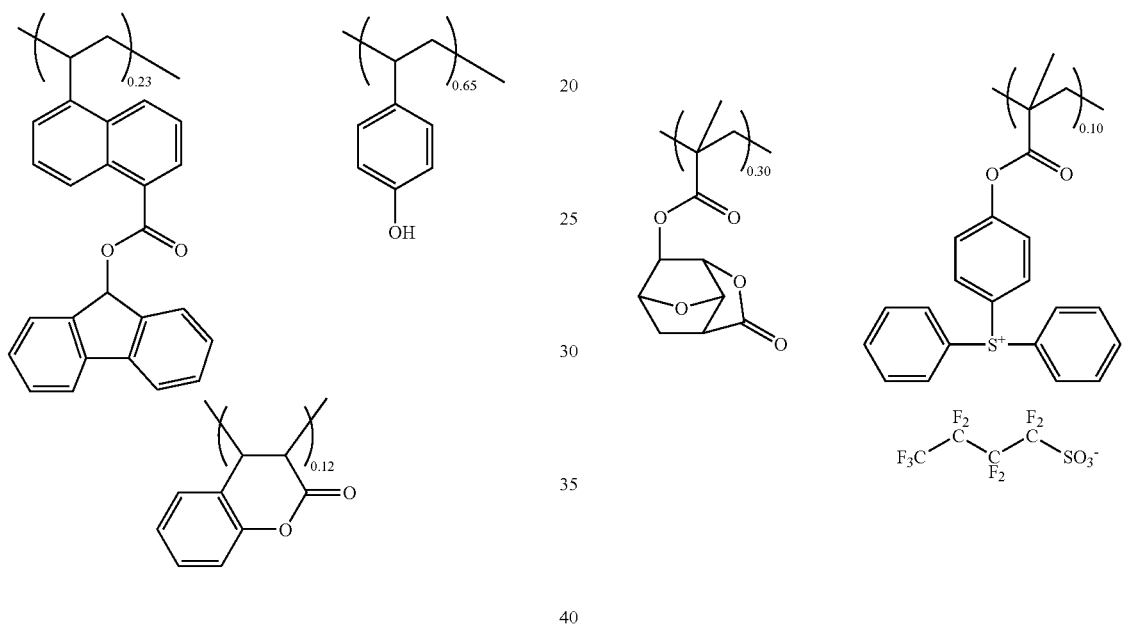

Polymer 13

Polymer 14

Polymer Synthesis Example 14

A 2-L flask was charged with 7.5 g of Monomer 1, 5.3 g of 4-hydroxyphenyl methacrylate, 6.7 g of 3-oxo-2,7-dioxa-tricyclo[4.2.1.0$^{4,8}$]nonan-9-yl methacrylate, 6.5 g of PAG monomer 1, and 40 g of tetrahydrofuran as solvent. The reactor was cooled to −70° C. in a nitrogen atmosphere, whereupon vacuum evacuation and nitrogen blow were repeated three times. The reactor warmed up to room temperature whereupon 1.2 g of AIBN was added as a polymerization initiator. The reactor was heated at 60° C. and reaction run for 15 hours. The reaction solution was precipitated from 1 L of isopropyl alcohol. The white solid was collected by filtration and vacuum dried at 60° C., obtaining a white polymer.

The polymer was analyzed by $^{13}$C-NMR, $^{1}$H-NMR, and GPC, with the analytical data shown below.

Copolymer Composition (Molar Ratio)

Monomer 1:4-hydroxyphenyl methacrylate:3-oxo-2,7-dioxatricyclo[4.2.1.0$^{4,8}$]nonan-9-yl methacrylate:PAG monomer 1=0.30:0.30:0.30:0.10

Mw=8,300

Mw/Mn=1.89

This is designated Polymer 14.

Polymer Synthesis Example 15

A 2-L flask was charged with 7.5 g of Monomer 1, 5.3 g of 4-hydroxyphenyl methacrylate, 6.7 g of 3-oxo-2,7-dioxa-tricyclo[4.2.1.0$^{4,8}$]nonan-9-yl methacrylate, 5.7 g of PAG monomer 2, and 40 g of tetrahydrofuran as solvent. The reactor was cooled to −70° C. in a nitrogen atmosphere, whereupon vacuum evacuation and nitrogen blow were repeated three times. The reactor warmed up to room temperature whereupon 1.2 g of AIBN was added as a polymerization initiator. The reactor was heated at 60° C. and reaction run for 15 hours. The reaction solution was precipitated from 1 L of isopropyl alcohol. The white solid was collected by filtration and vacuum dried at 60° C., obtaining a white polymer.

The polymer was analyzed by $^{13}$C-NMR, $^{1}$H-NMR, and GPC, with the analytical data shown below.

Copolymer Composition (Molar Ratio)

Monomer 1:4-hydroxyphenyl methacrylate:3-oxo-2,7-dioxatricyclo[4.2.1.0$^{4,8}$]nonan-9-yl methacrylate:PAG monomer 2=0.30:0.30:0.30:0.10

Mw=7,900

Mw/Mn=1.93

This is designated Polymer 15.

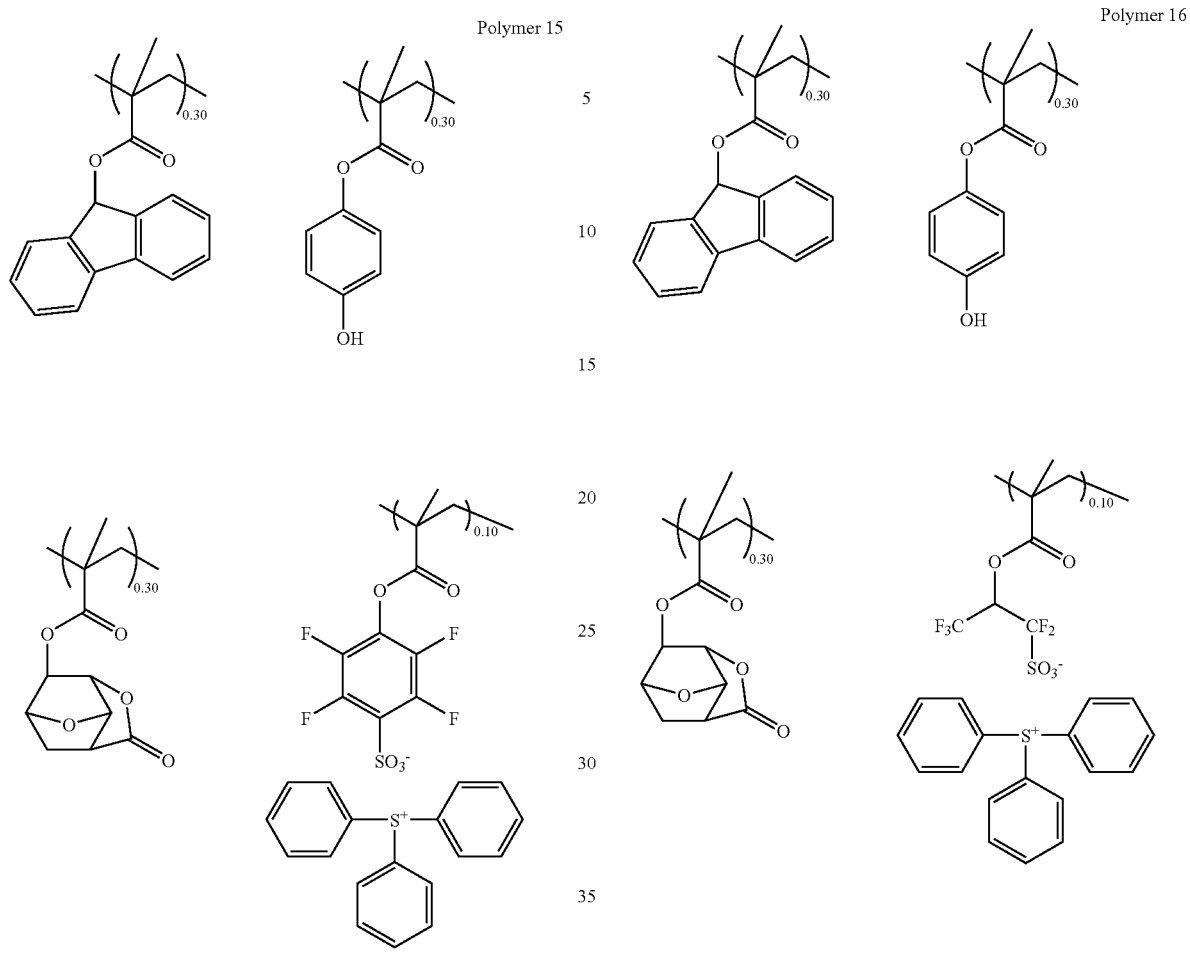

Polymer Synthesis Example 16

A 2-L flask was charged with 7.5 g of Monomer 1, 5.3 g of 4-hydroxyphenyl methacrylate, 6.7 g of 3-oxo-2,7-dioxatricyclo[4.2.1.0$^{4,8}$]nonan-9-yl methacrylate, 5.6 g of PAG monomer 3, and 40 g of tetrahydrofuran as solvent. The reactor was cooled to −70° C. in a nitrogen atmosphere, whereupon vacuum evacuation and nitrogen blow were repeated three times. The reactor warmed up to room temperature whereupon 1.2 g of AIBN was added as a polymerization initiator. The reactor was heated at 60° C. and reaction run for 15 hours. The reaction solution was precipitated from 1 L of isopropyl alcohol. The white solid was collected by filtration and vacuum dried at 60° C., obtaining a white polymer.

The polymer was analyzed by $^{13}$C-NMR, $^1$H-NMR, and GPC, with the analytical data shown below.

Copolymer Composition (Molar Ratio)

Monomer 1:4-hydroxyphenyl methacrylate:3-oxo-2,7-dioxatricyclo[4.2.1.0$^{4,8}$]nonan-9-yl methacrylate:PAG monomer 3=0.30:0.30:0.30:0.10

Mw=7,900

Mw/Mn=2.07

This is designated Polymer 16.

Polymer Synthesis Example 17

A 2-L flask was charged with 3.8 g of Monomer 1, 4.1 g of 3-ethyl-3-exo-tetracyclo[4.4.0.1$^{2,5}$.1$^{7,10}$]dodecanyl methacrylate, 5.3 g of 4-hydroxyphenyl methacrylate, 6.5 g of 2,7-dihydro-2-oxobenzo[C]furan-5-yl methacrylate, 5.6 g of PAG monomer 3, and 40 g of tetrahydrofuran as solvent. The reactor was cooled to −70° C. in a nitrogen atmosphere, whereupon vacuum evacuation and nitrogen blow were repeated three times. The reactor warmed up to room temperature whereupon 1.2 g of AIBN was added as a polymerization initiator. The reactor was heated at 60° C. and reaction run for 15 hours. The reaction solution was precipitated from 1 L of isopropyl alcohol. The white solid was collected by filtration and vacuum dried at 60° C., obtaining a white polymer.

The polymer was analyzed by $^{13}$C-NMR, $^1$H-NMR, and GPC, with the analytical data shown below.

Copolymer Composition (Molar Ratio)

Monomer 1:3-ethyl-3-exo-tetracyclo[4.4.0.1$^{2,5}$.1$^{7,10}$]dodecanyl methacrylate:4-hydroxyphenyl methacrylate:2,7-dihydro-2-oxobenzo[C]furan-5-yl methacrylate:PAG monomer 3=0.15:0.15:0.30:0.30:0.10

Mw=7,300

Mw/Mn=1.76

This is designated Polymer 17.

Polymer 17

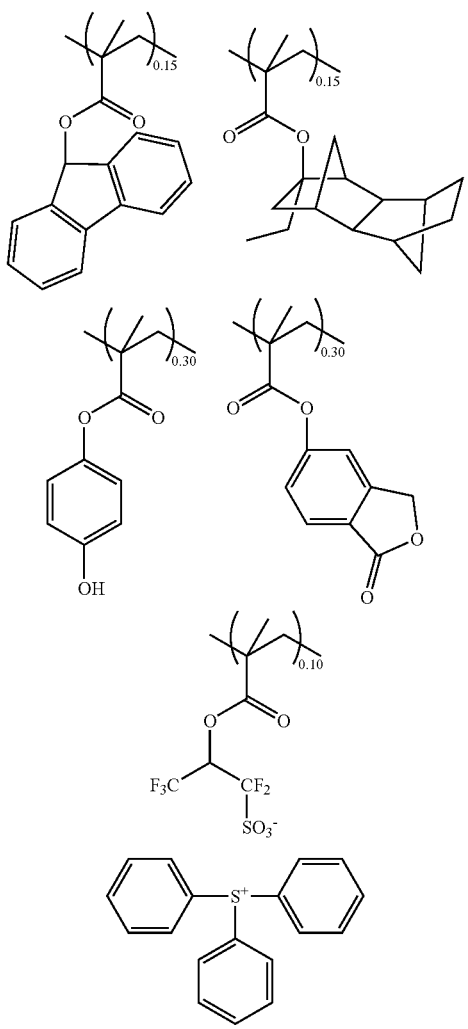

Polymer Synthesis Example 18

A 2-L flask was charged with 7.5 g of Monomer 1, 6.4 g of 6-acetoxy-2-vinylnaphthalene, 6.7 g of 3-oxo-2,7-dioxatricyclo[4.2.1.0$^{4,8}$]nonan-9-yl methacrylate, 5.6 g of PAG monomer 3, and 40 g of tetrahydrofuran as solvent. The reactor was cooled to −70° C. in a nitrogen atmosphere, whereupon vacuum evacuation and nitrogen blow were repeated three times. The reactor warmed up to room temperature whereupon 1.2 g of AIBN was added as a polymerization initiator. The reactor was heated at 60° C. and reaction run for 15 hours. The reaction solution was precipitated from 1 L of isopropyl alcohol. The white solid was collected by filtration and dissolved again in 100 mL of methanol and 200 mL of tetrahydrofuran, to which 10 g of triethylamine and 10 g of water were added. Deprotection reaction of acetyl group was conducted at 70° C. for 5 hours, followed by neutralization with acetic acid. The reaction solution was concentrated and dissolved in 100 mL of acetone. By similar precipitation, filtration, and drying at 60° C., a white polymer was obtained.

The polymer was analyzed by $^{13}$C-NMR, $^1$H-NMR, and GPC, with the analytical data shown below.

Copolymer Composition (Molar Ratio)

Monomer 1:6-hydroxy-2-vinylnaphthalene:3-oxo-2,7-dioxatricyclo[4.2.1.0$^{4,8}$]nonan-9-yl methacrylate:PAG monomer 3=0.30:0.30:0.30:0.10

Mw=8,600

Mw/Mn=1.91

This is designated Polymer 18.

Polymer 18

Polymer Synthesis Example 19

A 2-L flask was charged with 7.5 g of Monomer 1, 6.5 g of 5-hydroxyindan-2-yl methacrylate, 6.7 g of 3-oxo-2,7-dioxatricyclo[4.2.1.0$^{4,8}$]nonan-9-yl methacrylate, 5.6 g of PAG monomer 3, and 40 g of tetrahydrofuran as solvent. The reactor was cooled to −70° C. in a nitrogen atmosphere, whereupon vacuum evacuation and nitrogen blow were repeated three times. The reactor warmed up to room temperature whereupon 1.2 g of AIBN was added as a polymerization initiator. The reactor was heated at 60° C. and reaction run for 15 hours. The reaction solution was precipitated from 1 L of isopropyl alcohol. The white solid was collected by filtration and vacuum dried at 60° C., obtaining a white polymer.

The polymer was analyzed by $^{13}$C-NMR, $^1$H-NMR, and GPC, with the analytical data shown below.

Copolymer Composition (Molar Ratio)

Monomer 1:5-hydroxyindan-2-yl methacrylate:3-oxo-2,7-dioxatricyclo[4.2.1.0$^{4,8}$]nonan-9-yl methacrylate:PAG monomer 3=0.30:0.30:0.30:0.10

Mw=8,600

Mw/Mn=1.99

This is designated Polymer 19.

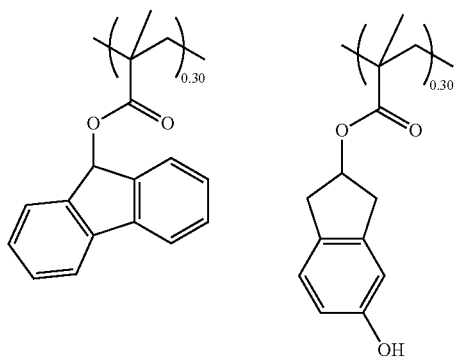

Polymer 19

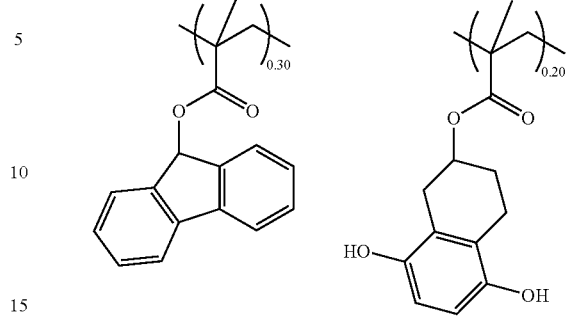

Polymer 20

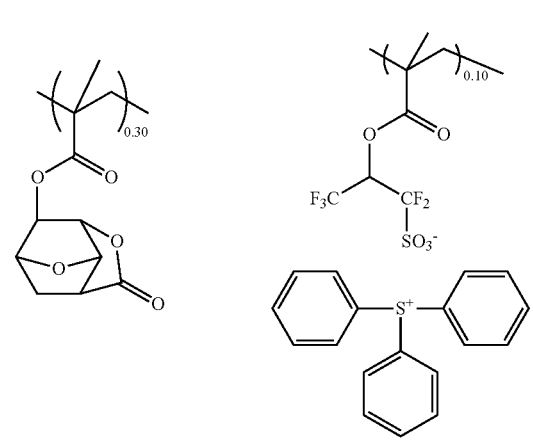

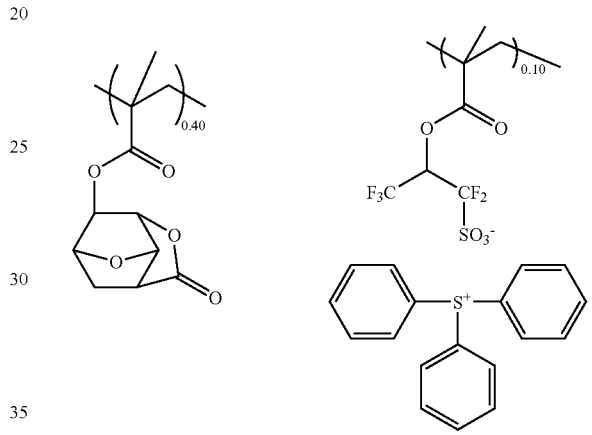

Polymer Synthesis Example 20

A 2-L flask was charged with 7.5 g of Monomer 1, 7.4 g of 5,8-dihydroxy-1,2,3,4-tetrahydronaphthalen-2-yl methacrylate, 6.7 g of 3-oxo-2,7-dioxatricyclo[4.2.1.0$^{4,8}$]-nonan-9-yl methacrylate, 5.6 g of PAG monomer 3, and 40 g of tetrahydrofuran as solvent. The reactor was cooled to −70° C. in a nitrogen atmosphere whereupon vacuum evacuation and nitrogen blow were repeated three times. The reactor warmed up to room temperature whereupon 1.2 g of AIBN was added as a polymerization initiator. The reactor was heated at 60° C. and reaction run for 15 hours. The reaction solution was precipitated from 1 L of isopropyl alcohol. The white solid was collected by filtration and vacuum dried at 60° C., obtaining a white polymer.

The polymer was analyzed by $^{13}$C-NMR, $^{1}$H-NMR, and GPC, with the analytical data shown below.

Copolymer Composition (Molar Ratio)

Monomer 1:5,8-dihydroxy-1,2,3,4-tetrahydronaphthalen-2-yl methacrylate:3-oxo-2,7-dioxatricyclo[4.2.1.0$^{4,8}$]-nonan-9-yl methacrylate:PAG monomer 3=0.30:0.20:0.40:0.10

Mw=8,800

Mw/Mn=2.06

This is designated Polymer 20.

Polymer Synthesis Example 21

A 2-L flask was charged with 7.5 g of Monomer 1, 7.4 g of 6-hydroxycoumarin-3-yl methacrylate, 6.7 g of 3-oxo-2,7-dioxatricyclo[4.2.1.0$^{4,8}$]nonan-9-yl methacrylate, 5.6 g of PAG monomer 3, and 40 g of tetrahydrofuran as solvent. The reactor was cooled to −70° C. in a nitrogen atmosphere, whereupon vacuum evacuation and nitrogen blow were repeated three times. The reactor warmed up to room temperature whereupon 1.2 g of AIBN was added as a polymerization initiator. The reactor was heated at 60° C. and reaction run for 15 hours. The reaction solution was precipitated from 1 L of isopropyl alcohol. The white solid was collected by filtration and vacuum dried at 60° C., obtaining a white polymer.

The polymer was analyzed by $^{13}$C-NMR, $^{1}$H-NMR, and GPC, with the analytical data shown below.

Copolymer Composition (Molar Ratio)

Monomer 1:6-hydroxycoumarin-3-yl methacrylate:3-oxo-2,7-dioxatricyclo[4.2.1.0$^{4,8}$]nonan-9-yl methacrylate:PAG monomer 3=0.30:0.20:0.40:0.10

Mw=8,800

Mw/Mn=1.89

This is designated Polymer 21.

Polymer 21

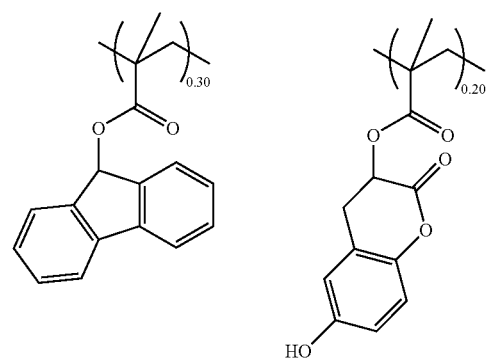

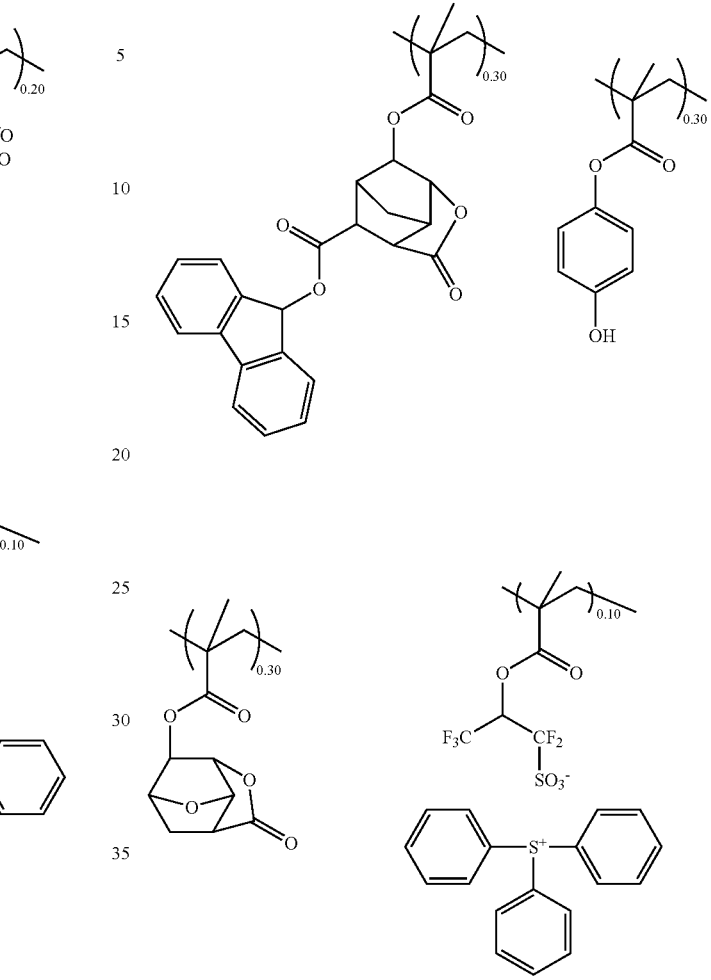

Polymer Synthesis Example 22

A 2-L flask was charged with 12.9 g of Monomer 2, 5.3 g of 4-hydroxyphenyl methacrylate, 6.7 g of 3-oxo-2,7-dioxatricyclo[4.2.1.0$^{4,8}$]nonan-9-yl methacrylate, 5.6 g of PAG monomer 3, and 40 g of tetrahydrofuran as solvent. The reactor was cooled to −70° C. in a nitrogen atmosphere, whereupon vacuum evacuation and nitrogen blow were repeated three times. The reactor warmed up to room temperature whereupon 1.2 g of AIBN was added as a polymerization initiator. The reactor was heated at 60° C. and reaction run for 15 hours. The reaction solution was precipitated from 1 L of isopropyl alcohol. The white solid was collected by filtration and vacuum dried at 60° C., obtaining a white polymer.

The polymer was analyzed by $^{13}$C-NMR, $^{1}$H-NMR, and GPC, with the analytical data shown below.

Copolymer Composition (Molar Ratio)

Monomer 2:4-hydroxyphenyl methacrylate:3-oxo-2,7-dioxatricyclo[4.2.1.0$^{4,8}$]nonan-9-yl methacrylate:PAG monomer 3=0.30:0.30:0.30:0.10

Mw=8,600

Mw/Mn=1.98

This is designated Polymer 22.

Polymer Synthesis Example 23

A 2-L flask was charged with 7.5 g of Monomer 1, 7.1 g of 4-hydroxy-1-naphthalene methacrylate, 6.7 g of 3-oxo-2,7-dioxatricyclo[4.2.1.0$^{4,8}$]nonan-9-yl methacrylate, 5.6 g of PAG monomer 3, and 40 g of tetrahydrofuran as solvent. The reactor was cooled to −70° C. in a nitrogen atmosphere, whereupon vacuum evacuation and nitrogen blow were repeated three times. The reactor warmed up to room temperature whereupon 1.2 g of AIBN was added as a polymerization initiator. The reactor was heated at 60° C. and reaction run for 15 hours. The reaction solution was precipitated from 1 L of isopropyl alcohol. The white solid was collected by filtration and vacuum dried at 60° C., obtaining a white polymer.

The polymer was analyzed by $^{13}$C-NMR, $^{1}$H-NMR, and GPC, with the analytical data shown below.

Copolymer Composition (Molar Ratio)

Monomer 1:4-hydroxy-1-naphthalene methacrylate:3-oxo-2,7-dioxatricyclo[4.2.1.0$^{4,8}$]nonan-9-yl methacrylate:PAG monomer 3=0.30:0.20:0.40:0.10

Mw=7,300

Mw/Mn=1.73

This is designated Polymer 23.

Polymer 23

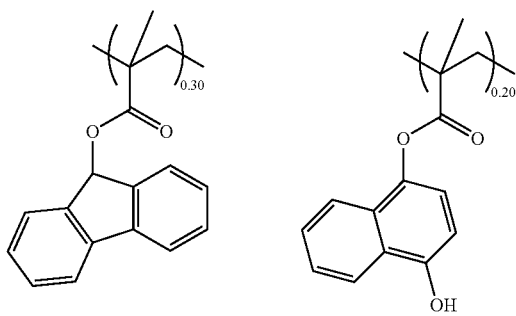

Polymer 24

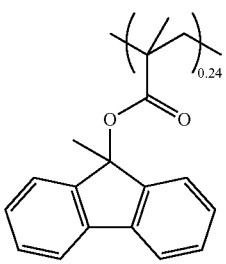

Polymer Synthesis Example 25

A 2-L flask was charged with 8.2 g of Monomer 6, 5.3 g of 4-hydroxyphenyl methacrylate, 6.7 g of 3-oxo-2,7-dioxatricyclo[4.2.1.0$^{4,8}$]nonan-9-yl methacrylate, 5.6 g of PAG monomer 3, and 40 g of tetrahydrofuran as solvent. The reactor was cooled to −70° C. in a nitrogen atmosphere, whereupon vacuum evacuation and nitrogen blow were repeated three times. The reactor warmed up to room temperature whereupon 1.2 g of AIBN was added as a polymerization initiator. The reactor was heated at 60° C. and reaction run for 15 hours. The reaction solution was precipitated from 1 L of isopropyl alcohol. The white solid was collected by filtration and vacuum dried at 60° C., obtaining a white polymer.

The polymer was analyzed by $^{13}$C-NMR, $^{1}$H-NMR, and GPC, with the analytical data shown below.

Copolymer Composition (Molar Ratio)

Monomer 6:4-hydroxyphenyl methacrylate:3-oxo-2,7-dioxatricyclo[4.2.1.0$^{4,8}$]nonan-9-yl methacrylate:PAG monomer 3=0.30:0.30:0.30:0.10

Mw=7,800

Mw/Mn=2.01

This is designated Polymer 25.

Polymer Synthesis Example 24

A 2-L flask was charged with 6.3 g of Monomer 5, 12.3 g of 4-acetoxystyrene, and 40 g of tetrahydrofuran as solvent. The reactor was cooled to −70° C. in a nitrogen atmosphere, whereupon vacuum evacuation and nitrogen blow were repeated three times. The reactor warmed up to room temperature whereupon 1.2 g of AIBN was added as a polymerization initiator. The reactor was heated at 60° C. and reaction run for 15 hours. The reaction solution was precipitated from 1 L of isopropyl alcohol. The white solid was collected by filtration and dissolved again in 100 mL of methanol and 200 mL of tetrahydrofuran, to which 10 g of triethylamine and 10 g of water were added. Deprotection reaction of acetyl group was conducted at 70° C. for 5 hours, followed by neutralization with acetic acid. The reaction solution was concentrated and dissolved in 100 mL of acetone. By similar precipitation, filtration, and drying at 60° C., a white polymer was obtained.

The polymer was analyzed by $^{13}$C-NMR, $^{1}$H-NMR, and GPC, with the analytical data shown below.

Copolymer Composition (Molar Ratio)

Monomer 5:4-hydroxystyrene=0.24:0.76

Mw=8,100

Mw/Mn=2.00

This is designated Polymer 24.

Polymer 25

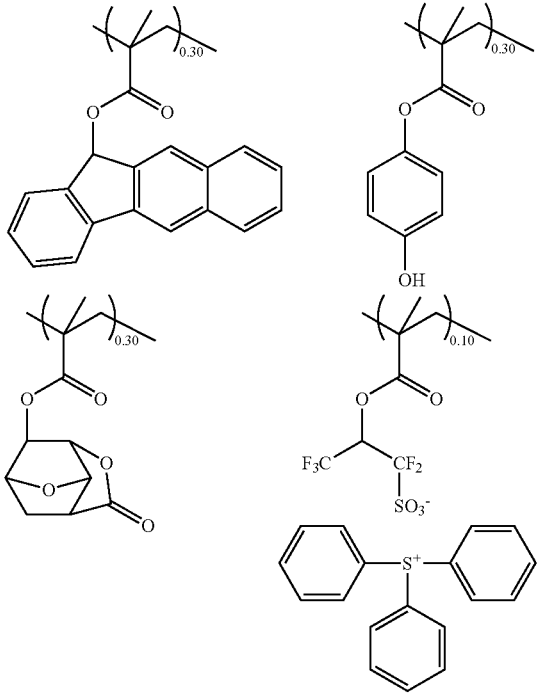

Polymer Synthesis Example 26

A 2-L flask was charged with 8.2 g of Monomer 7, 5.3 g of 4-hydroxyphenyl methacrylate, 6.7 g of 3-oxo-2,7-dioxatricyclo[4.2.1.0$^{4,8}$]nonan-9-yl methacrylate, 5.6 g of PAG monomer 3, and 40 g of tetrahydrofuran as solvent. The reactor was cooled to −70° C. in a nitrogen atmosphere, whereupon vacuum evacuation and nitrogen blow were repeated three times. The reactor warmed up to room temperature whereupon 1.2 g of AIBN was added as a polymerization initiator. The reactor was heated at 60° C. and reaction run for 15 hours. The reaction solution was precipitated from 1 L of isopropyl alcohol. The white solid was collected by filtration and vacuum dried at 60° C., obtaining a white polymer.

The polymer was analyzed by $^{13}$C-NMR, $^1$H-NMR, and GPC, with the analytical data shown below.
Copolymer Composition (Molar Ratio)
Monomer 7:4-hydroxyphenyl methacrylate:3-oxo-2,7-dioxatricyclo[4.2.1.0$^{4,8}$]nonan-9-yl methacrylate:PAG monomer 3=0.30:0.30:0.30:0.10
Mw=7,300
Mw/Mn=1.88
This is designated Polymer 26.

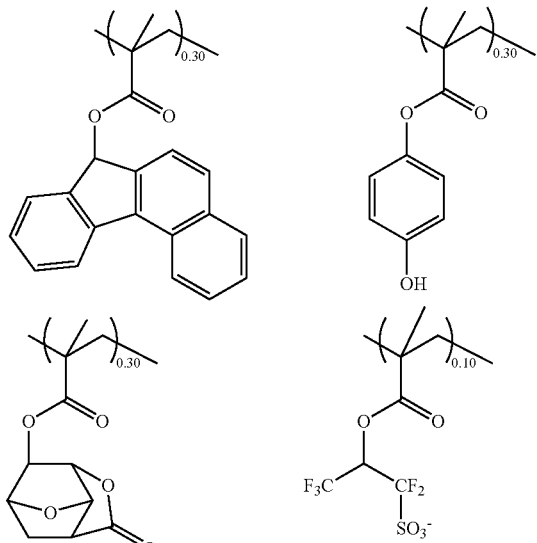

Polymer 26

Polymer Synthesis Example 27

A 2-L flask was charged with 8.2 g of Monomer 8, 12.8 g of 4-hydroxyphenyl methacrylate, and 40 g of tetrahydrofuran as solvent. The reactor was cooled to −70° C. in a nitrogen atmosphere, whereupon vacuum evacuation and nitrogen blow were repeated three times. The reactor warmed up to room temperature whereupon 1.2 g of AIBN was added as a polymerization initiator. The reactor was heated at 60° C. and reaction run for 15 hours. The reaction solution was precipitated from 1 L of isopropyl alcohol. The white solid was collected by filtration and vacuum dried at 60° C., obtaining a white polymer.

The polymer was analyzed by $^{13}$C-NMR, $^1$H-NMR, and GPC, with the analytical data shown below.
Copolymer Composition (Molar Ratio)
Monomer 8:4-hydroxyphenyl methacrylate=0.28:0.72
Mw=8,200
Mw/Mn=1.77
This is designated Polymer 27.

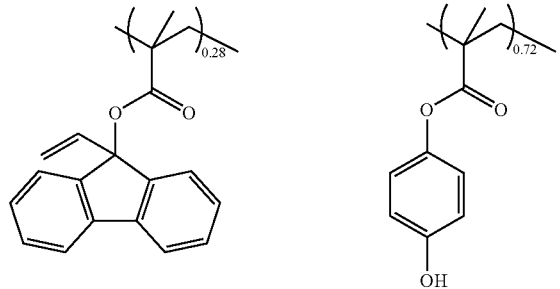

Polymer 27

Polymer Synthesis Example 28

A 2-L flask was charged with 8.1 g of Monomer 9, 12.8 g of 4-hydroxyphenyl methacrylate, and 40 g of tetrahydrofuran as solvent. The reactor was cooled to −70° C. in a nitrogen atmosphere, whereupon vacuum evacuation and nitrogen blow were repeated three times. The reactor warmed up to room temperature whereupon 1.2 g of AIBN was added as a polymerization initiator. The reactor was heated at 60° C. and reaction run for 15 hours. The reaction solution was precipitated from 1 L of isopropyl alcohol. The white solid was collected by filtration and vacuum dried at 60° C., obtaining a white polymer.

The polymer was analyzed by $^{13}$C-NMR, $^1$H-NMR, and GPC, with the analytical data shown below.
Copolymer Composition (Molar Ratio)
Monomer 9:4-hydroxyphenyl methacrylate=0.28:0.72
Mw=8,200
Mw/Mn=1.78
This is designated Polymer 28.

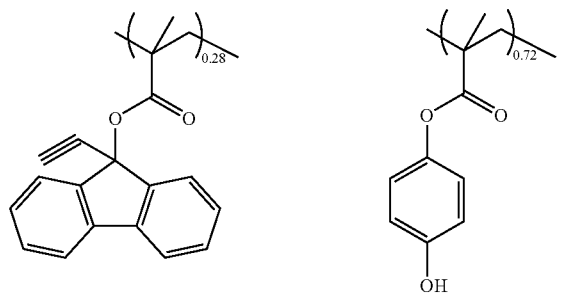

Polymer 28

Polymer Synthesis Example 29

A 2-L flask was charged with 9.1 g of Monomer 10, 12.8 g of 4-hydroxyphenyl methacrylate, and 40 g of tetrahydrofuran as solvent. The reactor was cooled to −70° C. in a nitrogen atmosphere, whereupon vacuum evacuation and nitrogen blow were repeated three times. The reactor warmed up to room temperature whereupon 1.2 g of AIBN was added as a polymerization initiator. The reactor was heated at 60° C. and reaction run for 15 hours. The reaction solution was precipitated from 1 L of isopropyl alcohol. The white solid was collected by filtration and vacuum dried at 60° C., obtaining a white polymer.

The polymer was analyzed by $^{13}$C-NMR, $^{1}$H-NMR, and GPC, with the analytical data shown below.

Copolymer Composition (Molar Ratio)
Monomer 10:4-hydroxyphenyl methacrylate=0.25:0.75
Mw=8,100
Mw/Mn=1.79
This is designated Polymer 29.

Polymer 29

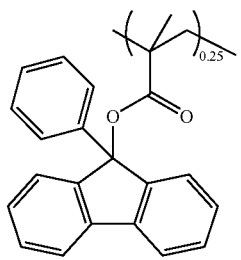

Comparative Synthesis Example 1

A polymer was synthesized by the same procedure as above.
Copolymer Composition (Molar Ratio)
hydroxystyrene:1-ethylcyclopentyl methacrylate=0.70:0.30
Mw=9,300
Mw/Mn=1.86
This is designated Comparative Polymer 1.

Comparative Polymer 1

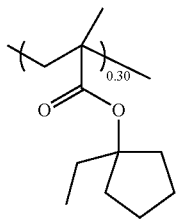

Comparative Synthesis Example 2

A polymer was synthesized by the same procedure as above.
Copolymer Composition (Molar Ratio)
hydroxystyrene:1-ethyladamantyl methacrylate=0.77:0.23
Mw=8,100
Mw/Mn=1.96
This is designated Comparative Polymer 2.

Comparative Polymer 2

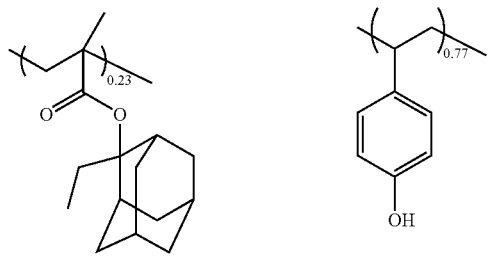

Comparative Synthesis Example 3

A polymer was synthesized by the same procedure as above.
Copolymer Composition (Molar Ratio)
hydroxystyrene:1-ethylcyclopentyl methacrylate:indene=0.73:0.17:0.10
Mw=8,100
Mw/Mn=1.79
This is designated Comparative Polymer 3.

Comparative Polymer 3

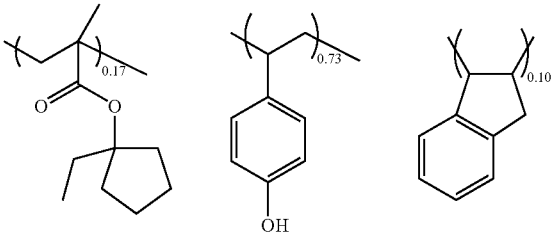

Comparative Synthesis Example 4

A polymer was synthesized by the same procedure as above.
Copolymer Composition (Molar Ratio)
hydroxystyrene:1-ethylcyclopentyl methacrylate:acenaphthylene=0.75:0.15:0.10
Mw=7,200
Mw/Mn=1.79
This is designated Comparative Polymer 4.

Comparative Polymer 4

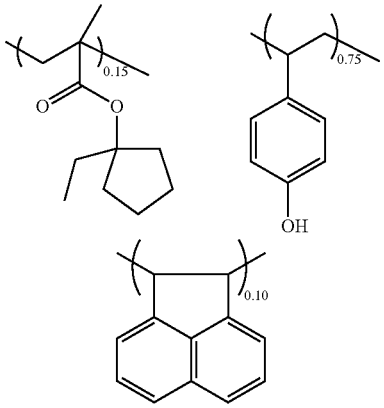

Comparative Synthesis Example 5

A polymer was synthesized by the same procedure as above.
Copolymer Composition (Molar Ratio)
hydroxystyrene:tetrahydronaphthalen-1-yl methacrylate=0.70:0.30
Mw=7,200
Mw/Mn=1.71
This is designated Comparative Polymer 5.

Comparative Polymer 5

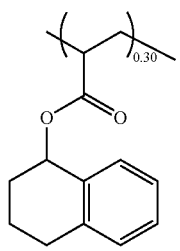 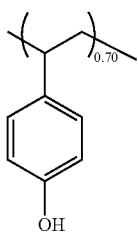

Comparative Synthesis Example 6

A polymer was synthesized by the same procedure as above.
Copolymer Composition (Molar Ratio)
hydroxystyrene:indan-1-yl methacrylate=0.70:0.30
Mw=7,300
Mw/Mn=1.79
This is designated Comparative Polymer 6.

Comparative Polymer 6

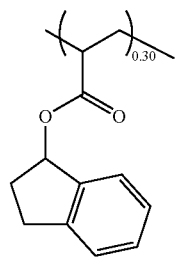 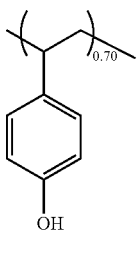

EXAMPLES AND COMPARATIVE EXAMPLES

Positive resist compositions were prepared by dissolving each of the polymers synthesized above and selected components in a solvent in accordance with the recipe shown in Tables 1 and 2, and filtering through a filter having a pore size of 0.2 μm. The solvent contained 100 ppm of a surfactant FC-4430 (3M Sumitomo Co., Ltd.).
The components in Tables 1 and 2 are as identified below.

| | |
|---|---|
| Polymers 1 to 29: | polymers synthesized in Polymer Synthesis Examples 1 to 29 |
| Comparative Polymers 1 to 6: | polymers synthesized in Comparative Synthesis Examples 1 to 6 |
| Organic solvents: | propylene glycol monomethyl ether acetate (PGMEA) cyclohexanone (CyH) propylene glycol monomethyl ether (PGME) |
| Acid generators: | PAG1 and PAG2 |
| Basic compounds: | Amine 1, Amine 2, and Amine 3 |
| Dissolution regulators: | DRI1 and DRI2 |

The structural formulae of these components are shown below.

PAG 1

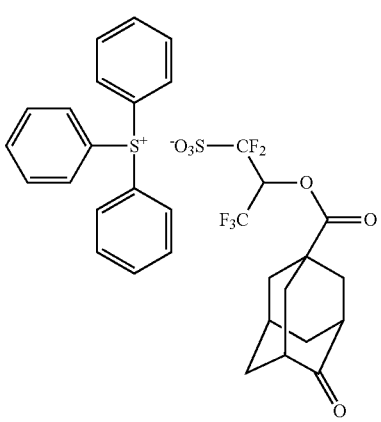

PAG 2

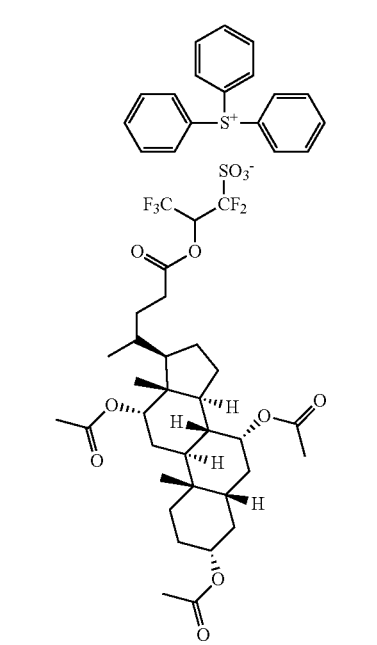

Amine 1

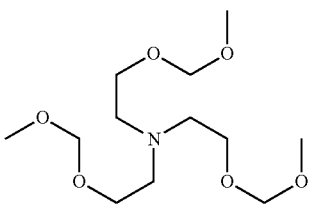

Amine 2

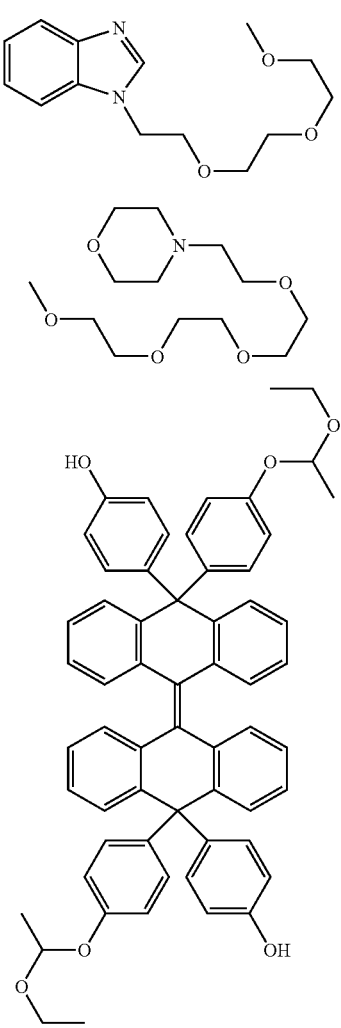

Amine 3

DRI 1

DRI 2

EB Writing Test

Using a coater/developer system Clean Track Mark 5 (Tokyo Electron Ltd.), the positive resist composition was spin coated onto a silicon substrate (diameter 6 inches, vapor primed with hexamethyldisilazane (HMDS)) and pre-baked on a hot plate at 110° C. for 60 seconds to form a resist film of 100 nm thick. Using a system HL-800D (Hitachi Ltd.) at a HV voltage of 50 keV, the resist film was exposed imagewise to EB in a vacuum chamber.

Using Clean Track Mark 5, immediately after the imagewise exposure, the wafer was post-exposure baked (PEB) on a hot plate for 60 seconds and puddle developed in a 2.38 wt % TMAH aqueous solution for 30 seconds to form a positive pattern.

Resolution is a minimum size at the exposure dose (sensitivity) that provides a 1:1 resolution of a 120-nm line-and-space pattern. The 120-nm line-and-space pattern was measured for line width roughness (LWR) under SEM.

The resist composition is shown in Tables 1 and 2 together with the sensitivity and resolution of EB lithography.

TABLE 1

| Polymer (pbw) | Acid generator (pbw) | Base (pbw) | Dissolution regulator (pbw) | Organic solvent (pbw) | PEB temperature (° C.) | Sensitivity (µC/cm$^2$) | Resolution (nm) | LWR (nm) |
|---|---|---|---|---|---|---|---|---|
| Polymer 1 (100) | PAG 2 (10) | Amine 1 (0.4) | — | PGMEA (2,000) | 90 | 28 | 95 | 6.6 |
| Polymer 2 (100) | PAG 2 (10) | Amine 1 (0.4) | — | PGMEA (2,000) | 95 | 30 | 90 | 6.9 |
| Polymer 3 (100) | PAG 2 (10) | Amine 1 (0.4) | — | PGMEA (2,000) | 95 | 35 | 90 | 7.7 |
| Polymer 4 (100) | PAG 2 (10) | Amine 1 (0.4) | — | PGMEA (2,000) | 95 | 40 | 85 | 7.5 |
| Polymer 5 (100) | PAG 1 (10) | Amine 1 (0.4) | — | PGMEA (2,000) | 90 | 34 | 90 | 6.8 |
| Polymer 6 (100) | PAG 1 (10) | Amine 1 (0.4) | — | PGMEA (2,000) | 85 | 33 | 90 | 6.6 |
| Polymer 7 (100) | PAG 1 (10) | Amine 1 (0.4) | — | PGMEA (2,000) | 90 | 39 | 85 | 6.5 |
| Polymer 8 (100) | PAG 1 (10) | Amine 1 (0.4) | — | PGMEA (2,000) | 90 | 32 | 85 | 7.3 |
| Polymer 9 (100) | PAG 1 (10) | Amine 1 (0.4) | — | PGMEA (2,000) | 95 | 33 | 85 | 7.3 |
| Polymer 10 (100) | PAG 1 (10) | Amine 1 (0.4) | — | PGMEA (2,000) | 90 | 35 | 85 | 7.0 |
| Polymer 11 (100) | PAG 1 (10) | Amine 1 (0.4) | — | PGMEA (2,000) | 95 | 42 | 85 | 6.8 |
| Polymer 12 (100) | PAG 2 (10) | Amine 1 (0.4) | — | PGMEA (2,000) | 90 | 31 | 90 | 6.9 |
| Polymer 13 (100) | PAG 1 (10) | Amine 1 (0.4) | — | PGMEA (2,000) | 95 | 28 | 90 | 7.8 |
| Polymer 14 (100) | — | Amine 1 (0.4) | — | PGMEA (500) CyH (1,500) | 90 | 42 | 80 | 5.6 |
| Polymer 15 (100) | — | Amine 1 (0.4) | — | PGMEA (500) CyH (1,500) | 95 | 46 | 82 | 5.8 |
| Polymer 16 (100) | — | Amine 1 (0.4) | — | PGMEA (500) CyH (1,500) | 95 | 41 | 75 | 4.8 |
| Polymer 17 (100) | — | Amine 1 (0.4) | — | PGMEA (500) CyH (1,500) | 95 | 38 | 80 | 5.6 |
| Polymer 18 (100) | — | Amine 1 (0.4) | — | PGMEA (500) CyH (1,500) | 100 | 46 | 70 | 5.5 |

TABLE 1-continued

| Polymer (pbw) | Acid generator (pbw) | Base (pbw) | Dissolution regulator (pbw) | Organic solvent (pbw) | PEB temperature (° C.) | Sensitivity (μC/cm²) | Resolution (nm) | LWR (nm) |
|---|---|---|---|---|---|---|---|---|
| Polymer 19 (100) | — | Amine 1 (0.4) | — | PGMEA (500) CyH (1,500) | 100 | 38 | 70 | 5.8 |
| Polymer 20 (100) | — | Amine 1 (0.4) | — | PGMEA (500) CyH (1,500) | 100 | 43 | 70 | 4.7 |
| Polymer 21 (100) | — | Amine 1 (0.4) | — | PGMEA (500) CyH (1,500) | 100 | 43 | 70 | 4.5 |
| Polymer 22 (100) | — | Amine 1 (0.4) | — | PGMEA (500) CyH (1,500) | 100 | 50 | 70 | 4.3 |
| Polymer 23 (100) | — | Amine 1 (0.4) | — | PGMEA (500) CyH (1,500) | 80 | 50 | 70 | 5.1 |
| Polymer 16 (100) | — | Amine 1 (0.4) | — | PGMEA (500) CyH (1,500) | 95 | 45 | 75 | 4.5 |
| Polymer 16 (100) | — | Amine 1 (0.4) | — | PGMEA (500) CyH (1,500) | 95 | 45 | 75 | 4.2 |
| Polymer 16 (100) | — | Amine 1 (0.4) | DRI 1 (10) | PGMEA (500) CyH (1,500) | 90 | 33 | 80 | 4.1 |
| Polymer 16 (100) | — | Amine 1 (0.4) | DRI 2 (10) | PGMEA (500) CyH (1,500) | 90 | 31 | 80 | 4.2 |

TABLE 2

| Polymer (pbw) | Acid generator (pbw) | Base (pbw) | Dissolution regulator (pbw) | Organic solvent (pbw) | PEB temperature (° C.) | Sensitivity (μC/cm²) | Resolution (nm) | LWR (nm) |
|---|---|---|---|---|---|---|---|---|
| Polymer 24 (100) | PAG 2 (10) | Amine 1 (0.4) | — | PGMEA (2,000) | 80 | 20 | 95 | 6.1 |
| Polymer 25 (100) | — | Amine 1 (0.4) | — | PGMEA (500) CyH (1,500) | 95 | 35 | 70 | 4.8 |
| Polymer 26 (100) | — | Amine 1 (0.4) | — | PGMEA (500) CyH (1,500) | 95 | 38 | 70 | 4.3 |
| Polymer 27 (100) | PAG 2 (10) | Amine 1 (0.4) | — | PGMEA (2,000) | 80 | 21 | 95 | 6.4 |
| Polymer 28 (100) | PAG 2 (10) | Amine 1 (0.4) | — | PGMEA (2,000) | 80 | 23 | 95 | 6.6 |
| Polymer 29 (100) | — | Amine 1 (0.4) | — | PGMEA (500) CyH (1,500) | 85 | 30 | 70 | 4.2 |
| Comparative Polymer 1 (100) | PAG 2 (10) | Amine 1 (0.4) | — | PGMEA (2,000) | 90 | 22 | 110 | 7.2 |
| Comparative Polymer 2 (100) | PAG 2 (10) | Amine 1 (0.4) | — | PGMEA (2,000) | 95 | 28 | 120 | 7.3 |
| Comparative Polymer 3 (100) | PAG 2 (10) | Amine 1 (0.4) | — | PGMEA (2,000) | 90 | 28 | 100 | 7.1 |
| Comparative Polymer 4 (100) | PAG 2 (10) | Amine 1 (0.4) | — | PGMEA (2,000) | 90 | 32 | 95 | 7.8 |
| Comparative Polymer 5 (100) | PAG 2 (10) | Amine 1 (0.4) | — | PGMEA (2,000) | 90 | 38 | 95 | 7.3 |
| Comparative Polymer 6 (100) | PAG 2 (10) | Amine 1 (0.4) | — | PGMEA (2,000) | 90 | 30 | 95 | 7.9 |

Dry Etching Test

Each polymer, 2 g, was thoroughly dissolved in 10 g of cyclohexanone, and passed through a filter having a pore size of 0.2 μm, obtaining a polymer solution. The polymer solution was spin coated onto a silicon substrate and baked to form a polymer film of 300 nm thick. Using a dry etching instrument TE-8500P (Tokyo Electron Ltd.), the polymer film was etched with $CHF_3/CF_4$ gas under the following conditions.

| | |
|---|---|
| Chamber pressure | 40.0 Pa |
| RF power | 1000 W |
| Gap | 9 mm |
| $CHF_3$ gas flow rate | 30 ml/min |
| $CF_4$ gas flow rate | 30 ml/min |
| Ar gas flow rate | 100 ml/min |
| Time | 60 sec |

The difference in polymer film thickness before and after etching was determined, from which an etching rate was computed. The results are shown in Table 3. A smaller value of film thickness difference, i.e., a lower etching rate indicates better etching resistance.

TABLE 3

| | $CHF_3/CF_4$ gas etching rate (nm/min) |
|---|---|
| Polymer 1 | 96 |
| Polymer 2 | 106 |
| Polymer 3 | 103 |
| Polymer 4 | 117 |
| Polymer 5 | 91 |
| Polymer 6 | 101 |
| Polymer 7 | 99 |
| Polymer 8 | 88 |
| Polymer 9 | 90 |
| Polymer 10 | 93 |

TABLE 3-continued

| | CHF$_3$/CF$_4$ gas etching rate (nm/min) |
|---|---|
| Polymer 11 | 93 |
| Polymer 12 | 94 |
| Polymer 13 | 96 | aqueous solution. Example 3 used 5.31 wt % TPAH aqueous solution. Example 4 used 6.78 wt % TBAH aqueous solution.

Resolution is a minimum size at the exposure dose (sensitivity) that provides a 1:1 resolution of a 35-nm line-and-space pattern. The 35-nm line-and-space pattern was measured for line width roughness (LWR) under SEM.

The resist composition is shown in Table 4 together with the sensitivity and resolution of EUV lithography.

TABLE 4

| | Polymer (pbw) | Acid generator (pbw) | Base (pbw) | Organic solvent (pbw) | PEB temperature (° C.) | Sensitivity (mJ/cm$^2$) | Resolution (nm) | LWR (nm) |
|---|---|---|---|---|---|---|---|---|
| Example 1 | Polymer 16 (100) | — | Amine 3 (0.8) | PGMEA (1,000) CyH (2,000) PGME (500) | 95 | 11 | 26 | 4.3 |
| Example 2 | Polymer 16 (100) | — | Amine 3 (0.8) | PGMEA (1,000) CyH (2,000) PGME (500) | 95 | 11 | 24 | 4.1 |
| Example 3 | Polymer 16 (100) | — | Amine 3 (0.8) | PGMEA (1,000) CyH (2,000) PGME (500) | 95 | 10.5 | 24 | 3.8 |
| Example 4 | Polymer 16 (100) | — | Amine 3 (0.8) | PGMEA (1,000) CyH (2,000) PGME (500) | 95 | 10.1 | 22 | 3.6 |
| Comparative Example 1 | Comparative Polymer 1 | PAG 2 (10) | Amine 3 (0.8) | PGMEA (1,000) CyH (2,000) PGME (500) | 90 | 12 | 32 | 7.5 |

TABLE 3-continued

| | CHF$_3$/CF$_4$ gas etching rate (nm/min) |
|---|---|
| Polymer 14 | 98 |
| Polymer 15 | 94 |
| Polymer 16 | 103 |
| Polymer 17 | 98 |
| Polymer 18 | 96 |
| Polymer 19 | 98 |
| Polymer 20 | 100 |
| Polymer 21 | 101 |
| Polymer 22 | 102 |
| Polymer 23 | 92 |
| Polymer 24 | 95 |
| Polymer 25 | 96 |
| Polymer 26 | 95 |
| Polymer 27 | 95 |
| Polymer 28 | 94 |
| Polymer 29 | 93 |
| Comparative Polymer 1 | 122 |
| Comparative Polymer 2 | 112 |
| Comparative Polymer 3 | 108 |
| Comparative Polymer 4 | 102 |
| Comparative Polymer 5 | 100 |
| Comparative Polymer 6 | 103 |

EUV Exposure Test

A positive resist composition was prepared by dissolving each of the polymers synthesized above and selected components in a solvent in accordance with the recipe shown in Table 4, and filtering through a filter having a pore size of 0.2 μm. The resist composition was spin coated on a silicon substrate (diameter 4 inches, vapor primed with HMDS) and prebaked on a hot plate at 105° C. for 60 seconds to form a resist film of 50 nm thick. EUV exposure was performed by dipole illumination at NA 0.3.

Immediately after the exposure, the substrate was baked (PEB) on a hot plate for 60 seconds and puddle developed with a developer for 30 seconds to form a positive pattern. Example 1 and Comparative Example 1 used 2.38 wt % TMAH aqueous solution. Example 2 used 3.84 wt % TEAH It is evident from Tables 1 and 2 that the resist compositions using the inventive polymers meet satisfactory resolution, sensitivity and edge roughness. They have good dry etching resistance as demonstrated by a smaller difference in film thickness before and after etching in Table 3. It is evident from Table 4 that a change of the developer from the conventional TMAH to TEAH, TPAH or TBAH prevents pattern collapse, thereby improving resolution and edge roughness.

Japanese Patent Application No. 2009-055018 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A positive resist composition comprising as a base resin a polymer having carboxyl groups whose hydrogen is substituted by an acid labile group having the general formula (1):

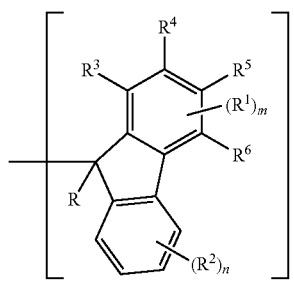

(1)

wherein $R^1$ and $R^2$ each are hydrogen, a $C_1$-$C_4$ alkyl, alkoxy, alkanoyl or alkoxycarbonyl group, hydroxyl, $C_6$-$C_{10}$ aryl group, halogen, or cyano group, R is a straight, branched or cyclic $C_1$-$C_{12}$ alkyl group which may have an oxygen or sulfur atom, $C_2$-$C_{12}$ alkenyl group, or $C_2$-$C_{12}$ alkynyl group, $R^3$ to $R^6$ are hydrogen or a pair of $R^3$ and $R^4$, $R^4$ and $R^5$, or $R^5$ and $R^6$ may bond together to form a benzene ring, and m and n each are an integer of 1 to 4.

2. The resist composition of claim 1 comprising as the base resin a polymer comprising recurring units (a) of the general formula (2), selected from (meth)acrylic acid and derivatives thereof, styrenecarboxylic acid, and vinylnaphthalenecarboxylic acid, each having substituted thereon an acid labile group of formula (1), the polymer having a weight average molecular weight of 1,000 to 500,000,

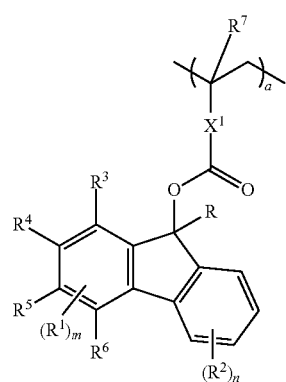

(2)

wherein R, $R^1$ to $R^6$, m and n are as defined above, $R^7$ is hydrogen or methyl, $X^1$ is a single bond, —C(=O)—O—$R^8$—, phenylene or naphthylene, and $R^8$ is a straight, branched or cyclic $C_1$-$C_{10}$ alkylene group which may have an ester, ether or lactone group.

3. The resist composition of claim 2 wherein said polymer is a copolymer comprising recurring units (a) of the general formula (2), selected from (meth)acrylic acid and derivatives thereof, styrenecarboxylic acid, and vinylnaphthalenecarboxylic acid, each having substituted thereon an acid labile group of formula (1), and recurring units (b) having an adhesive group selected from the class consisting of hydroxyl, lactone, ether, ester, carbonyl, and cyano groups, molar fractions "a" and "b" of the respective units being in the range: 0<a<1.0, 0<b<1.0, and 0.05≦a+b≦1.0, the copolymer having a weight average molecular weight of 1,000 to 500,000.

4. The resist composition of claim 3 wherein the recurring units (b) are recurring units having a phenolic hydroxyl group.

5. The resist composition of claim 4 wherein the recurring units having a phenolic hydroxyl group are selected from units (b1) to (b8) represented by the general formula (3):

(3)

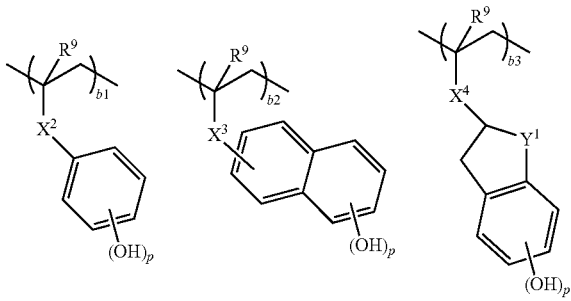

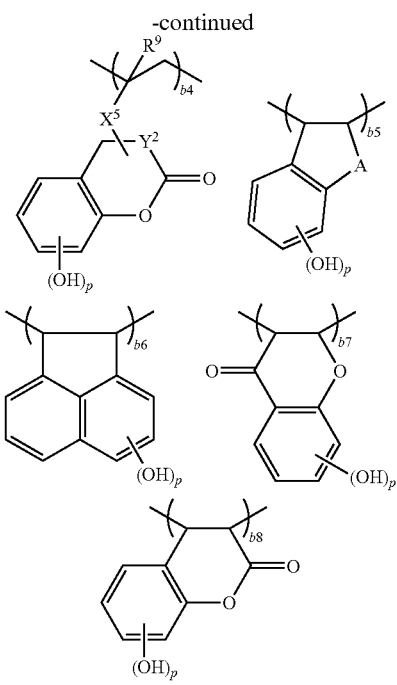

wherein $R^9$ is each independently hydrogen or methyl, $X^2$ and $X^3$ each are a single bond or —C(=O)—O—$R^{10}$—, $X^4$ and $X^5$ each are —C(=O)—O—$R^{10}$—, $R^{10}$ is a single bond or a straight, branched or cyclic $C_1$-$C_{10}$ alkylene group, $Y^1$ and $Y^2$ each are methylene or ethylene, A is methylene, oxygen or sulfur, and p is 1 or 2.

6. The resist composition of claim 3 wherein the copolymer has further copolymerized therein recurring units selected from units (c1) to (c5) of indene, acenaphthylene, chromone, coumarin, and norbornadiene, or derivatives thereof, represented by the general formula (4):

(4)

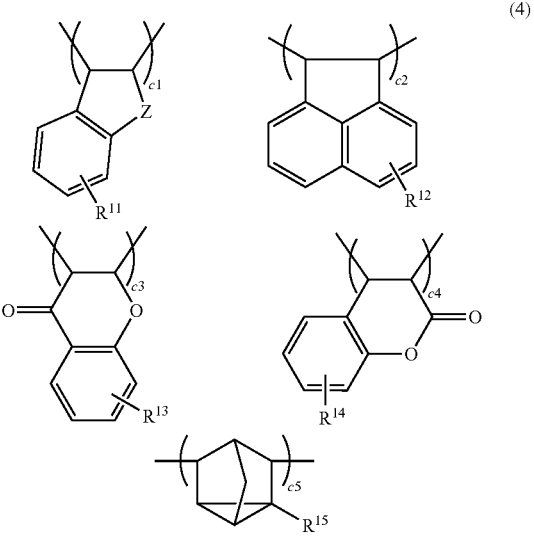

wherein $R^{11}$ to $R^{15}$ are each independently hydrogen, a $C_1$-$C_{30}$ alkyl, haloalkyl, alkoxy, alkanoyl or alkoxycarbonyl group, $C_6$-$C_{10}$ aryl group, halogen, or 1,1,1,3,3,3-hexafluoro-2-propanol group, and Z is methylene, oxygen or sulfur.

7. The resist composition of claim 3 wherein the copolymer has further copolymerized therein units selected from sulfonium salts (d1) to (d3) represented by the general formula (5):

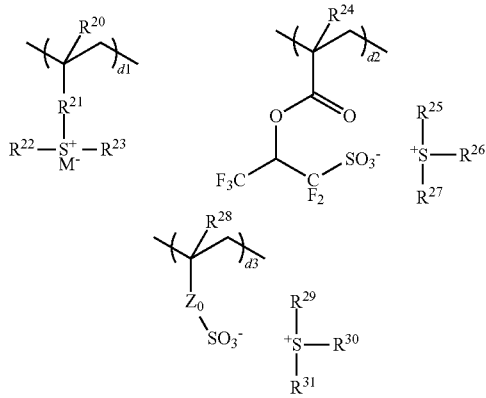

(5)

wherein $R^{20}$, $R^{24}$ and $R^{28}$ each are hydrogen or methyl, $R^{21}$ is a single bond, phenylene, —O—$R^{33}$—, or —C(=O)—Y—$R^{33}$—, Y is oxygen or NH, $R^{33}$ is a straight, branched or cyclic $C_1$-$C_6$ alkylene group, phenylene group or alkenylene group, which may contain a carbonyl, ester, ether or hydroxyl group, $R^{22}$, $R^{23}$, $R^{25}$, $R^{26}$, $R^{27}$, $R^{29}$, and $R^{31}$ are each independently a straight, branched or cyclic $C_1$-$C_{12}$ alkyl group which may contain a carbonyl, ester or ether group, or $C_6$-$C_{12}$ aryl group, $C_7$-$C_{20}$ aralkyl group, or thiophenyl group, $Z_0$ is a single bond, methylene, ethylene, phenylene, fluorinated phenylene, —O—$R^{32}$—, or —C(=O)—$Z_1$—$R^{32}$—, $Z_1$ is oxygen or NH, $R^{32}$ is a straight, branched or cyclic $C_1$-$C_6$ alkylene group, phenylene group or alkenylene group, which may contain a carbonyl, ester, ether or hydroxyl group, $M^-$ is a non-nucleophilic counter ion, and molar fractions d1 to d3 are in the range: $0 \leq d1 \leq 0.3$, $0 \leq d2 \leq 0.3$, $0 \leq d3 \leq 0.3$, and $0 < d1+d2+d3 \leq 0.3$.

8. The resist composition of claim 1, further comprising an organic solvent and an acid generator, the composition being a chemically amplified positive resist composition.

9. The resist composition of claim 8, further comprising a dissolution regulator.

10. The resist composition of claim 8, further comprising a basic compound and/or a surfactant as an additive.

11. A pattern forming process comprising the steps of applying the positive resist composition of claim 1 onto a substrate to form a coating, heat treating and exposing the coating to high-energy radiation, and developing the exposed coating with a developer.

12. The process of claim 11 wherein the developer is an aqueous solution containing 1 to 10% by weight of tetraethylammonium hydroxide, tetrapropylammonium hydroxide or tetrabutylammonium hydroxide.

13. A positive resist composition comprising as the base resin a polymer comprising;
recurring units (a) of the general formula (2), selected from (meth)acrylic acid and derivatives thereof, styrenecarboxylic acid, and vinylnaphthalenecarboxylic acid,

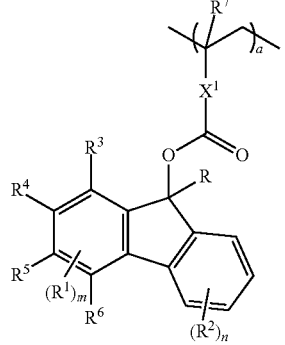

(2)

wherein $R^1$ and $R^2$ each are hydrogen, a $C_1$-$C_4$ alkyl, alkoxy, alkanoyl or alkoxycarbonyl group, hydroxyl, $C_6$-$C_{10}$ aryl group, halogen, or cyano group, R is hydrogen, a straight, branched or cyclic $C_1$-$C_{12}$ alkyl group which may have an oxygen or sulfur atom, $C_2$-$C_{12}$ alkenyl group, or $C_2$-$C_{12}$ alkynyl group, or $C_6$-$C_{10}$ aryl group, $R^3$ to $R^6$ are hydrogen or a pair of $R^3$ and $R^4$, $R^4$ and $R^5$, or $R^5$ and $R^6$ may bond together to form a benzene ring, m and n each are an integer of 1 to 4, $R^7$ is hydrogen or methyl, $X^1$ is a single bond, —C(=O)—O—$R^8$—, phenylene or naphthylene, and $R^8$ is a straight, branched of cyclic $C_1$-$C_{10}$ alkylene group which may have an ester, ether or lactone group;

recurring units (b) having a phenolic hydroxyl group selected from units (b1) and (b8) represented by the general formula (3):

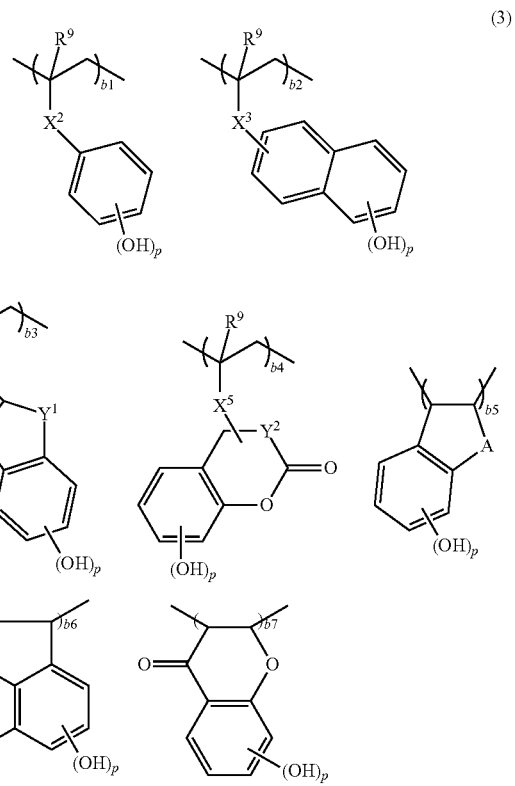

(3)

-continued

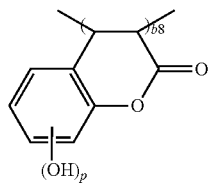

wherein $R^9$ is each independently hydrogen or methyl, $X^2$ is —C(=O)—O—$R^{10}$—, $X^3$ is a single bond or —C(=O)—O—$R^{10}$—, $X^4$ and $X^5$ each are —C(=O)—O—$R^{10}$—, $R^{10}$ is a single bond or a straight, branched or cyclic $C_1$-$C_{10}$ alkylene group, $Y^1$ and $Y^2$ each are methylene or ethylene, A is methylene, oxygen or sulfur, and p is 1 or 2; and recurring units selected from sulfonium salts (d2) and (d3) represented by the general formula (5):

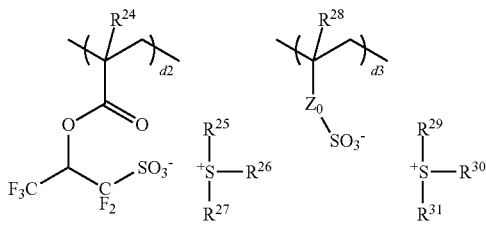

(5)

wherein $R^{24}$ and $R^{28}$ each are hydrogen or methyl, $R^{25}$, $R^{26}$, $R^{27}$, $R^{29}$, $R^{30}$, and $R^{31}$ are each independently a straight, branched or cyclic $C_1$-$C_{12}$ alkyl group which may contain a carbonyl, ester or ether group, or $C_6$-$C_{12}$ aryl group, $C_7$-$C_{20}$ aralkyl group, or thiophenyl group, $Z_0$ is a single bond, methylene, ethylene, phenylene, fluorinated phenylene, —O—$R^{32}$—, or —C(=O)—$Z_1$—$R^{32}$—, $Z_1$ is oxygen or NH, $R^{32}$ is a straight, branched or cyclic $C_1$-$C_6$ alkylene group, phenylene group or alkenylene group, which may contain a carbonyl, ester, ether or hydroxyl group, molar fractions "a" and "b" of the respective units being in the range: $0<a<1.0$, $0<b<1.0$, and $0.05 \leq a+b<1.0$, and molar fractions d2 and d3 are in the range: $0 \leq d2 \leq 0.3$, $0 \leq d3 \leq 0.3$, and $0<d2+d3 \leq 0.3$, said polymer having a weight average molecular weight of 1,000 to 500,000.

14. The resist composition of claim 13 wherein the copolymer has further copolymerized therein recurring units (c) selected from units (c1) to (c5) of indene, acenaphthylene, chromone, coumarin, and norbornadiene, or derivatives thereof, represented by the general formula (4):

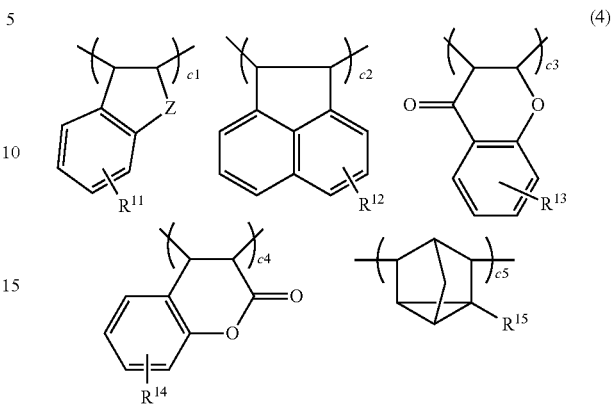

(4)

wherein $R^{11}$ to $R^{15}$ are each independently hydrogen, a $C_1$-$C_{30}$ alkyl, haloalkyl, alkoxy, alkanoyl or alkoxycarbonyl group, $C_6$-$C_{10}$ aryl group, halogen, or 1,1,1,3,3,3-hexafluoro-2-propanol group, and z is methylene, oxygen or sulfur, wherein molar fraction c is in the range of $0<c<1.0$.

15. The resist composition of claim 13, further comprising an organic solvent and an acid generator, the composition being a chemically amplified positive resist composition.

16. The resist composition of claim 15, further comprising a dissolution regulator.

17. The resist composition of claim 15, further comprising a basic compound and/or a surfactant as an additive.

18. A pattern forming process comprising the steps of applying the positive resist composition of claim 13 onto a substrate to form a coating, heat treating and exposing the coating to high-energy radiation, and developing the exposed coating with a developer.

19. The process of claim 18 wherein the developer is an aqueous solution containing 1 to 10% by weight of tetraethylammonium hydroxide, tetrapropylammonium hydroxide or tetrabutylammonium hydroxide.

20. The resist composition of claim 13 wherein the polymer further comprises, as recurring unit (b), recurring units having an adhesive group selected from among non-phenolic hydroxyl, lactone, ether, ester, carbonyl, and cyano groups.

* * * * *